(12) United States Patent  
Fujii et al.

(10) Patent No.: US 8,455,973 B2
(45) Date of Patent: Jun. 4, 2013

(54) REGION DIVIDED SUBSTRATE AND SEMICONDUCTOR DEVICE

(75) Inventors: Tetsuo Fujii, Toyohashi (JP); Masaya Tanaka, Gifu (JP); Keisuke Gotoh, Obu (JP)

(73) Assignee: DENSO CORPORATION, Kariya (JP)

( * ) Notice: Subject to any disclaimer, the term of this patent is extended or adjusted under 35 U.S.C. 154(b) by 240 days.

(21) Appl. No.: 12/902,696

(22) Filed: Oct. 12, 2010

(65) Prior Publication Data

US 2011/0133295 A1 Jun. 9, 2011

(30) Foreign Application Priority Data

Dec. 4, 2009 (JP) ................................. 2009-276841
Aug. 5, 2010 (JP) ................................. 2010-176742

(51) Int. Cl.
*H01L 21/00* (2006.01)
(52) U.S. Cl.
USPC ................... 257/502; 257/506; 257/E21.546; 257/E21.597; 257/E23.147
(58) Field of Classification Search
USPC .......... 257/499, 506, 507, 521, 522, E21.546, 257/597, 23.174, 29, 2, 18
See application file for complete search history.

(56) References Cited

U.S. PATENT DOCUMENTS

| 7,560,802 B2 | 7/2009 | Kälvesten et al. | |
| 7,652,346 B2 * | 1/2010 | Suzuki et al. | ................. 257/510 |
| 2003/0151144 A1 | 8/2003 | Muta et al. | |
| 2005/0064707 A1 | 3/2005 | Sinha | |
| 2005/0067713 A1 | 3/2005 | Mutta et al. | |
| 2005/0156260 A1 | 7/2005 | Partridge et al. | |
| 2005/0255645 A1 | 11/2005 | Lutz et al. | |
| 2006/0216856 A1 | 9/2006 | Zhao | |
| 2006/0216857 A1 | 9/2006 | Zhao | |
| 2006/0273430 A1 | 12/2006 | Hua et al. | |
| 2007/0020926 A1 | 1/2007 | Kalvesten et al. | |
| 2007/0099395 A1 | 5/2007 | Sridhar et al. | |
| 2007/0166991 A1 | 7/2007 | Sinha | |
| 2007/0170595 A1 | 7/2007 | Sinha | |
| 2007/0253889 A1 | 11/2007 | Awano et al. | |
| 2008/0290490 A1 | 11/2008 | Fujii et al. | |
| 2009/0189247 A1 * | 7/2009 | Yamamoto | ................. 257/510 |
| 2010/0032811 A1 * | 2/2010 | Ding et al. | ................. 257/621 |
| 2010/0133661 A1 | 6/2010 | Sinha | |
| 2012/0223410 A1 * | 9/2012 | Fujii et al. | ................. 257/507 |

FOREIGN PATENT DOCUMENTS

| JP | A-10-229291 | 8/1998 |
| JP | A-2002-043502 | 2/2002 |
| JP | A-2005-251898 | 9/2005 |
| JP | A-2008-256495 | 10/2008 |

OTHER PUBLICATIONS

Office Action mailed Apr. 17, 2012 in corresponding JP Application No. 2010-176742 (and English translation).

* cited by examiner

*Primary Examiner* — Michael Lebentritt
(74) *Attorney, Agent, or Firm* — Posz Law Group, PLC

(57) ABSTRACT

A region divided substrate includes a substrate, a plurality of trenches, a conductive layer, and an insulating member. The substrate has a first surface and a second surface opposed to each other. The trenches penetrate the substrate from the first surface to the second surface and divide the substrate into a plurality of partial regions. The conductive layer is disposed on a sidewall of each of the trenches from a portion adjacent to the first surface to a portion adjacent to the second surface. The conductive layer has an electric conductivity higher than an electric conductivity of the substrate. The insulating member fills each of the trenches through the conductive layer.

29 Claims, 41 Drawing Sheets

REGION DIVIDED SUBSTRATE AND SEMICONDUCTOR DEVICE

CROSS REFERENCE TO RELATED APPLICATIONS

The present application is based on and claims priority to Japanese Patent Applications No. 2009-276841 filed on Dec. 4, 2009 and No. 2010-176742 filed on Aug. 5, 2010, the contents of which are incorporated in their entirety herein by reference.

BACKGROUND OF THE INVENTION

1. Field of the Invention

The present invention relates to a region divided substrate that has a substrate divided into a plurality of partial regions by a plurality of trenches. The present invention also relates to a semiconductor device including the region divided substrate. The present invention also relates to methods of manufacturing the region divided substrate and the semiconductor device.

2. Description of the Related Art

JP-T-2006-521022 (corresponding to U.S. Pat. No. 7,560,802) discloses that a conductive substrate or a semiconductor substrate is divided into a plurality of partial regions by a plurality of trenches penetrating the substrate and that the partial regions are used as electric connecting members. JP-A-2008-229833 (corresponding to US 2008/0290490 A1) discloses a semiconductor device that includes a substrate similar to the above-described substrate as a cap substrate opposed and bonded to a base substrate. In the semiconductor substrate, a predetermined partial region functions as an extraction conductive region from the base substrate.

FIG. 48 is a cross-sectional view of a semiconductor device 90 disclosed in JP-A-2008-229833. In the semiconductor device 90, a substrate 30 made of single crystal silicon is used as a cap substrate C1 bonded to a base substrate B1, and a predetermined cap conductive regions (partial regions) Ce1 and Ce2 function as extraction conductive regions from the base substrate B1. In the semiconductor device 90, the cap substrate C1 can seal and protect a dynamic quantity sensor element formed on a surface portion of the base substrate B1. The semiconductor device 90 can have a small size and can be formed at a low cost. In addition, the semiconductor device 90 allows a face down bonding and has few restrictions in mounting.

In the semiconductor device 90, as a body for configurating the cap substrate C1, the substrate 30 made of single crystal silicon is used. A material of a substrate for configurating a cap substrate is not limited to single crystal silicon and may also be any conductive substrate material or any semiconductor substrate material. In a substrate made of single crystal silicon, trenches can be easily provided at a low cost compared with a substrate made of other materials. However, a specific resistance of single crystal silicon is large. Thus, when a substrate made of single crystal silicon is used as an extraction conductive region, a resistance of the extraction conductive region is large, and an application range as the extraction conductive region is limited.

SUMMARY OF THE INVENTION

In view of the foregoing problems, it is a first object of the present invention to provide a region divided substrate that includes a partial region functioning as an extraction conductive region and having a low resistance. A second object of the present invention is to provide a semiconductor device including the region divided substrate. A third object of the present invention is to provide a method of manufacturing the region divided substrate, and a fourth object of the present invention is to provide a method of manufacturing the semiconductor device.

A region divided substrate according to a first aspect of the present invention includes a substrate, a plurality of trenches, a conductive layer, and an insulating layer. The substrate has a first surface and a second surface opposed to each other. The trenches penetrate the substrate from the first surface to the second surface and divide the substrate into a plurality of partial regions. The conductive layer is disposed on a sidewall of each of the trenches from a portion adjacent to the first surface to a portion adjacent to the second surface. The conductive layer has an electric conductivity higher than an electric conductivity of the substrate. The insulating member fills each of the plurality of trenches through the conductive layer.

In the region divided substrate according to the first aspect of the present invention, the conductive layer having the electric conductivity higher than the electric conductivity of the substrate is disposed on the sidewall of each of the trenches. Thus, when the partial region is used as an extraction conductive region, the conductive layer can function as a main current channel, and a resistance of the extraction conductive region can be reduced.

A semiconductor device according to a second aspect of the present invention includes a cap substrate and a base substrate. The cap substrate includes the region divided substrate according to the first aspect of the present invention. The base substrate is made of semiconductor and has a plurality of base semiconductor regions. The base semiconductor regions are insulated from each other and are disposed in a surface portion of the base substrate. The cap substrate is bonded with the base substrate in a state where the cap substrate is opposed to a predetermined region of the surface portion of the base substrate. The cap substrate and the predetermined region have a sealed space therebetween. One of the partial regions provides an extraction conductive region electrically coupled with one of the base semiconductor regions.

In the semiconductor device according to the second aspect of the present invention, the cap substrate includes the region divided substrate according to the first aspect. Because the conductive layer disposed on the extraction conductive region can function as a main current channel, a resistance of the extraction conductive region can be reduced.

The region divided substrate according to the first aspect can be manufactured, for example, by a method according to a third aspect of the present invention. In the method according to the third aspect, a primary substrate that provides the substrate and has a first surface and a second surface opposed to each other is prepared. A plurality of primary trenches that provides the plurality of trenches is provided in the primary substrate from the first surface to a predetermined depth so that the plurality of primary trenches does not penetrate the primary substrate. A primary conductive layer that provides the conductive layer is formed on a sidewall of each of the plurality of primary trenches. The plurality of primary trenches is filled with a primary insulating member that provides the insulating member. The first surface of the substrate is formed by at least one of grinding, polishing, etching, and chemical mechanical polishing from a first-surface side and exposing the primary substrate. The second surface of the substrate, the conductive layer, and the insulating member are formed by at least one of grinding, polishing, etching, and chemical mechanical polishing from a second-surface side and exposing the primary insulating member.

The semiconductor device according to the second aspect can be manufactured, for example, by a method according to a fourth aspect of the present invention. In the method according to the fourth aspect, the base substrate and the cap substrate including the region divided substrate are prepared. The cap substrate is bonded to the base substrate so that the cap substrate is opposed to the predetermined region in the base substrate, the space between the cap substrate and the predetermined region is sealed, and the extraction conductive region is electrically coupled with the one of the plurality of base semiconductor regions.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

A region divided substrate A10 according to a first embodiment of the present invention will be described with reference to FIG. 1A and FIG. 1B.

Figure 1A:
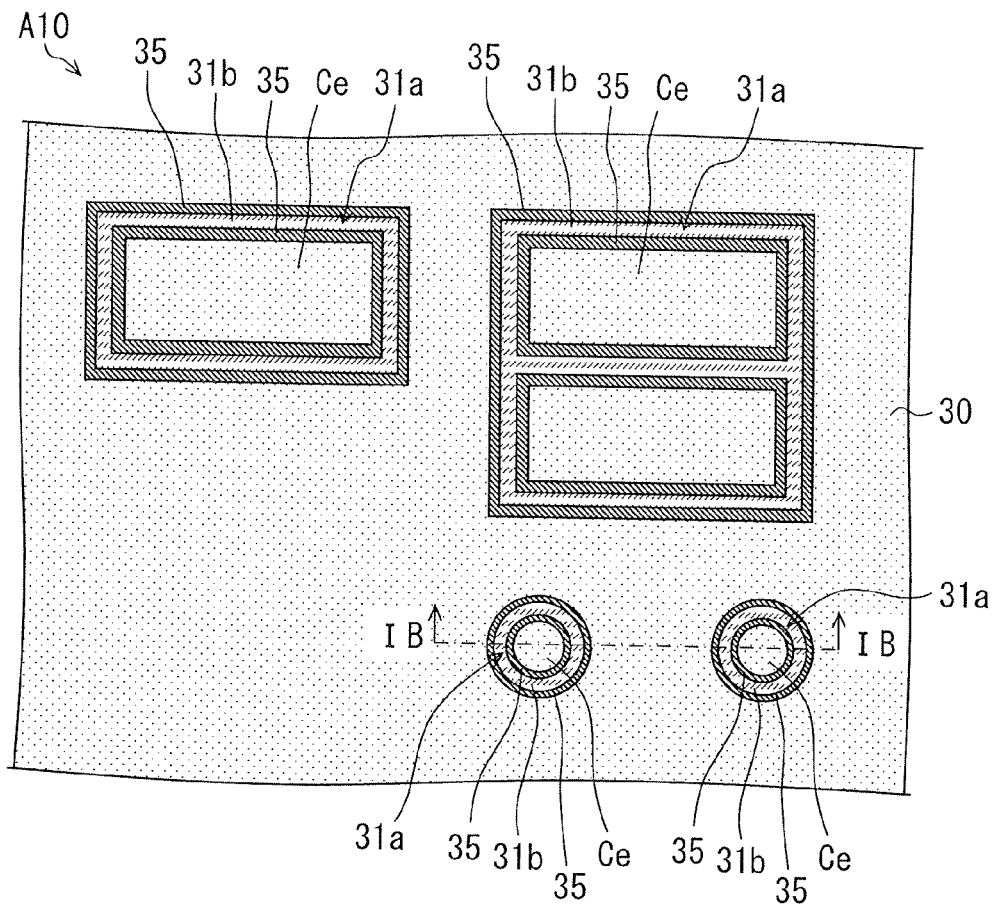
FIG. 1A is a top view of a part of a region divided substrate according to a first embodiment of the present invention and FIG. 1B is a cross-sectional view of the region divided substrate taken along line IB-IB in FIG. 1A.
Figure 1B:
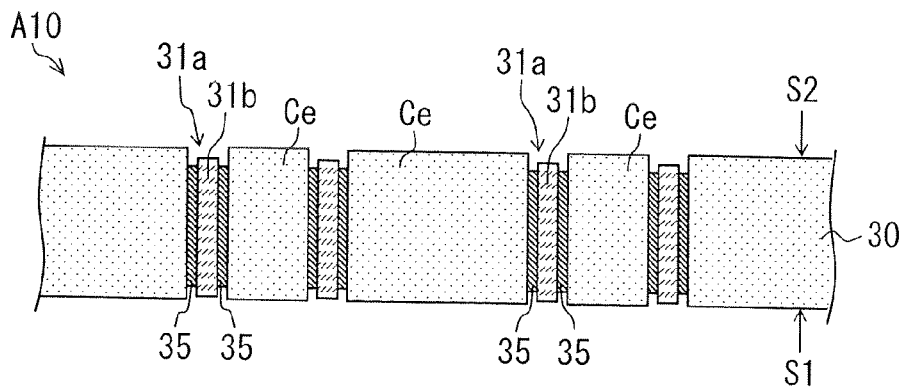

As shown in FIG. 1B, the region divided substrate A10 includes a substrate 30 made of single crystal silicon. The substrate 30 has a first surface S1 and a second surface S2 opposed to each other. The region divided substrate A10 has a plurality of trenches 31a penetrating the substrate 30 from the first surface S1 to the second surface S2. The substrate 30 is divided into a plurality of partial regions Ce. On a sidewall of each of the partial regions Ce provided by the trench 31a, a conductive layer 35 is disposed from a portion adjacent to the first surface S1 to a portion adjacent to the second surface S2. The conductive layer 35 has an electric conductivity higher than an electric conductivity of the substrate 30.

Through the conductive layer 35, the trench 31a is filled with an insulating member 31b. Each of the partial regions Ce on which the conductive layer 35 is disposed from the portion adjacent to the first surface S1 to the portion adjacent to the second surface S2 can be used as an extraction conductive region in a semiconductor device that uses the region divided substrate A10 as a cap substrate.

Figure 48:
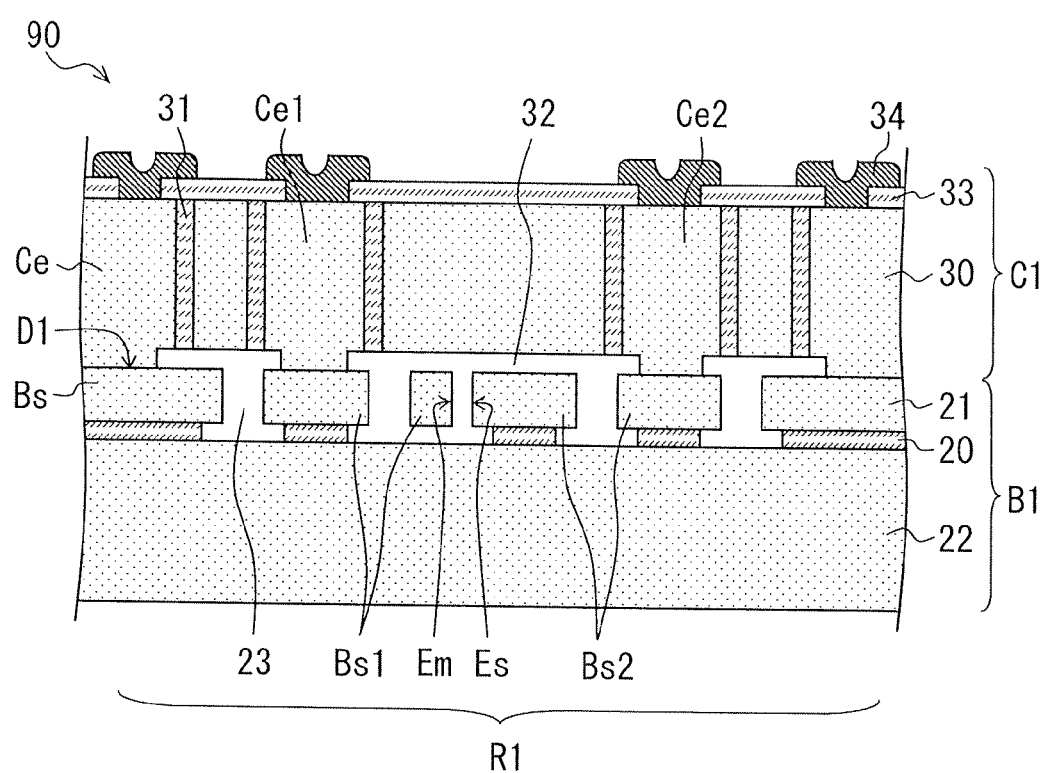
FIG. 48 is a cross-sectional view of a semiconductor device according to a prior art.

In the region divided substrate A10 shown in FIG. 1A and FIG. 1B, the substrate 30 is divided into the partial regions Ce by the trenches 31a, and the conductive layer 35 having the electric conductivity higher than the electric conductivity of the substrate 30 is disposed on the sidewall of each of the partial regions Ce from the portion adjacent to the first surface S1 to the portion adjacent to the second surface S2. Thus, when a predetermined one of the partial regions Ce is used as the extraction conductive region, the conductive layer 35 can be used as a main current channel, a resistance as the extraction conductive region can be reduced compared with the conventional divided substrate shown in FIG. 48.

In the region divided substrate A10 in FIG. 1A and FIG. 1B, the substrate 30 is made of single crystal silicon. However, because the conductive layer 35 formed on the sidewall of the partial regions Ce can function as main current channels in the region divided substrate A10, the substrate 30 may also be made of polycrystalline silicon. Even when the substrate 30 is made of an insulating material, the partial regions Ce on which the conductive layer 35 is formed can be used as the extraction conductive regions.

When the substrate 30 is made of single crystal silicon, the trench 31a can be easily provided at a low cost. Even when the substrate 30 is made of single crystal silicon having a high specific resistance, because the conductive layer 35 is formed on the sidewalls of the partial regions Ce, the resistance in a case where the partial regions Ce are used as the extraction conductive regions can be reduced. In other words, even when the substrate 30 is made of single crystal silicon having a low impurity concentration and a high specific resistance, the partial regions Ce on which the conductive layer 35 is formed can function as the extraction conductive regions having a low resistance.

When the conductive layer 35 is used as the main current channels of the extraction conductive regions as the region divided substrate A10 in FIG. 1A and FIG. 1B, it is preferred that the conductive layer 35 has a high electric conductivity. As long as the conductive layer 35 is made of material having an electric conductivity higher than the electric conductivity of the substrate, a resistance can be reduced. Thus, a material of the conductive layer 35 can be selected from materials that can be easily joined with the material of the substrate 30. For example, the conductive layer 35 may be a metal layer, a silicon layer having a high impurity concentration, a metal silicide layer, or laminated body of the above-described layers. The metal layer may be made of metal having a high conductivity, such as aluminum (Al). The silicon layer and the metal silicide layer can be easily joined with the silicon. The metal silicide layer can be formed by reacting metal such as tungsten (W), titanium (Ti), and platinum (Pt) with silicon. A thickness of the conductive layer 35 can be set optionally. For example, when the conductive layer 35 has a large thickness, the resistance can be reduced. When the conductive layer 35 has a small thickness, stress applied to a periphery can be reduced.

The insulating member 31b may be made of silicon oxide ($SiO_2$) which is commonly used for manufacturing semiconductor. When the trenches 31a are filled with the insulating member 31b from portions adjacent to the first surface S1 to portions adjacent to the second surface S2, as shown in FIG.

1B, the strength of the region divided substrate A10 can be secured. In order to reduce a parasitic capacitance of a dielectric layer provided by the insulating member 31b, only a part of the trenches 31a adjacent to the first surface S1 or a part of the trenches 31a adjacent to the second surface S2 may also be filled with the insulating member 31b.

In the region divided substrate A10, the substrate 30 is divided into the partial regions Ce by the trenches 31a penetrating the substrate 30, and the partial regions Ce can be used as the extraction conductive regions. The resistance in a case where the partial regions Ce are used as the extraction conductive regions can be reduced compared with the conventional region divided substrate (the cap substrate C1) shown in FIG. 48. In addition, any substrate material selected from conductive material, semiconductor material, and insulating material can be used, and an application limitation of the region divided substrate A10 can be reduced.

A manufacturing method of the region divided substrate A10 shown in FIG. 1 will be described with reference to FIG. 2A to FIG. 3C.

Figure 2A:
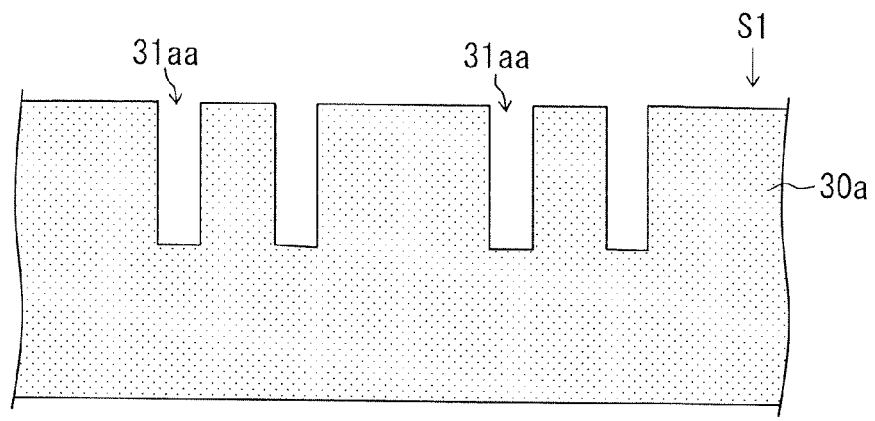
FIG. 2A to FIG. 2C are cross-sectional views showing processes in a manufacturing method of the region divided substrate according to the first embodiment.

First, during a process shown in FIG. 2A, a primary substrate 30a that provides the substrate 30 is prepared. At a portion of the primary substrate 30a adjacent to a first surface S1, a plurality of primary trenches 31aa that provides the trenches 31a is provided. The primary trenches 31aa have a predetermined depth and do not penetrate the primary substrate 30a. As the primary substrate 30a, for example, an N+ type single crystal silicon substrate having a crystal orientation (100), having a high concentration of arsenic (As) or phosphorus (P), and having a specific resistance of from 0.001 Ωcm to 1 Ωcm may be used. The primary trenches 31aa have the predetermined depth of from 10 μm to 500 μm.

Figure 2B:
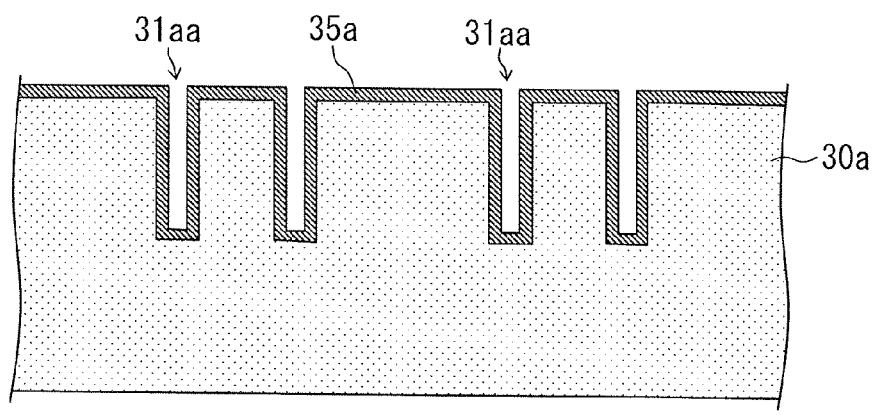

During a process shown in FIG. 2B, a primary conductive layer 35a that provides the conductive layer 35 is formed on the whole area of the first-surface side so as to cover sidewalls of the primary trenches 31aa. The primary conductive layer 35 is a metal layer made of, for example, aluminum (Al), gold (Au), or tungsten (W), and is formed by vapor deposition, sputtering, or CVD. The primary conductive layer 35 has a thickness of from 0.1 μm to 2 μm.

Figure 2C:
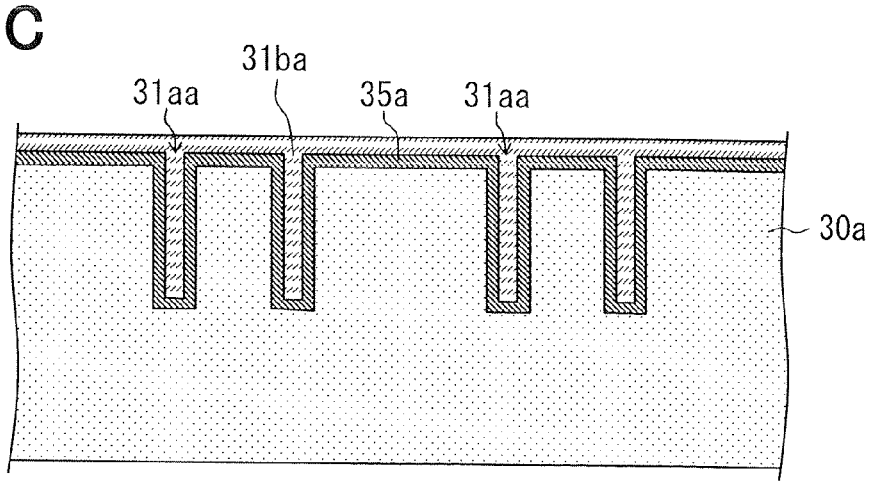

During a process shown in FIG. 2C, a primary insulating member 31ba that provides the insulating member 31b is deposited on the whole area of the first-surface side, and the primary trenches 31aa are filled with the primary insulating member 31ba through the primary conductive layer 35a. The primary insulating member 31ba is made of, for example, silicon oxide ($SiO_2$). The insulating member 31ba is formed, for example, by vapor deposition, sputtering, or CVD. In a case where a parasitic capacitance due to the insulating member 31b in the region divided substrate A10 is required to be reduced, the primary insulating member 31ba may also be made of FSG(SiOF) or carbon-containing $SiO_2$ (SiOC) having a low relative permittivity. The primary insulating member 31ba may also be a laminated layer of $SiO_2$ layer and one of an FSG layer and a carbon-containing $SiO_2$ layer.

Figure 3A:
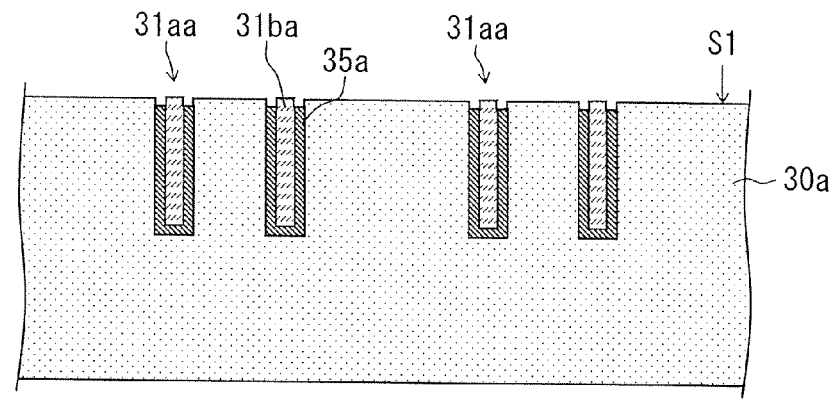
FIG. 3A to FIG. 3C are cross-sectional views showing other processes in the manufacturing method of the region divided substrate according to the first embodiment.

During a process shown in FIG. 3A, the primary insulating member 31ba and the primary conductive layer 35a are grinded or polished from the first-surface side so that the primary substrate 30a is exposed. The exposed surface of the primary substrate 30a provides the first surface S1 of the substrate 30 in the region divided substrate A10. For example, the primary insulating member 31ba may be removed, for example, by chemical mechanical polishing (CMP) using the primary conductive layer 35 formed on the first surface S1 of the primary substrate 30a as a stopper. Then, the primary conductive layer 35a on the primary substrate 30a may be removed by etching so that the primary conductive layer 35a in the primary trenches 31aa remains.

Figure 3B:
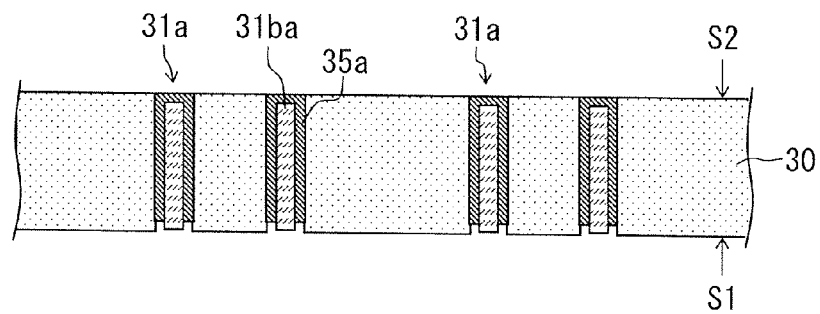

During a process shown in FIG. 3B, the primary substrate 30a shown in FIG. 3A is reversed. The primary substrate 30a is grinded from a second-surface side to provide the second surface S2 of the substrate 30 in the region divided substrate A10. For example, after roughly removing the second-surface side of the primary substrate 30a by grinding or etching, the second-surface side of the primary substrate 30a is removed by CMP using the primary conductive layer 35a as a stopper.

Figure 3C:
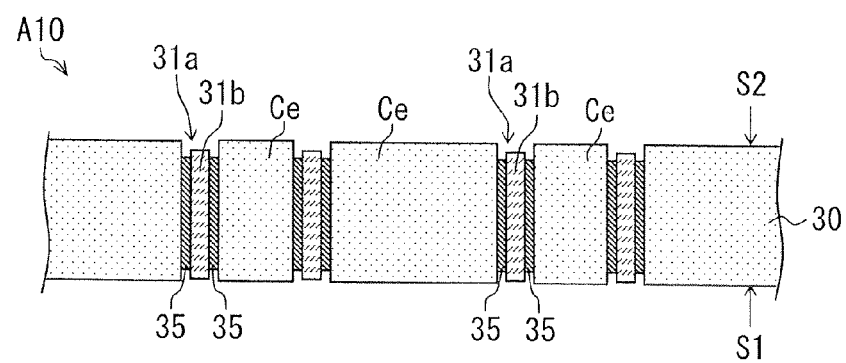

During a process shown in FIG. 3C, the primary conductive layer 35a formed on the second-surface side of the primary insulating member 31ba is removed, for example, by etching so that the primary insulating member 31ba is exposed. Accordingly, the primary insulating member 31ba provides the insulating member 31b in the region divided substrate A10. In addition, the primary conductive layer 35a remaining in the primary trenches 31aa provides the conductive layer 35 in the region divided substrate A10.

Through the above-described processes, the region divided substrate A10 shown in FIG. 1 can be manufactured.

In the manufacturing method shown in FIG. 2A to FIG. 3C, the metal layer made of, for example, aluminum (Al), gold (Au), or tungsten (W) is formed as the conductive layer 35. The conductive layer 35 may also be made of carbon nanotube (CNT) or graphene.

A manufacturing method of the region divided substrate A10 in a case where CNT is formed as the conductive layer 35 will be described with reference to FIG. 4A to FIG. 5B.

Figure 4A:
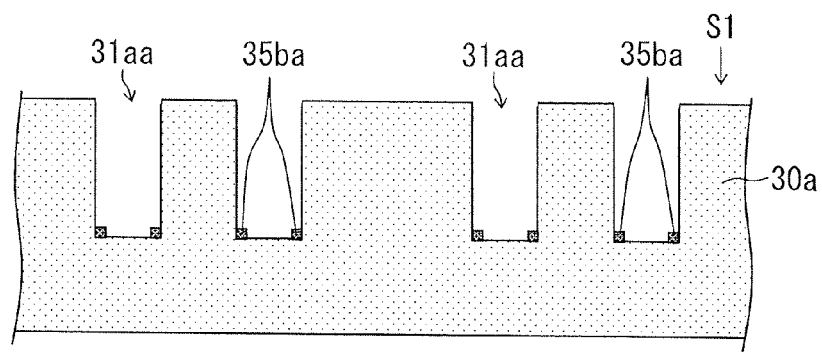
FIG. 4A to FIG. 4C are cross-sectional views showing processes in a manufacturing method of a region divided substrate in a case where carbon nanotube (CNT) is formed as a conductive layer.

During a process shown in FIG. 4A, a primary substrate 30a that provides the substrate 30 is prepared. At a portion of the primary substrate 30a adjacent to a first surface S1, a plurality of primary trenches 31aa that provides the trenches 31a is provided. Then, a catalytic metal 35ba that become seeds of a crystal growth of CNT is formed at bottom peripheries of sidewalls of the primary trenches 31aa. As the catalytic metal 35ba, for example, fine particles made of iron (Fe), cobalt (Co), or nickel (Ni) having a particle size of from few to few dozens of nm may be used. The fine particles of the catalytic metal 35ba is dispersed in a solvent such as alcohol, and the dispersion liquid is selectively injected so that the catalytic metal 35ba is linearly formed at the bottom peripheries of the sidewalls of the primary trenches 31aa.

Figure 4B:
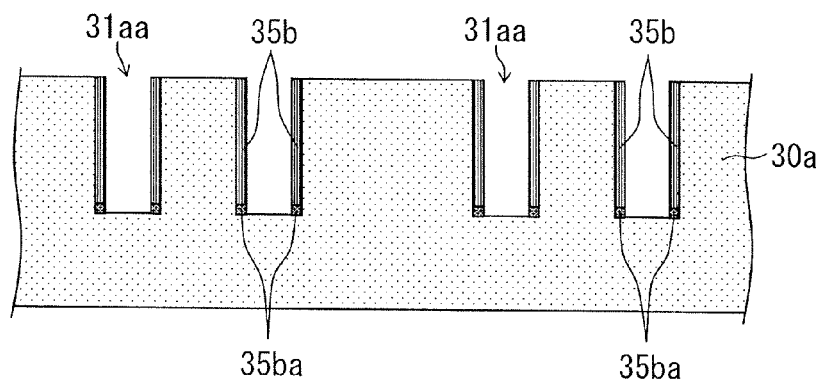

During a process shown in FIG. 4B, CNT 35b is grown on the sidewalls of the primary trenches 31aa using the catalytic metal 35ba as seeds. The CNT 35b is formed by introducing gas such as hydrogen gas or ammonia with carbon-supplying gas such as methane, ethylene, acetylene, benzene, and reacting the gasses on the surface of the primary substrate 30a, for example, by thermal CVD or plasma CVD. The CNT 35b is preferentially grows from the catalytic metal 35ba as the seeds of the crystal growth. By applying electric field to the primary substrate 30a in the vertical direction, the CNT 35b can be grown along the sidewalls of the primary trenches 31aa. The CNT 35b may be arranged in a line along the sidewalls of the primary trenches 31aa. The CNT 35b may be formed not only into a single layer but also into a multilayer by setting the size of the catalytic metal 35ba. In the above description, the manufacturing method of the CNT 35b along the sidewalls of the primary trenches 31aa is described. The conductive layer 35 made of graphene can be formed by similar method.

Figure 4C:
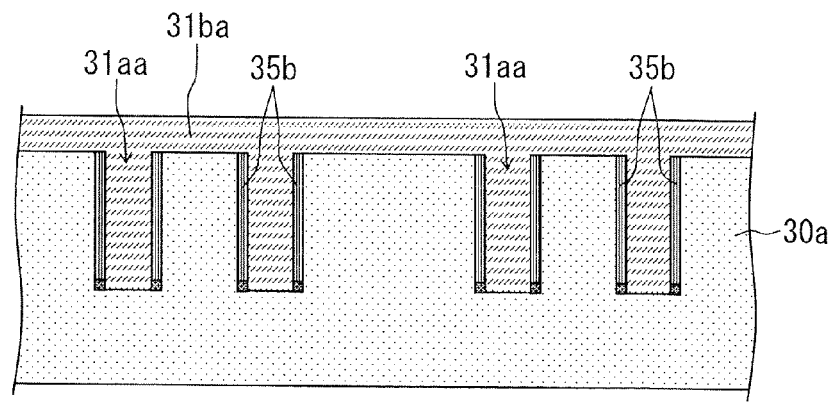

During a process shown in FIG. 4C, the insulating member 31ba is deposited on the whole area of the primary substrate 30a, and the primary trenches 31 aa are filled with the insulating member 31ba through the CNT 35b.

Figure 5A:
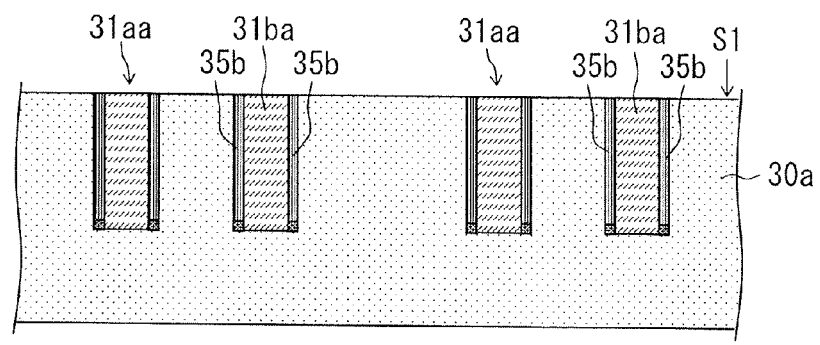
FIG. 5A and FIG. 5B are cross-sectional views showing other processes in the manufacturing method of the region divided substrate in the case where CNT is formed as the conductive layer.

During a process shown in FIG. 5A, the primary insulating member 31ba and the CNT 35b are grinded from the first-surface side so that the primary substrate 30a is exposed in a manner similar to the process shown in FIG. 3A. The exposed surface of the primary substrate 30a provides the first surface S1 of the substrate 30 in the region divided substrate A10.

Figure 5B:
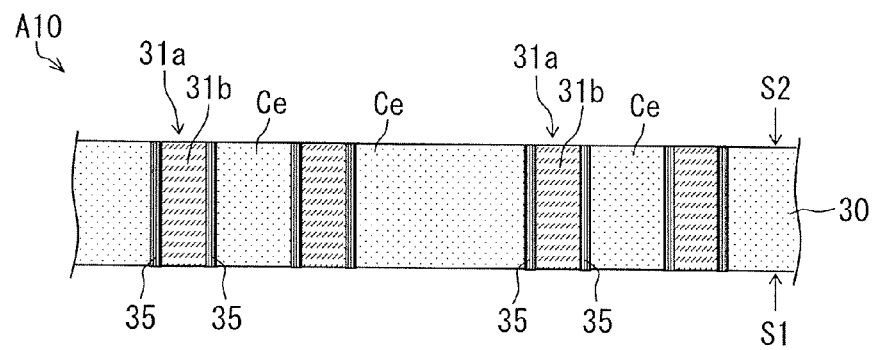

During a process shown in FIG. 5B, the primary substrate 30a shown in FIG. 5A is reversed and the primary substrate 30a is grinded from a second-surface side. Accordingly the second surface S2 of the primary substrate 30a provides the second surface S2 of the substrate 30, the first insulating member 31ba is exposed to the second-surface side, and the conductive layer 35 and the insulating member 31b are formed.

Through the above-described processes, the region divided substrate A10 including the conductive layer 35 made of CNT can be formed.

Second Embodiment

A semiconductor device 100 according to a second embodiment of the present invention will be described with reference to FIG. 6A and FIG. 6B. The semiconductor device 100 includes a base substrate B3 and a cap substrate including a region divided substrate A11.

The base substrate B3 is a silicon-on-insulator (SOI) substrate having a buried oxide layer 20, an SOI layer 21, and a support substrate 22. The buried oxide layer 20 is disposed between the SOI layer 21 and the support substrate 22. At a surface portion of the base substrate B3, a plurality of base semiconductor regions Bs insulated from each other is formed. The base semiconductor regions Bs of the semiconductor device 100 are provided by the SOI layer 21 insulated from the surrounding by trenches 23 that reach the buried oxide layer 20. The base substrate B3 has a predetermined region R1. On the base semiconductor regions Bs in the predetermined region R1, protruding portions T1 made of a conductive layer 50 are formed. The conductive layer 50 may be made of polycrystalline silicon or metal. In a case where the base substrate B3 and the region divided substrate A11 are bonded to each other by gold (Au)-to-silicon (Si) eutectic bonding, the conductive layer 50 is made of gold-silicon alloy. The protruding portions T1 may be provided by forming the conductive layer 50 on the base semiconductor regions Bs as shown in FIG. 6B. Alternatively, the protruding portions T1 may also be provided by processing surfaces of the base semiconductor regions Bs made of single crystal silicon to have protruding portions. The base substrate B3 includes a contact layer 51 penetrating the base semiconductor region Bs and the buried oxide layer 20 to the support substrate 22. The contact layer 51 is provided for electrically coupling the support substrate 22 from a surface side of the SOI layer 21. The contact layer 51 is made of, for example, polycrystalline silicon. The contact layer 51 can be used for fixing an electric potential of the support substrate 22.

The semiconductor device 100 includes a dynamic quantity sensor element using inertial force. The base semiconductor regions Bs configurate the dynamic quantity sensor element for detecting a dynamic quantity such as acceleration and angular velocity. The base semiconductor regions Bs include a movable semiconductor region Bs1 and a fixed semiconductor region Bs2. The movable semiconductor region Bs1 is formed by treating a part of the buried oxide layer 20 with a sacrifice layer etching. The movable semiconductor region Bs1 includes a movable electrode Em. The fixed semiconductor region Bs2 includes a fixed electrode Es opposed to the movable electrode Em. The two movable semiconductor regions Bs1 in the cross-sectional view in FIG. 6B are connected and integrated in a planar structure. In addition, the two fixed semiconductor regions Bs2 in the cross-sectional view in FIG. 6B are connected and integrated in the planar structure. In the semiconductor device 100, a capacitance is generated at opposing surfaces of the movable electrode Em and the fixed electrode Es. The movable electrode Em displaces in a perpendicular direction of the opposing surfaces in accordance with a dynamic quantity applied to the semiconductor device 100. The semiconductor device 100 detects a change in the capacitance for detecting the dynamic quantity applied to the semiconductor device 100. In a region of the base substrate B3 other than the predetermined region R1, other element or other circuit may be formed.

The region divided substrate A11 that function as a cap substrate in the semiconductor device 100 includes a substrate 30 made of single crystal silicon. The substrate 30 is divided into a plurality of partial regions Ce by trenches 31a penetrating the substrate 30. On a sidewall of each of the partial regions Ce provided by the trenches 31a, a conductive layer 35 is disposed. The conductive layer 35 has an electric conductivity higher than an electric conductivity of the substrate 30. The region divided substrate A11 further includes a surface protective layer 33 made of silicon oxide ($SiO_2$), wires and electrode pads 34 made of, for example, aluminum (Al).

Figure 6A:
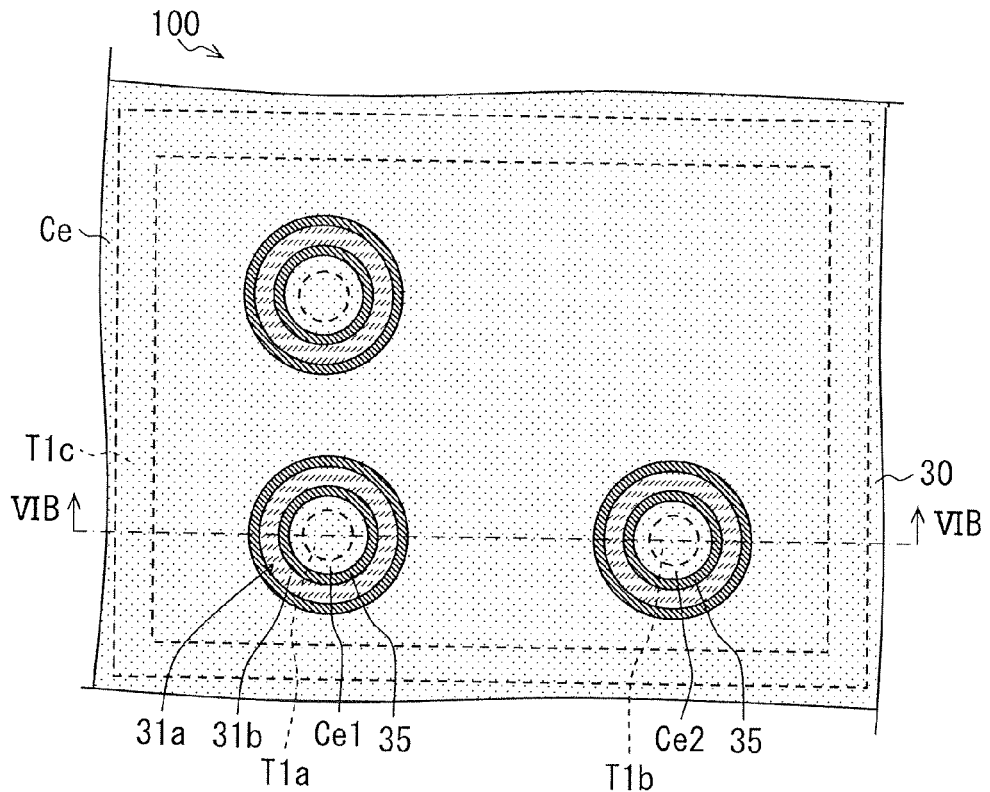
FIG. 6A is a plan view of a part of a semiconductor device according to a second embodiment of the present invention and FIG. 6B is a cross-sectional view of the semiconductor device taken along line VIB-VIB in FIG. 6A.
Figure 6B:
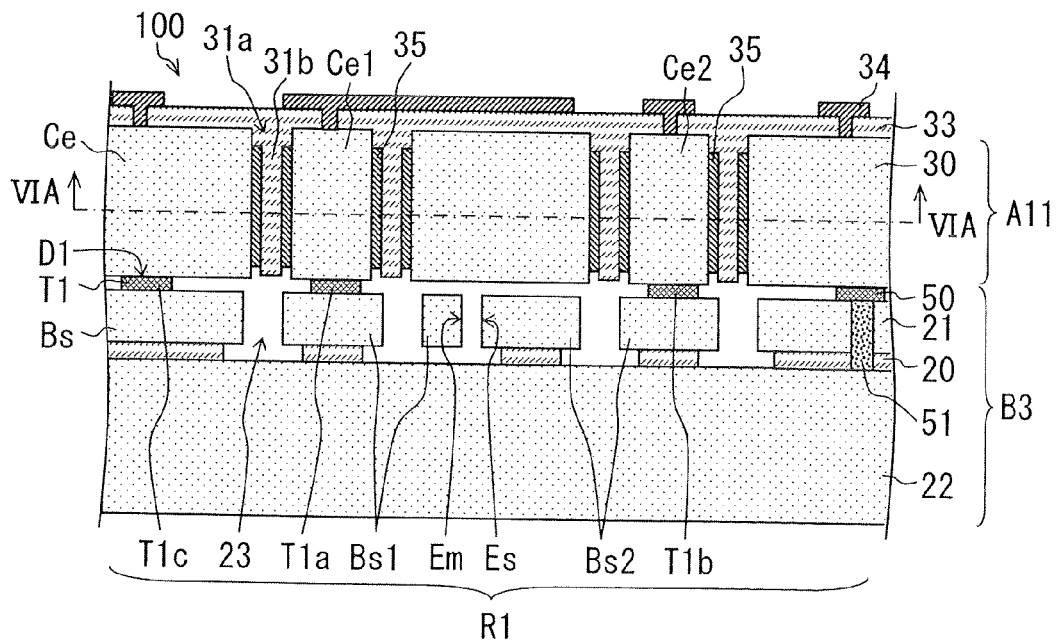

In the semiconductor device 100, as shown in FIG. 6B, a flat surface of the region divided substrate A11 is bonded to the protruding portions T1 of the base substrate B3 so as to provide a joint surface D1. The protruding portions T1 includes a ring-shaped protruding portion T1c so that the joint surface D1 of the base substrate B3 and the region divided substrate A11 has a ring shape in the predetermined region R1 of the base substrate B3. The protruding portions T1 further includes a protruding portion T1a disposed on the movable semiconductor region Bs1 and a protruding portion T1b disposed on the fixed semiconductor region Bs2. By bonding the base substrate B3 and the region divided substrate A11, a space provided between a surface of the predetermined region R1 of the base substrate B3 and the surface of the region divided substrate A11 is sealed in a high vacuum state. In addition, by bonding the base substrate B3 and the region divided substrate A11, the extraction conductive region Ce1 is electrically coupled with the movable semiconductor region Bs1 through the protruding portion T1a, and the extraction conductive region Ce2 is electrically coupled with the fixed semiconductor region Bs2 through the protruding portion T1b. On the electrode pads 34 of the semiconductor device 100, wires may be directly bonded. Alternatively, a passivation layer may be formed as necessary, and a ball bonding connection structure such as a flip chip bump may be formed. In this case, a dummy bump may be formed as necessary for redressing the stress balance.

In the semiconductor device 100, the region divided substrate A11 bonded to the base substrate B3 function as a sealing cap for protecting the dynamic quantity sensor element formed in the predetermined region R1 of the surface portion of the base substrate B3. In the region divided substrate A11, the partial regions Ce insulated from each other are formed. The partial regions Ce include the extraction conductive regions Ce1 and Ce2. The extraction conductive regions Ce1 and Ce2 are electrically coupled with the movable semiconductor region Bs1 and the fixed semiconductor region Bs2, respectively.

In the semiconductor device 100 using the region divided substrate A11 as the cap substrate, the conductive layer 35 having the electric conductivity higher than the electric conductivity of the substrate 30 is disposed on the sidewalls of the partial regions Ce divided by the trenches 31a. Thus, the resistances of the extraction conductive regions Ce1 and Ce2 can be reduced.

A manufacturing method of the semiconductor device 100 will be described below.

First, a manufacturing method of the base substrate B3 in the semiconductor device 100 will be described with reference to FIG. 7A to FIG. 7D.

Figure 7A:
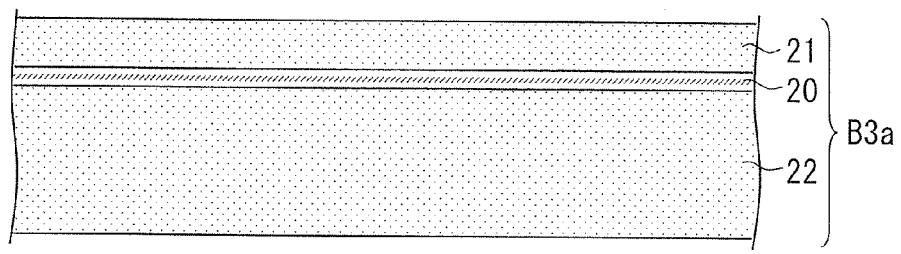
FIG. 7A to FIG. 7D are cross-sectional views showing processes in a manufacturing method of a base substrate in the semiconductor device according to the second embodiment.

During a process shown in FIG. 7A, an SOI substrate B3a is prepared. The SOI substrate B3a includes the support substrate 22, the buried oxide layer 20, and the SOI layer 21 stacked in this order. The SOI substrate B3a may be formed, for example, by a substrate bonding technique. The buried oxide layer 20 is made of silicon oxide ($SiO_2$) and the support substrate 22 is a single crystal silicon substrate having a specific resistance of from 0.001 Ωcm to 1 Ωcm. The SOI layer 21 is a single crystal silicon layer including arsenic (As) or phosphorous (P) and having a specific resistance of from 0.001 Ωcm to 1 Ωcm. The SOI layer 21 has a thickness of from 1 μm to 50 μm. In the semiconductor device 100 that includes the dynamic quantity sensor, the SOI layer 21 and the support substrate 22 are formed by bonding N+ type single crystal silicon substrates having high impurity concentration and a thickness of the SOI layer 21 is from 10 μm to 20 μm. When a part of the base semiconductor regions Bs is used as the movable semiconductor region Bs1 and the fixed semiconductor region Bs2, it is preferred that the SOI layer 21 has a high impurity concentration, that is, the specific resistance of the SOI layer 21 is small. In the above description, the impurities are the N+ type. The impurities may also a P+ type such as boron (B).

Figure 7B:
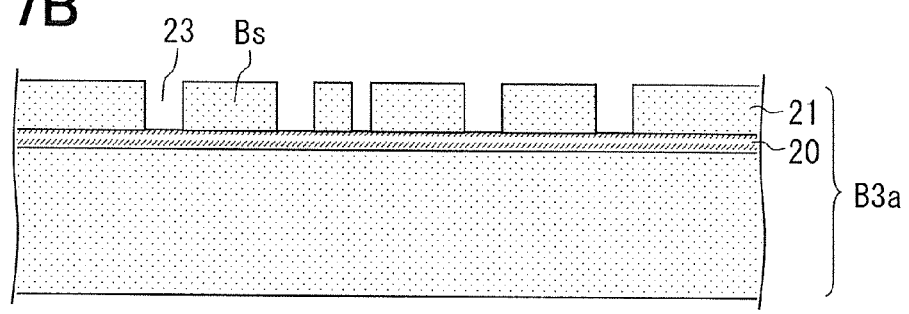

During a process shown in FIG. 7B, the trenches 23 that reach the buried oxide layer 20 are provided by photolithography and etching. The trenches 23 have sidewalls substantially perpendicular to the surface of the SOI layer 21. Accordingly, the SOI layer 21 is divided, and the base semiconductor regions Bs insulated from the surrounding are formed on a surface portion of the SOI substrate B3a.

Figure 7C:
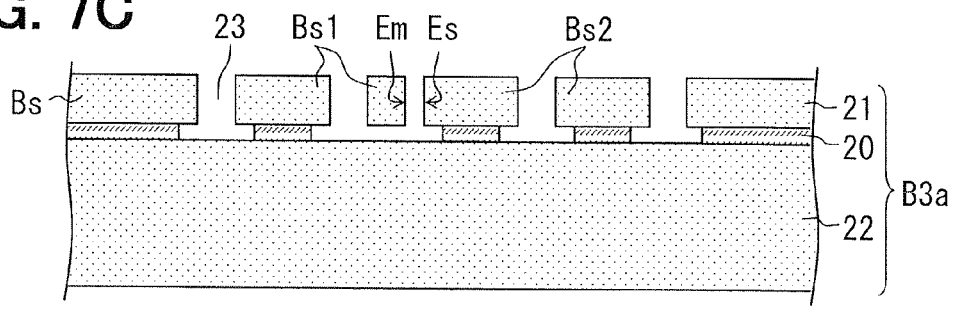

During a process shown in FIG. 7C, a part of the buried oxide layer 20 made of $SiO_2$ is removed by etching with hydrogen fluoride (HF) gas through the trenches 23 and the movable semiconductor region Bs1 having the movable electrode Em and the fixed semiconductor region Bs2 having the fixed electrode Es are formed. The buried oxide layer 20 located under a portion of the movable semiconductor region Bs1 at which the movable electrode Em is formed is completely removed as shown in FIG. 7C.

Figure 7D:
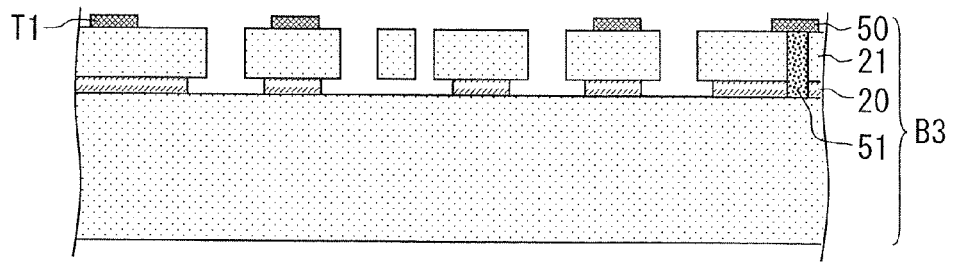

During a process shown in FIG. 7D, a trench penetrating the buried oxide layer 20 and the SOI layer 21 is provided, and the trench is filled with, for example, polycrystalline silicon to form the contact layer 51. After that, the conductive layer 50 for forming the protruding portions T1 is formed. The conductive layer 50 is made of, for example, gold (Au). The contact layer 51 and the conductive layer 50 may also be formed by photolithography and etching or mask deposition before forming a sensor structure shown in FIG. 7B and FIG. 7C.

Through the above-described processes shown in FIG. 7A to FIG. 7D, the base substrate B3 in the semiconductor device 100 can be formed. The protruding portions may also be formed on the cap substrate instead of the base substrate, and the protruding portions may also be formed on both of the base substrate and the cap substrate.

Next, a manufacturing method of the cap substrate using the region divided substrate A11 will be described with reference to FIG. 8A and FIG. 8B.

During a process shown in FIG. 8A, the region divided substrate A11 similar to the region divided substrate A10 is formed through processes similar to the processes described with reference to FIG. 2A to FIG. 3C.

Figure 8A:
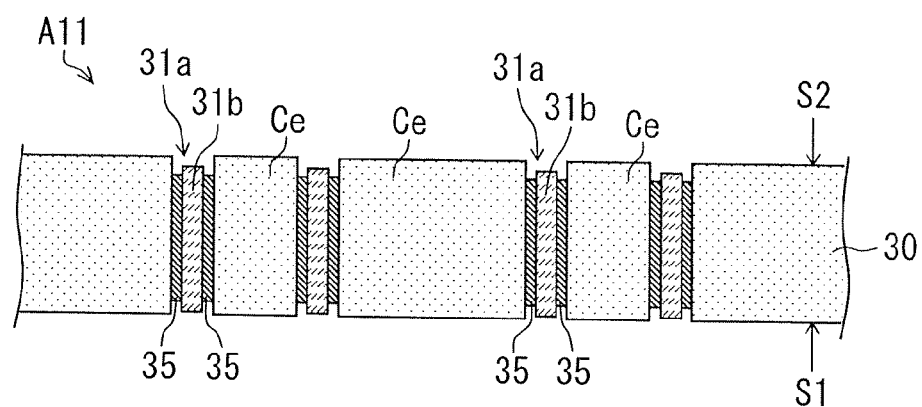
FIG. 8A and FIG. 8B are cross-sectional views showing processes in a manufacturing method of a cap substrate in the semiconductor device according to the second embodiment.
Figure 8B:
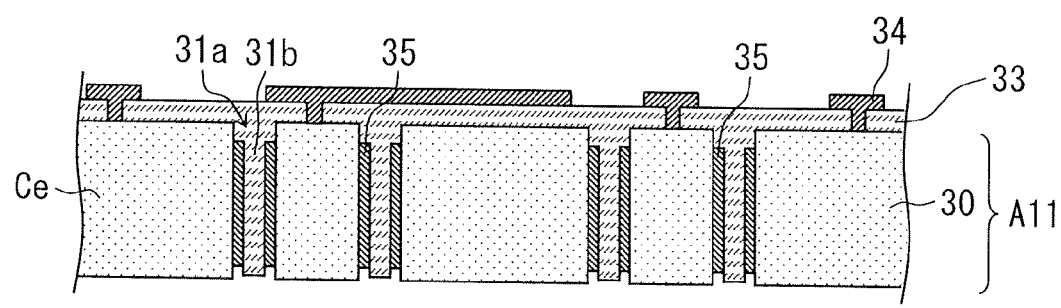

During a process shown in FIG. 8B, the surface protective layer 33 made of, for example, silicon oxide ($SiO_2$) is formed on one surface of the region divided substrate A11, for example, by CVD. Next, contact holes are provided at predetermined positions, a layer made of aluminum (Al) is formed on the whole area, and a patterning process is performed by photolithography and etching. Accordingly, the wires and the electrode pads 34 are formed.

Through the above-described processes shown in FIG. 8A and FIG. 8B, the cap substrate including the region divided substrate A11 can be formed.

A method of bonding the base substrate B3 and the cap substrate including the region divided substrate A11 will be described with reference to FIG. 9A and FIG. 9B.

Figure 9A:
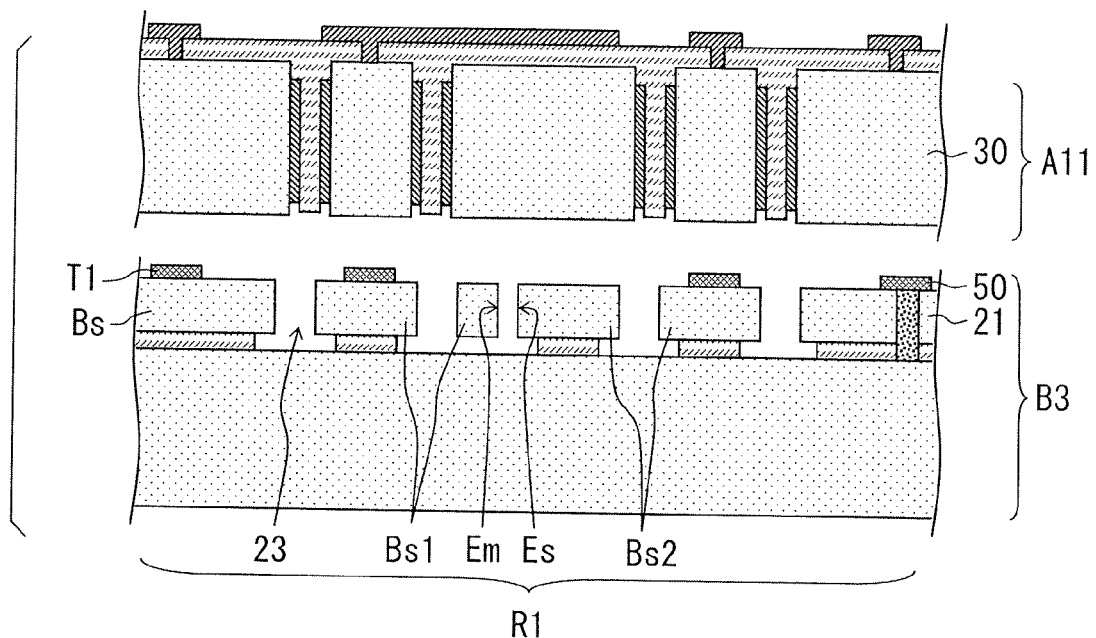
FIG. 9A and FIG. 9B are cross-sectional view showing processes in a method of bonding the cap substrate to the base substrate according to the second embodiment.

During a process shown in FIG. 9A, the cap substrate including the region divided substrate A11 is positioned so as to be opposed to the predetermined region R1 of the base substrate B3 in which the dynamic quantity sensor element is formed, and the cap substrate is stacked on the base substrate B3.

Figure 9B:
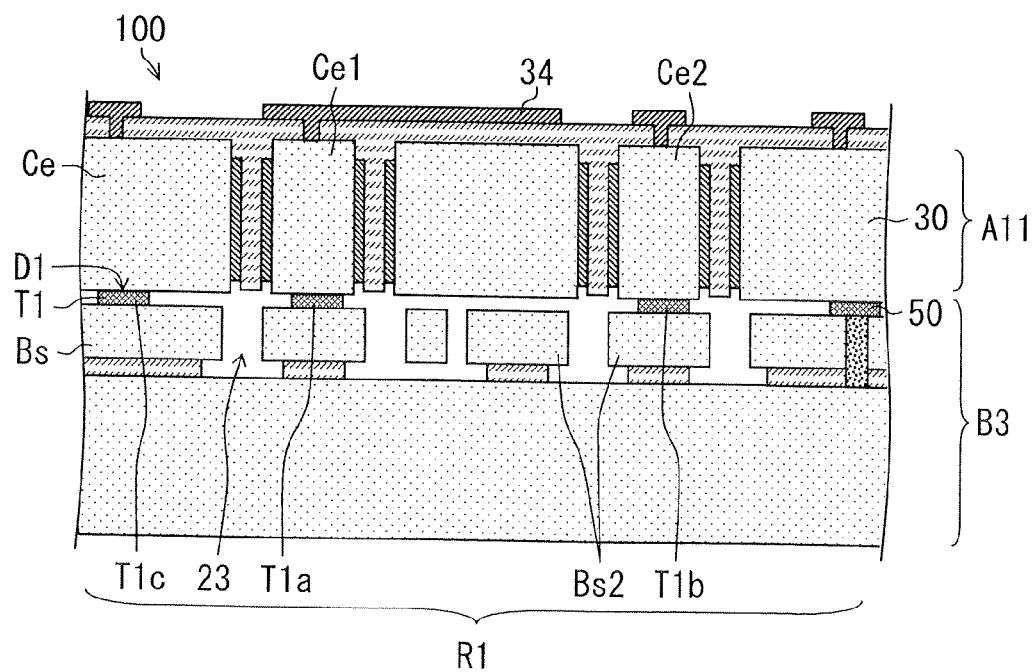

During a process shown in FIG. 9B, the cap substrate including the region divided substrate A11 is bonded to the base substrate B3. The bonding the cap substrate and the base substrate B3 can be performed, for example, by gold, (Au)-to-silicon (Si) eutectic bonding. In the Au-to-Si eutectic bonding, an Au layer is preliminarily formed as the conductive layer 50, and an Au-to-Si eutectic reaction is caused in inert gas such as nitrogen ($N_2$) gas so that the cap substrate is bonded to the base substrate B3. By the bonding using the Au-to-Si eutectic bonding, the base substrate B3 and the cap substrate including the region divided substrate A11 can be firmly bonded to each other on the joint surface D1 while securing conductivity. In addition, the space provided between predetermined region R1 of the base substrate B3 and the region divided substrate A11 and including the trenches 23 can be sealed completely. Furthermore, by firmly bonding the base substrate and the cap substrate including the region divided substrate A11, the extraction conductive region Ce1 is electrically coupled with the movable semiconductor region Bs1, and the extraction conductive region Ce2 is electrically coupled with the fixed semiconductor region Bs2. Thus, a signal output from the dynamic quantity sensor element formed in the base substrate B3 can be extracted from the electrode pads 34 formed on the surface of the cap substrate to an outside of the semiconductor device 100.

When both of the SOI layer 21 in the base substrate B3 and the substrate 30 in the region divided substrate A11 are made of silicon (Si), the bonding of the base substrate B3 and the cap substrate is not limited to the Au-to-Si eutectic bonding and may also be a Si-to-Si direct bonding. Alternatively, an aluminum layer may be formed on each bonded surface of a cap substrate and a base substrate, a germanium layer may be stacked on at least one of the aluminum layers, and the base substrate and the cap substrate may be bonded by aluminum (Al)-to-germanium (Ge) eutectic metal. Other eutectic metal may also be used. Alternatively, a cap substrate and a base substrate may also be bonded using a conductive adhesive such as a silver (Ag) paste. The conductive adhesive may also be used even when a base substrate and a cap substrate are made of material other than silicon (Si).

Through the above-described processes shown in FIG. 9A and FIG. 9B, the semiconductor device 100 shown in FIG. 6A and FIG. 6B can be formed. When an actual semiconductor device 100 is manufactured, the base substrate B3 and the cap substrate including the region divided substrate A11 are bonded to each other in a wafer state. Then, the bonded wafer is diced into a plurality of chips each including the semiconductor device 100.

Third Embodiment

Figure 10:
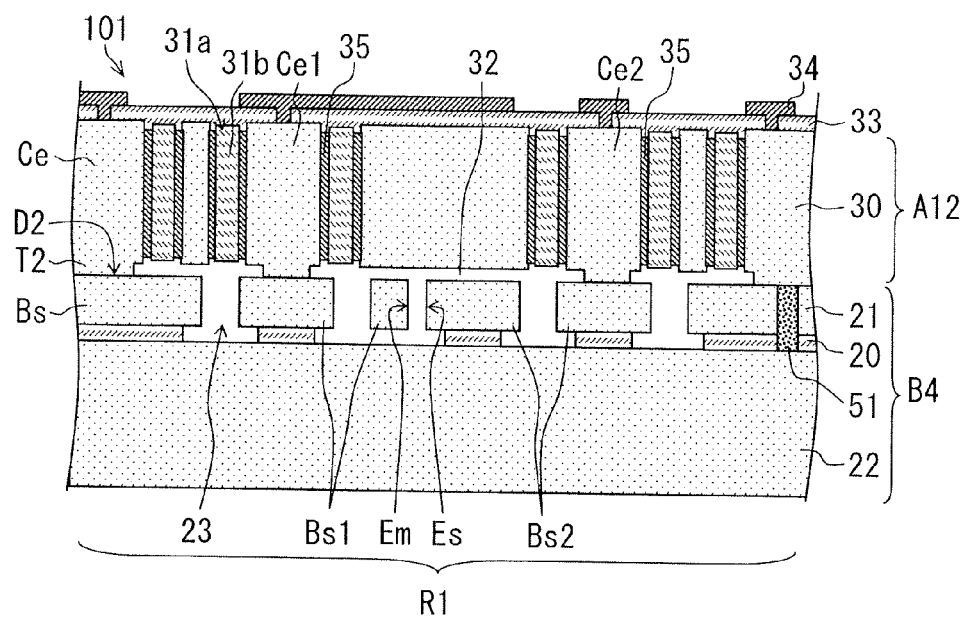
FIG. 10 is a cross-sectional view of a semiconductor device according to a third embodiment of the present invention.
Figure 11:
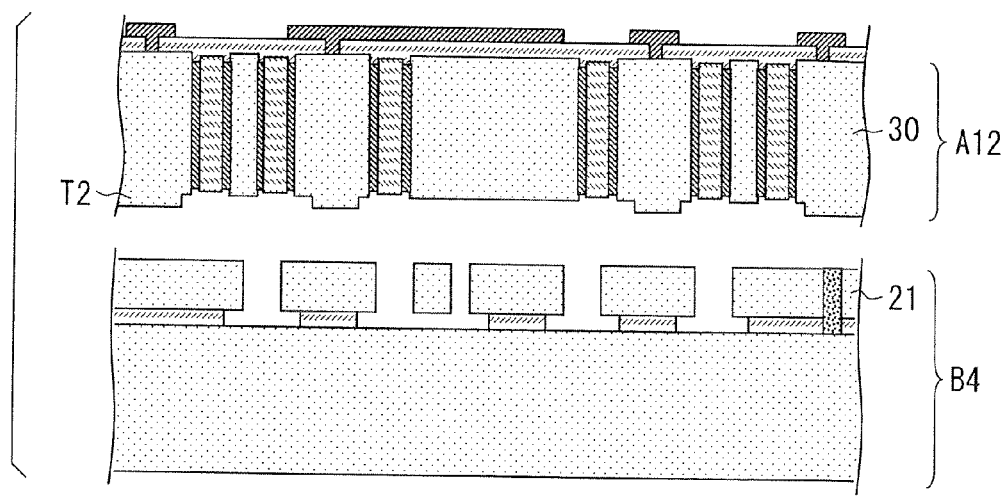
FIG. 11 is an exploded view of a cap substrate and a base substrate in the semiconductor device according to the third embodiment.

A semiconductor device 101 according to a third embodiment of the present invention will be described with reference to FIG. 10 and FIG. 11. The semiconductor device 101 includes a base substrate B4 and a cap substrate including a region divided substrate A12. When the region divided substrate A12 is bonded to the base substrate B4, the region divided substrate A12 is positioned with respect to the base substrate B4 as shown in FIG. 11.

The base substrate B4 in the semiconductor device 101 does not have the protruding portions T1 made of the conductive layer 50 on a surface thereof. Thus, the surface of the base substrate B4 opposing the region divided substrate A12, that, is a joint surface D2 of the base substrate B4 with respect to the region divided substrate A12 is a flat surface of the SOI layer 21. On the other hand, the region divided substrate A12 has a plurality of recess portions 32 at portions opposing a predetermined region R1 of the base substrate B4 in which a dynamic quantity sensor element is formed. In other words, the region divided substrate A12 has a plurality of protruding portions T2 around the recess portions 32. A joint surface D2 of the region divided substrate A12 is surfaces of the protruding portions T2 formed on a surface of the substrate 30 made of single crystal silicon. Thus, a bonding of the base substrate B4 and the region divided substrate A12 in the semiconductor device 101 is a silicon (Si)-to-silicon (Si) bonding.

Because the bonding of the base substrate B4 and the region divided substrate A12 is the Si-to-Si bonding, a Si direct bonding can be performed. The Si direct bonding may be performed at a high temperature from 800° C. to 1200° C. or a low temperature from room temperature to 450° C. When the dynamic quantity sensor treating a small amount of signals is formed in the semiconductor device 101, a change in capacitance due to a change in a distance between the movable electrode Em and the fixed electrode Es is used as a signal for detecting acceleration or angular velocity. Thus, in order to manufacture a dynamic quantity element having a high accuracy, it is required to reduce a thermal stress generated in the base substrate B4 when the region divided substrate A12 and the base substrate B4 are bonded to each other. Therefore, it is preferred to perform the Si direct bonding at a low temperature. When the base substrate B4 and the region divided substrate A12 are bonded by the Si direct bonding at a low temperature, a temperature restriction in a manufacturing process is reduced compared with a case where the base substrate B4 and the region divided substrate A12 are bonded at a high temperature. Thus, before bonding the base substrate B4 and the region divided substrate A12, various elements can be formed in the base substrate B4 and the region divided substrate A12.

The bonding of the base substrate B4 and the region divided substrate A12 by the Si direct bonding at a low temperature can be performed as follows. The base substrate B4 and the region divided substrate A12 are put into a vacuum chamber. Then, the surface of the region divided substrate A12 on which the protruding portions T2 are formed and the surface of the base substrate B4 on which the dynamic quantity sensor element is formed are lightly etched by sputter etching with inert gas such as argon (Ar) or ion beam etching.

Accordingly, a natural oxide layer formed on the surfaces, moisture and organic substances absorbing to the surfaces are removed. As a result, the surfaces made of silicon is activated by plasma, Si atoms having bonds are exposed and have a large bonding forces with other Si atoms. Next, the base substrate B4 and the region divided substrate A12 are positioned as shown in FIG. 11, the surfaces are placed in contact with each other in vacuum or a predetermined reduced pressure ($N_2$) so that Si atoms on the surfaces are bonded to each other and the base substrate B4 and the region divided substrate A12 are firmly bonded to each other.

By the Si direct bonding, the base substrate B4 and the region divided substrate A12 are firmly bonded to each other on the joint surfaces D2 while securing conductivity. In addition, a space including the trenches 23 and provided between the predetermined region R1 in the base substrate B4 and the recess portions 32 in the region divided substrate A12 can be sealed completely.

The region divided substrate A12 includes a substrate 30 divided by a plurality of trenches 31a into a plurality of partial regions Ce. On a sidewall of each of the partial regions Ce, a conductive layer 35 having an electric conductivity higher than an electric conductivity of the substrate 30 is disposed in a manner similar to the region divided substrate A11 in the second embodiment. The partial regions Ce include extraction conductive regions Ce1 and Ce2. Because of the conductive layer 35, the resistances of the extraction conductive regions Ce1a and Ce2 can be reduced. In the semiconductor device 101 shown in FIG. 10, various elements formed at a surface portion of the base substrate B4 is protected by the cap substrate including the region divided substrate A12. The resistances of the extraction conductive regions Ce1 and Ce2 in the cap substrate can be small. The semiconductor device 101 can have a small size and can be formed at a low cost. In addition, the semiconductor device 101 allows a face down bonding and has few restrictions in mounting.

The base substrate B4 can be manufactured through processes similar to the processes described with reference to FIG. 7A to FIG. 7D.

A manufacturing method of the cap substrate including the region divided substrate A12 will be described with reference to FIG. 12A to FIG. 13C.

Figure 12A:
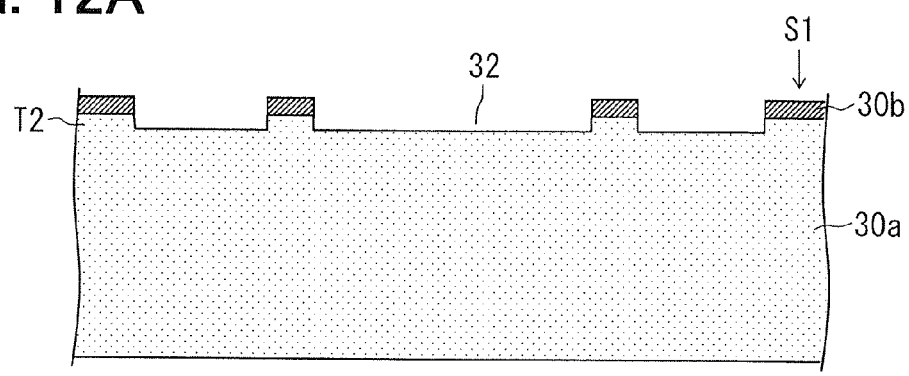
FIG. 12A to FIG. 12C are cross-sectional views showing processes in a manufacturing method of the cap substrate in the semiconductor device according to the third embodiment.

During a process shown in FIG. 12A, a primary substrate 30a made of single crystal silicon is prepared. On a first surface S1 of the primary substrate 30a, a silicon oxide ($SiO_2$) layer 30b having a thickness of from 0.1 μm to 1 μm is formed. Next, by photolithography and etching, a part of the $SiO_2$ layer 30b is removed so as to form a predetermined pattern. The primary substrate 30a is treated with dry etching using the $SiO_2$ layer 30b having the predetermined pattern as a mask so as to provide the recess portions 32 having a depth of from 0.1 μm to 10 μm. Accordingly, the protruding portions T2 to be bonded with the base substrate B4 are formed.

Figure 12B:
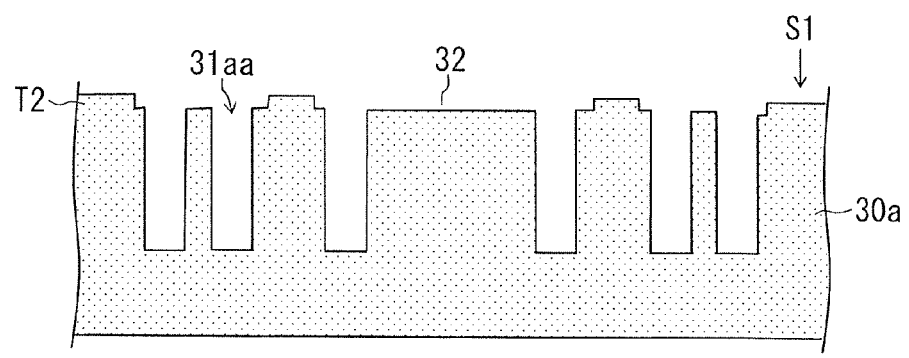

During a process shown in FIG. 12B, the $SiO_2$ layer 30b used as the mask is removed. Another mask having a predetermined pattern is formed on the first surface S1 of the primary substrate, and a plurality of primary trenches 31aa is provided by photolithography and etching. The primary trenches 31aa have sidewalls substantially perpendicular to the first surface S1 and do not penetrate the primary substrate 30a.

Figure 12C:
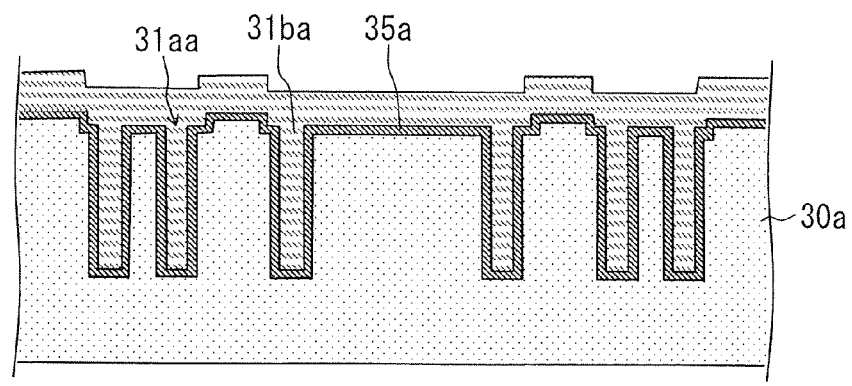

During a process shown in FIG. 12C, a primary conductive layer 35a that provides the conductive layer 35 is formed on the whole area of the first surface S1 so as to cover the sidewalls of the primary trenches 31aa. Next, a primary insulating member 31ba that provides the insulating member 31b is deposited on the whole area of the first-surface side, and the primary trenches 31aa are filled with the primary insulating member 31ba through the primary conductive layer 35a.

The processes shown in FIG. 12B and FIG. 12C are similar to the processes described with reference to FIG. 2A to FIG. 2C.

Figure 13A:
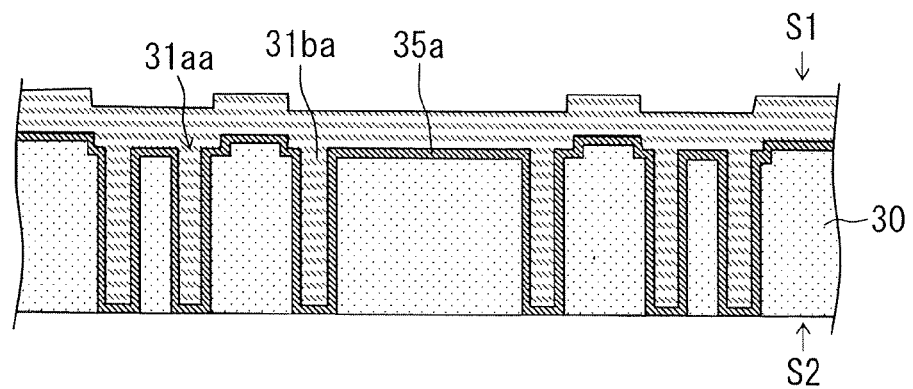
FIG. 13A to FIG. 13C are cross-sectional views showing other processes in the manufacturing method of the cap substrate in the semiconductor device according to the third embodiment.

During a process shown in FIG. 13A, the primary substrate 30a is grinded from a second-surface side. The second surface S2 of the primary substrate 30a provides a second surface S2 of the region divided substrate S2.

Figure 13B:
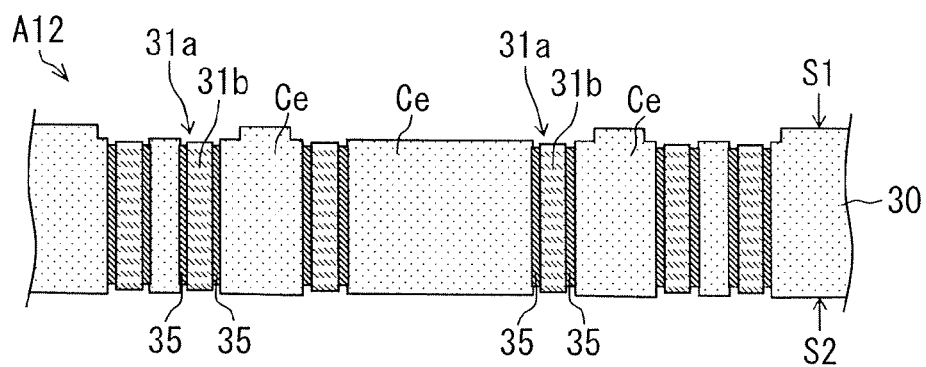

During a process shown in FIG. 13B, the primary insulating member 31ba and the primary conductive layer 35a are removed by dry etching from the first-surface side so that the primary substrate 30a is exposed. The exposed surface of the primary substrate 30a provides a first surface S1 of the region divided substrate A12. In addition, on the second-surface side of the substrate 30, the primary insulating member 31ba is exposed, and the conductive layer 35 and the insulating member 31b in the region divided substrate A12 are formed.

The processes shown in FIG. 13A and FIG. 13B are similar to the processes described with reference to FIG. 3A to FIG. 3C although the order of processes are different.

Figure 13C:
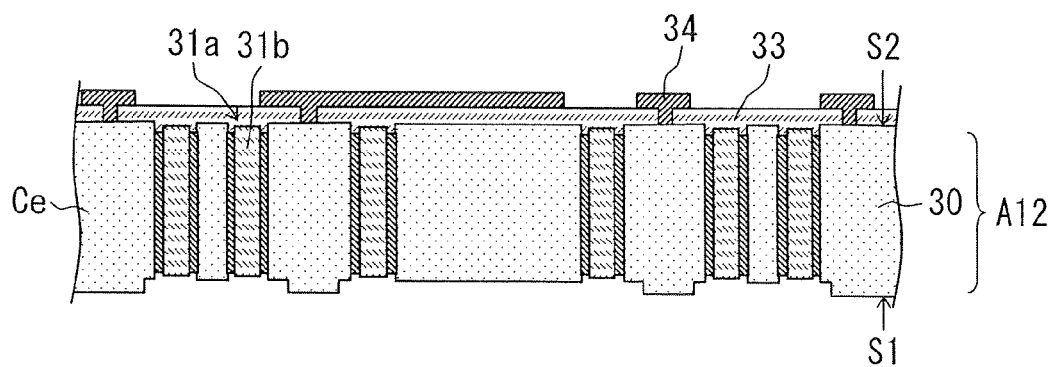

During a process shown in FIG. 13C, a surface protective layer 33 made of silicon oxide ($SiO_2$) is formed on the second surface S2 of the region divided substrate A11. Next, contact holes are provided at predetermined positions, a layer made of aluminum (Al) is formed on the whole area, and a patterning process is performed by photolithography and etching. Accordingly, the wires and the electrode pads 34 are formed. The process shown in FIG. 13C is similar to the process described with reference to FIG. 8B.

Through the above-described processes shown in FIG. 12A to FIG. 13C, the cap substrate including the region divided substrate A12 can be formed.

Fourth Embodiment

Figure 14:
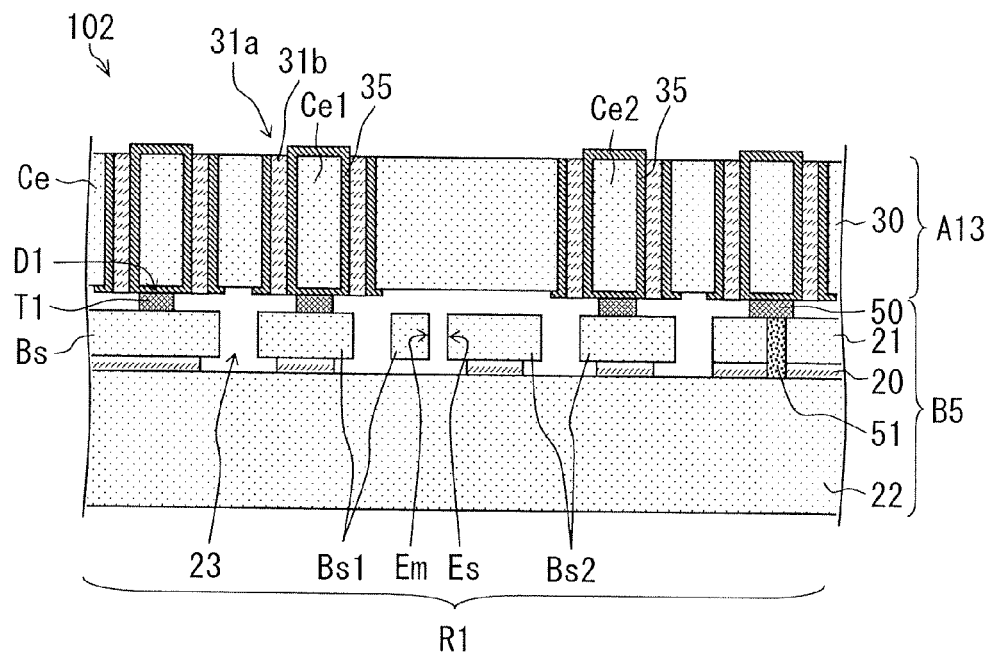
FIG. 14 is a cross-sectional view of a semiconductor device according to a fourth embodiment of the present invention.
Figure 15:
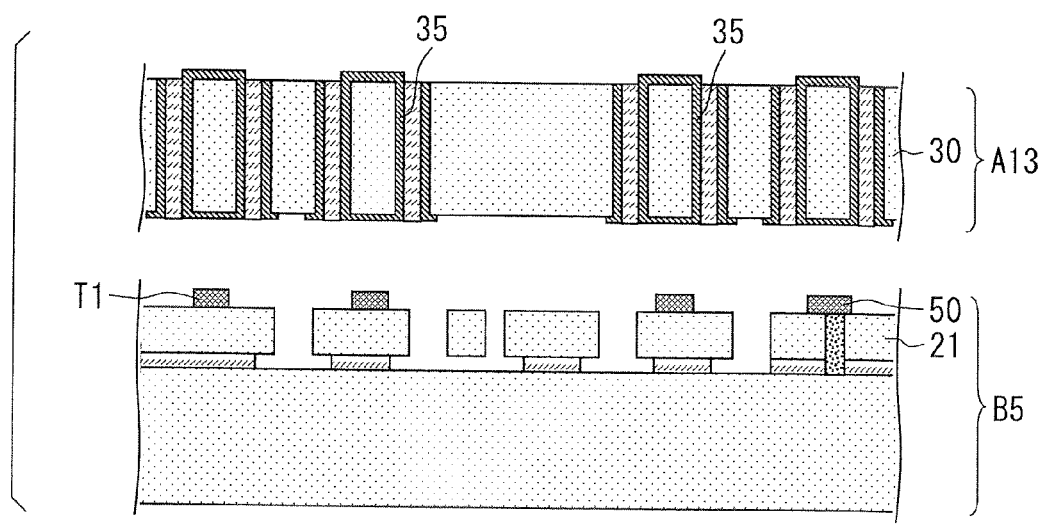
FIG. 15 is an exploded view of a cap substrate and a base substrate in the semiconductor device according to the fourth embodiment.

A semiconductor device 102 according to a fourth embodiment of the present invention will be described with reference to FIG. 14 and FIG. 15. The semiconductor device 102 includes a base substrate B5 and a cap substrate including a region divided substrate A13. When the region divided substrate A13 is bonded to the base substrate B5, the region divided substrate A13 is positioned with respect to the base substrate B5 as shown in FIG. 15.

The base substrate B5 has a structure similar to the base substrate B3 in the semiconductor device 100. The region divided substrate A13 includes a substrate 30. The substrate 30 is divided by a plurality of trenches 31a into a plurality of partial regions Ce. The partial regions Ce include extraction conductive regions Ce1 and Ce2. On sidewalls of each of the partial regions Ce, a conductive layer 35 having an electric conductivity higher than an electric conductivity of the substrate 30 is disposed. In addition, at surroundings of the trenches 31a, the conductive layer 35 is also disposed on both surfaces of the extraction conductive regions Ce1 and Ce2.

In the semiconductor device 102, an electric connection to the conductive layer 35 covering the both surfaces of the extraction conductive regions Ce1 and Ce2 becomes easy and the resistances of the Ce1 and Ce2 having the conductive layer 35 on the sidewalls thereof can be more reduced compared with the semiconductor device 100 shown in FIG. 6A and FIG. 6B. Alternatively, the conductive layer 35 may also cover only one surface of the extraction conductive regions Ce1 and Ce2. In the region divided substrate A13 shown in FIG. 14, at each of the extraction conductive regions Ce1 and Ce2, the conductive layer 35 is integrally formed on a lower surface to be coupled with the base substrate B5, the sidewall, and an upper surface to be coupled with an external device.

Thus, in the region divided substrate A13, a material of the substrate 30 is not limited to a conductive substrate made of single crystal silicon or polycrystalline silicon and may also be an insulating body such as glass.

A manufacturing method of the cap substrate including the region divided substrate A13 will be described with reference to FIG. 16A to FIG. 17D.

Figure 16A:
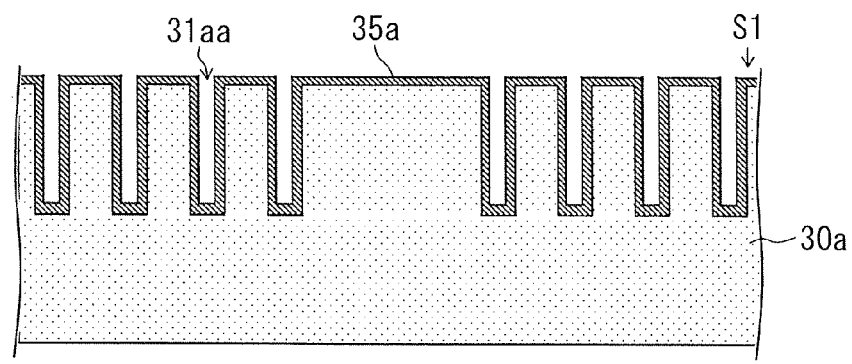
FIG. 16A to FIG. 16C are cross-sectional views showing processes in a manufacturing method of the cap substrate in the semiconductor device according to the fourth embodiment.

During a process shown in FIG. 16A, a primary substrate 30a made of single crystal silicon is prepared. A mask having a predetermined pattern is formed on a first surface S1 of the primary substrate 30a, and a plurality of primary trenches 31aa is provided by photolithography and etching. The primary trenches 31aa have sidewalls substantially perpendicular to the first surface S1. Next, a primary conductive layer 35a is formed on the whole area of the first-surface side so as to cover the sidewalls of the primary trenches 31aa and the first surface S1 of the primary substrate 30a.

Figure 16B:
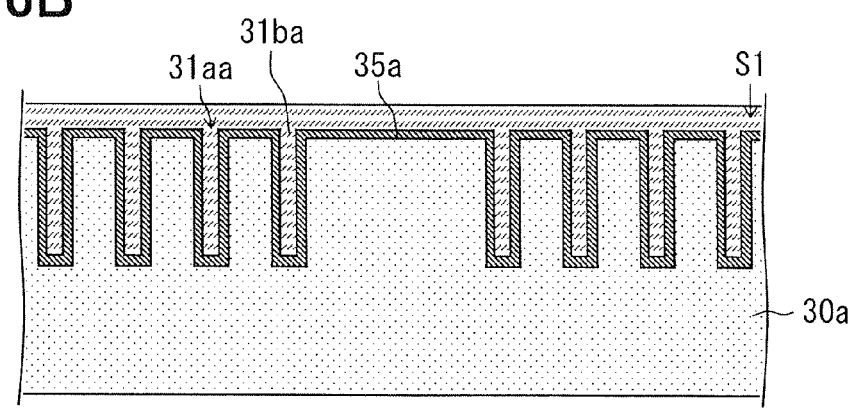

During a process shown in FIG. 16B, a primary insulating member 31ba that provides the insulating member 31b is deposited on the whole area of the first-surface side, and the primary trenches 31aa are filled with the primary insulating member 31ba through the primary conductive layer 35a.

The processes shown in FIG. 16A and FIG. 16B are similar to the processes described with reference to FIG. 3A to FIG. 3C.

Figure 16C:
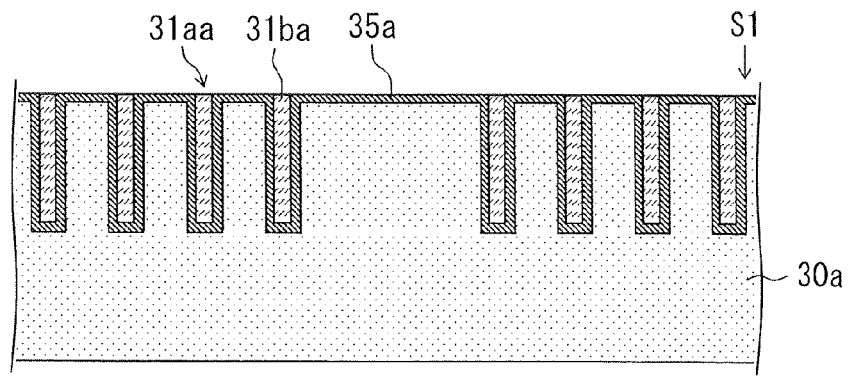

During a process shown in FIG. 16C, the primary insulating member 31ba may be removed, for example, by CMP using the primary conductive layer 35 formed on the first surface S1 of the primary substrate 30a as a stopper. Accordingly, the primary insulating member 31ba remains only in the primary trenches 31aa.

Figure 17A:
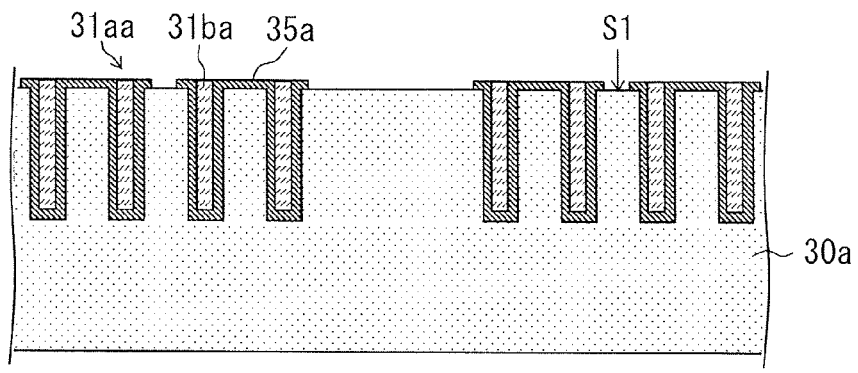
FIG. 17A to FIG. 17D are cross-sectional views showing other processes in the manufacturing method of the cap substrate in the semiconductor device according to the third embodiment.

During a process shown in FIG. 17A, the primary conductive layer 35a formed on the first surface S1 of the primary substrate 30a is treated with photolithography and etching so as to be a predetermined pattern. Accordingly, a part of the primary substrate 30a is exposed and a first surface S1 of the substrate 30 in the region divided substrate A13 is provided.

Figure 17B:
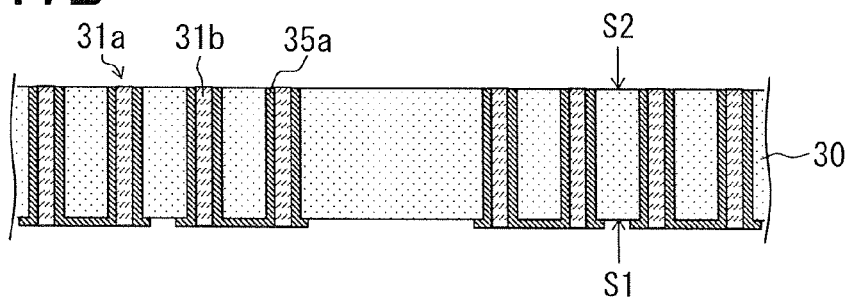

During a process shown in FIG. 17B, the primary substrate 30a is reversed. The primary substrate 30a is grinded from a second-surface side so that the primary insulating member 31ba buried in the primary trenches 31aa is exposed. Accordingly, a second surface S2 of the substrate 30, the trenches 31a, and the insulating member 31b are formed.

Figure 17C:
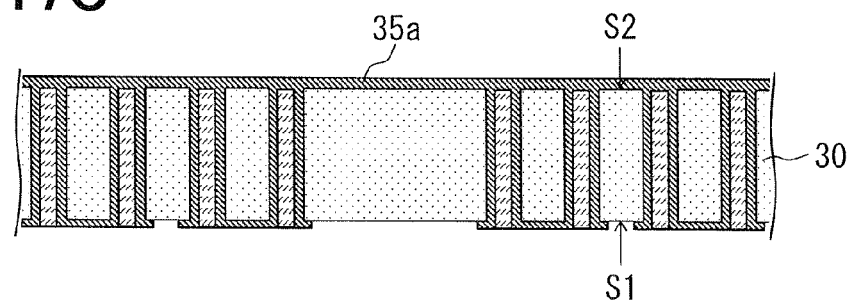

During a process shown in FIG. 17C, the primary conductive layer 35a is deposited on the whole area of the second surface S2 again.

Figure 17D:
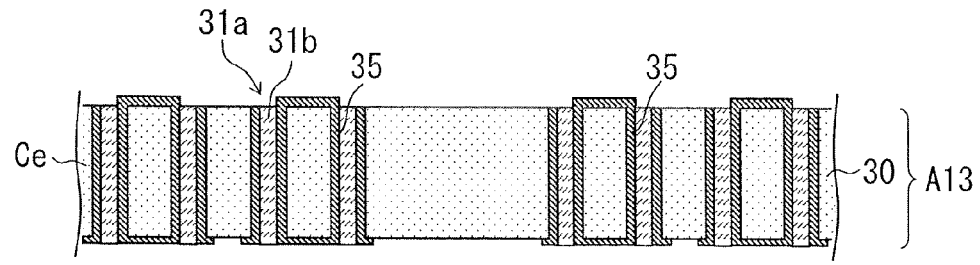

During a process shown in FIG. 17D, the primary conductive layer 35a formed on the second surface 32 is treated with photolithography and etching so as to be a predetermined pattern. Accordingly, the conductive layer 35 in the region divided substrate A13 is formed.

Through the above-described processes shown in FIG. 16A to FIG. 17D, the region divided substrate A13 in the semiconductor device 102 can be formed.

Fifth Embodiment

Figure 18:
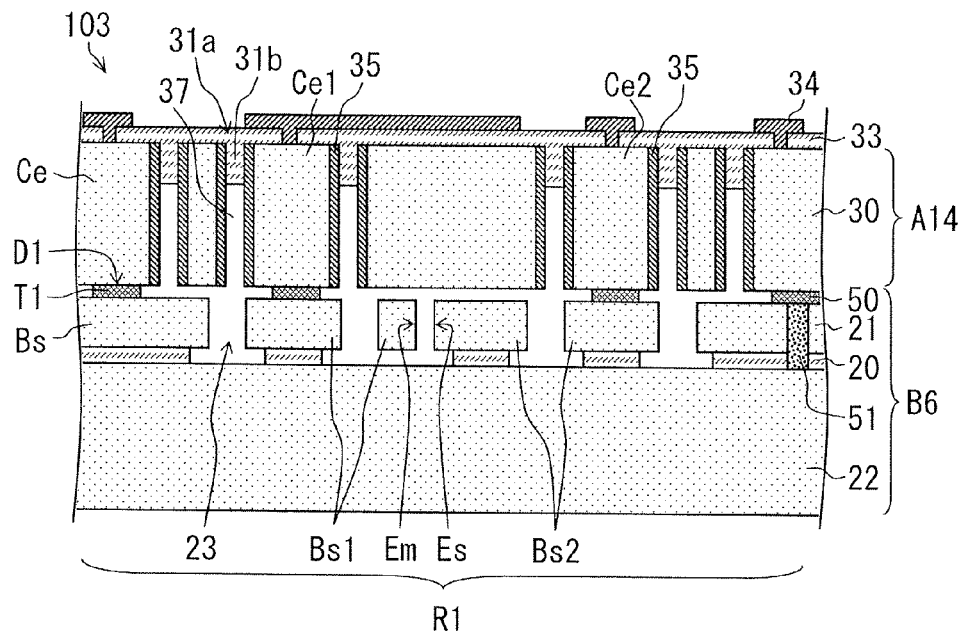
FIG. 18 is a cross-sectional view of a semiconductor device according to a fifth embodiment of the present invention.
Figure 19:
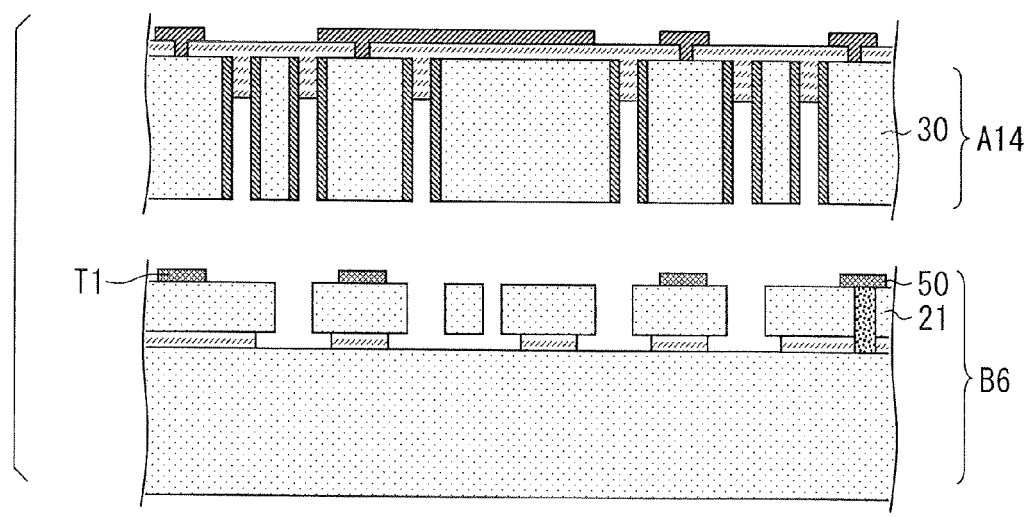
FIG. 19 is an exploded view of a cap substrate and a base substrate in the semiconductor device according to the fifth embodiment.

A semiconductor device 103 according to a fifth embodiment of the present invention will be described with reference to FIG. 18 and FIG. 19. The semiconductor device 103 includes a base substrate B6 and a cap substrate including a region divided substrate A14. When the region divided substrate A14 is bonded to the base substrate B6, the region divided substrate A14 is positioned with respect to the base substrate B6 as shown in FIG. 19.

The base substrate B6 in the semiconductor device 103 has a structure similar to the base substrate B3 in the semiconductor device 100 shown in FIG. 6A and FIG. 6B. The region divided substrate A14 includes a substrate 30. The substrate 30 is divided by a plurality of trenches 31a into a plurality of partial regions Ce. In each of the trenches 31a, only an upper portion is filled with an insulating member 31b, and a lower portion provides a space 37. Thus, in the semiconductor device 103, a parasitic capacitance of a dielectric layer provided by the insulating member 31b can be reduced compared with the semiconductor device 100.

A manufacturing method of the cap substrate including the region divided substrate A14 will be described with reference to FIG. 20A to FIG. 22D.

Figure 20A:
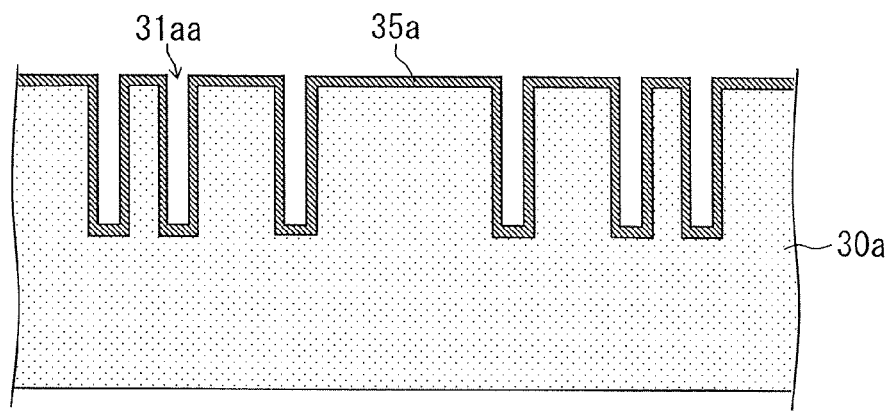
FIG. 20A to FIG. 20C are cross-sectional views showing processes in a manufacturing method of the cap substrate in the semiconductor device according to the fifth embodiment.

During a process shown in FIG. 20A, a primary substrate 30a made of single crystal silicon is prepared. A mask having a predetermined pattern is formed on an upper surface of the primary substrate 30a, and a plurality of primary trenches 31aa is provided by photolithography and etching. The primary trenches 31aa have sidewalls substantially perpendicular to the upper surface. Next, a primary conductive layer 35a is formed on the whole area of the upper surface so as to cover the sidewalls of the primary trenches 31aa and the upper surface of the primary substrate 30a.

The process shown in FIG. 20A is similar to the process described with reference to FIG. 2A and FIG. 2B.

Figure 20B:
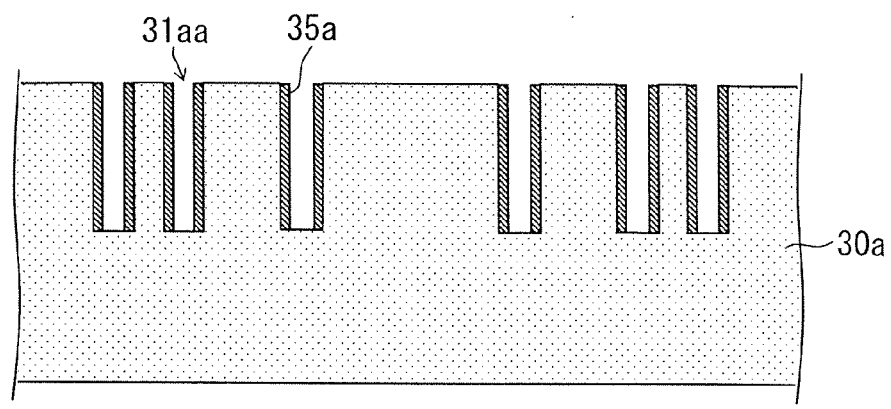

During a process shown in FIG. 20B, the primary conductive layer 35a disposed on the upper surface of the primary substrate 30a and bottom surfaces of the primary trenches 31aa are removed by anisotropic dry etching so that the primary conductive layer 35 disposed on the sidewalls of the primary trenches 31aa remain.

Figure 20C:
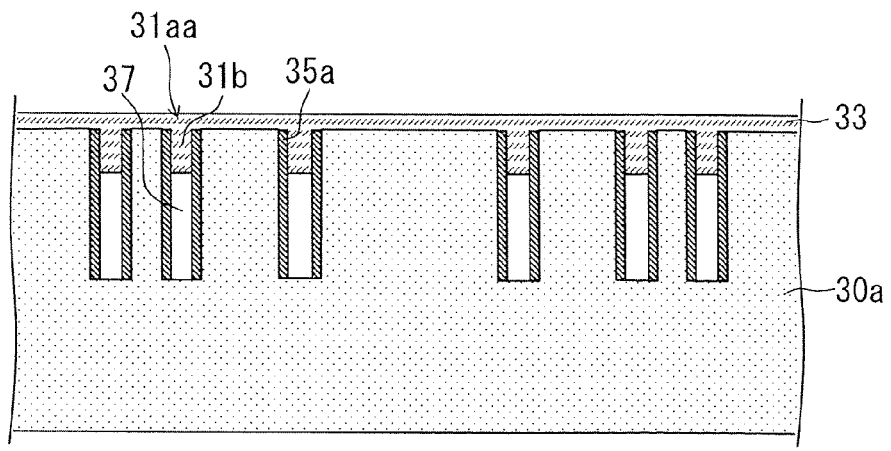

During a process shown in FIG. 20C, an $SiO_2$ layer is rapidly deposited, for example, by CVD or sputtering so as to form the insulating member 31b filling the upper portions of the primary trenches 31 aa and the surface protective layer 33 on the primary substrate 30a. By rapidly depositing the $SiO_2$ layer, opening portions of the primary trenches 31aa are filled with the insulating member 31b and the space 37 remains at the lower portions of the primary trenches 31aa. Thus, only the upper portions of the primary trenches 31aa are filled with the insulating member 31b.

Figure 21A:
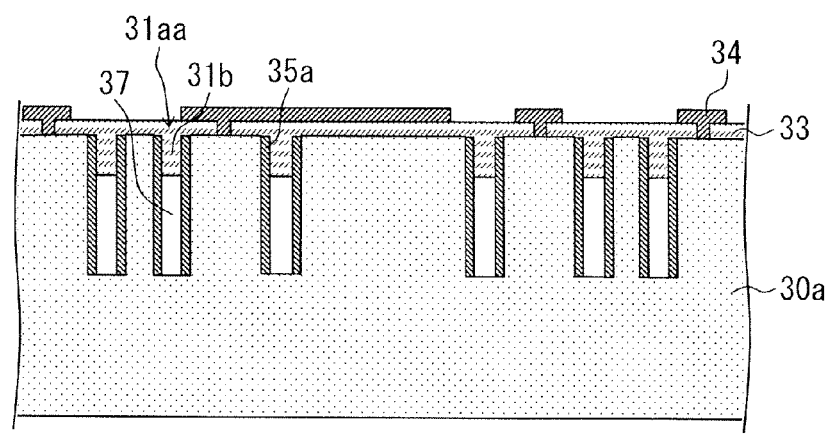
FIG. 21A and FIG. 21B are cross-sectional views showing other processes in the manufacturing method of the cap substrate in the semiconductor device according to the fifth embodiment.

During a process shown in FIG. 21A, contact holes are provided at predetermined positions of the surface protective layer 33, a layer made of aluminum (Al) is formed on the whole area, and a patterning process is performed by photolithography and etching. Accordingly, the wires and the electrode pads 34 are formed.

Figure 21B:
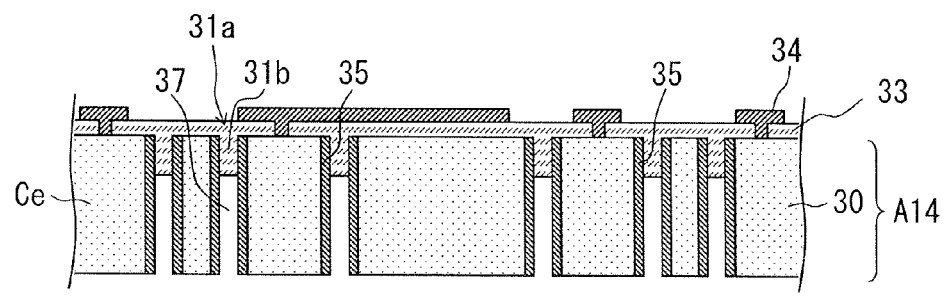

During a process shown in FIG. 21B, the primary substrate 30a is grinded from a lower-surface side, for example, by CMP until the space 37 is exposed to an outside of the primary substrate 30a.

Through the above-described processes shown in FIG. 20A to FIG. 21B, the cap substrate including the region divided substrate A14 can be formed.

In the processes shown in FIG. 20A to FIG. 21B, after providing the space 37 in the primary trenches 31aa, the primary substrate 30a is grinded so that the space 37 is exposed. Alternatively, after forming a structure similar to the region divided substrate A11 as shown in FIG. 8B, the insulating member 31b may be etched from a lower-surface side to a predetermined position so as to provide the space 37 of the region divided substrate A14.

Sixth Embodiment

A manufacturing method of a region divided substrate A15 according to a sixth embodiment of the present invention will be described with reference to FIG. 22A to FIG. 22D.

The region divided substrate A15 has a structure similar to the region divided substrate A14 shown in FIG. 19, and a space 37 is provided at a lower portion of each trench 31a.

First, as shown in FIG. 20A, a primary substrate 30a made of single crystal silicon is prepared, and primary trenches 31aa are provided. Next, a primary conductive layer 35a is formed on the whole area of the upper surface of the primary substrate 30a so as to cover the sidewalls of the primary trenches 31aa and the upper surface of the primary substrate 30a.

Figure 22A:
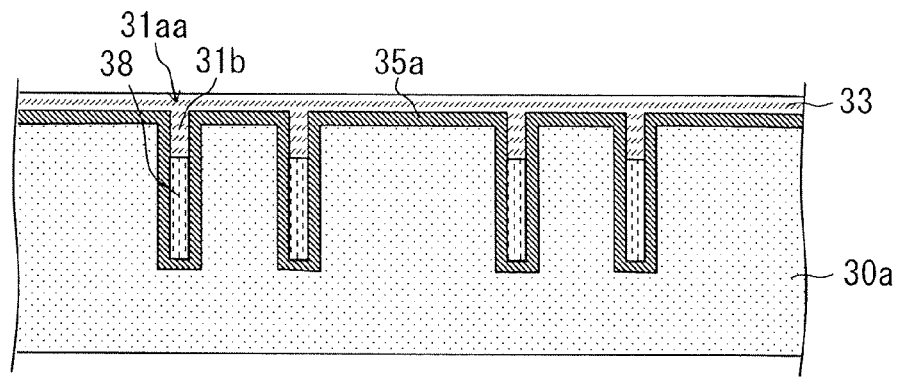
FIG. 22A to FIG. 22D are cross-sectional views showing processes in a manufacturing method of a cap substrate according to a sixth embodiment of the present invention.

During a process shown in FIG. 22A, an insulating member 38 is buried in lower portions of the primary trenches 31aa. The insulating member 38 is a sacrifice layer and is made of a material having a high etching rate. For example, the insulating member 38 is made of phosphorus silicate glass (PSG). Then, an $SiO_2$ layer is deposited, for example, by CVD or sputtering so as to form an insulating member 31b filling the upper portions of the primary trenches 31aa and a surface protective layer 33 on the primary substrate 30a.

Figure 22B:
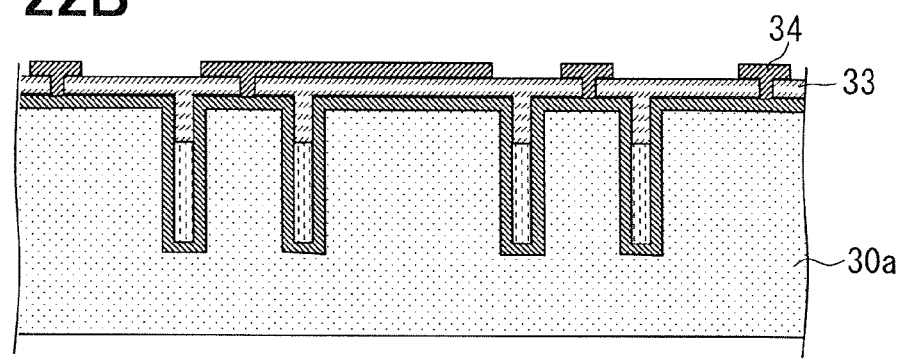

During a process shown in FIG. 22B, contact holes are provided at predetermined positions of the surface protective layer 33, a layer made of aluminum (Al) is formed on the whole area, and a patterning process is performed by photolithography and etching. Accordingly, the wires and the electrode pads 34 are formed.

Figure 22C:
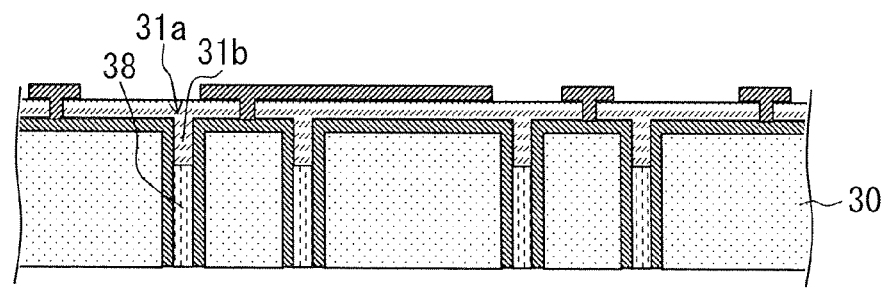

During a process shown in FIG. 22C, the primary substrate 30a is grinded from a lower-surface side, for example, by CMP until the insulating member 38 is exposed.

Figure 22D:
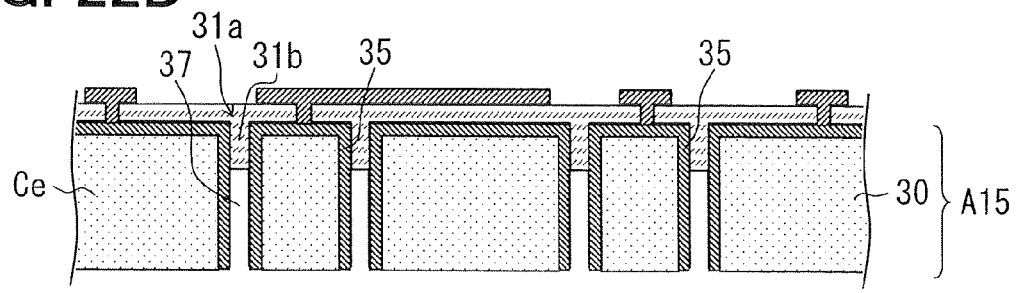

During a process shown in FIG. 22D, the insulating member 38 having a high etching rate is removed by etching with hydrofluoric acid so as to provide the space 37 in the trenches 31a.

Through the above-described processes shown in FIG. 22A to FIG. 22D, the region divided substrate A15 having the space 37 at the lower portions of the trenches 31a is formed.

The above-described processes shown in FIG. 22A to FIG. 22D starts with the primary substrate 30a and the primary conductive layer 35 in a state shown in FIG. 20A. Alternatively, the processes may also start with the primary substrate 30a and the primary conductive layer 35a in a state shown in FIG. 20B.

In the processes shown in FIG. 22A to FIG. 22D, the lower surface of the primary substrate 30a can be grinded in a state where the lower portions of the trenches 31a are filled with the insulating member 38 as the sacrifice layer. Thus, a crack or a chip of the primary substrate 30a due to grinding can be restricted compared with the manufacturing processes of the region divided substrate A14 described with reference to FIG. 20A to FIG. 21B.

Seventh Embodiment

Figure 23:
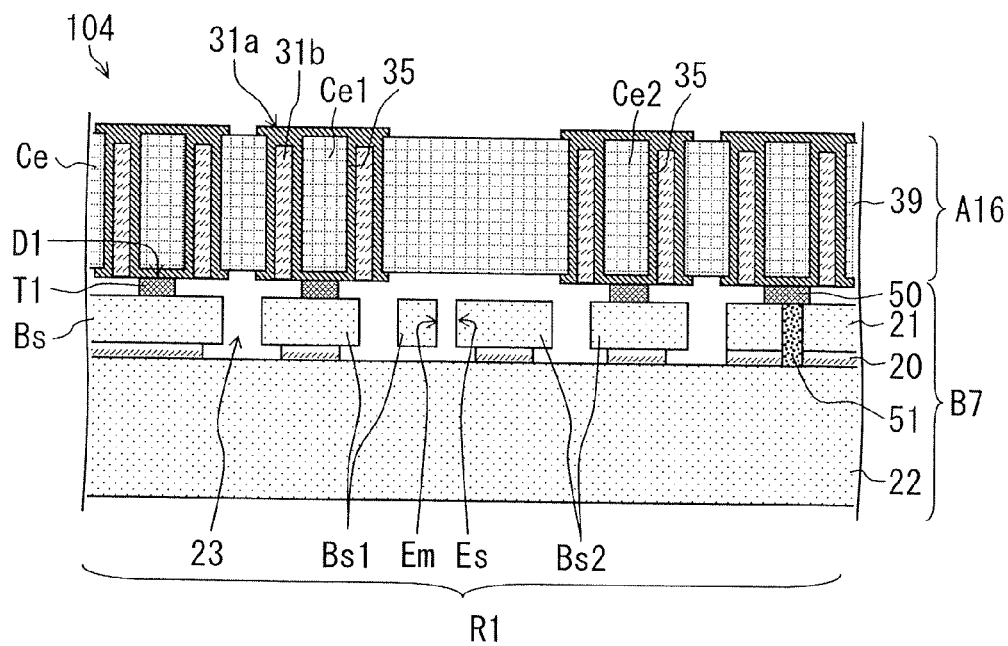
FIG. 23 is a cross-sectional view of a semiconductor device according to a seventh embodiment of the present invention.
Figure 24:
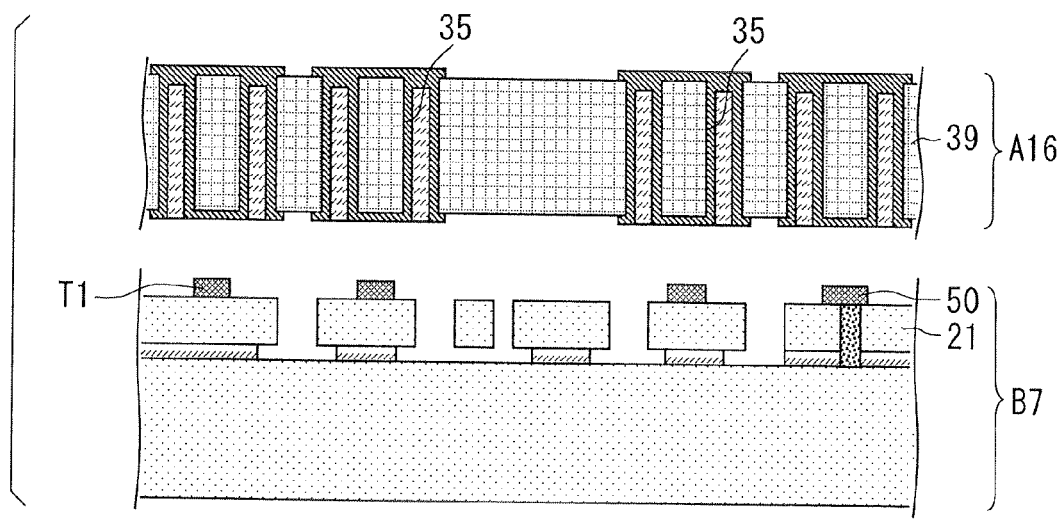
FIG. 24 is an exploded view of a cap substrate and a base substrate in the semiconductor device according to the seventh embodiment.

A semiconductor device 104 according to a seventh embodiment of the present invention will be described with reference to FIG. 23 and FIG. 24. The semiconductor device 104 includes a base substrate B7 and a cap substrate including a region divided substrate A16. When the region divided substrate. A16 is bonded to the base substrate B7, the region divided substrate A16 is positioned with respect to the base substrate B7 as shown in FIG. 24.

The base substrate B7 in the semiconductor device 104 has a structure similar to the base substrate B3 in the semiconductor device 100 shown in FIG. 6A and FIG. 6B. The region divided substrate A16 includes an insulating substrate 39 made of, for example, silica glass, a glass having a thermal expansion coefficient similar to silicon (Si) or crystallized glass. The crystallized glass includes Devitron (trade mark) available from Ishizuka Glass Co., Ltd.

In the region divided substrate A16, the insulating substrate 39 that does not have a conductive property is used as a substrate. The insulating substrate 39 has a lower surface joined with the base substrate B7, an upper surface coupled with an external device, and a plurality of trenches 31a penetrating the insulating substrate 39 from the upper surface to the lower surface. The insulating substrate 39 is divided by the trenches 31a into a plurality of partial regions Ce. A conductive layer 35 having a high conductivity is integrally formed on the lower surface of the insulating substrate 39, sidewall of the trenches 31a, and the upper surface of the of the insulating substrate 39. Thus, also in the semiconductor device 104 shown in FIG. 23, a part of the partial regions Ce can be used as extraction conductive regions Ce1 and Ce2. On the region divided substrate A16, a multilayer including an interlayer insulating layer and a wiring layer may be formed so as to improve a flexibility of arranging wires and electrode pads.

A manufacturing method of the cap substrate including the region divided substrate A16 will be described with reference to FIG. 25A to FIG. 26D.

Figure 25A:
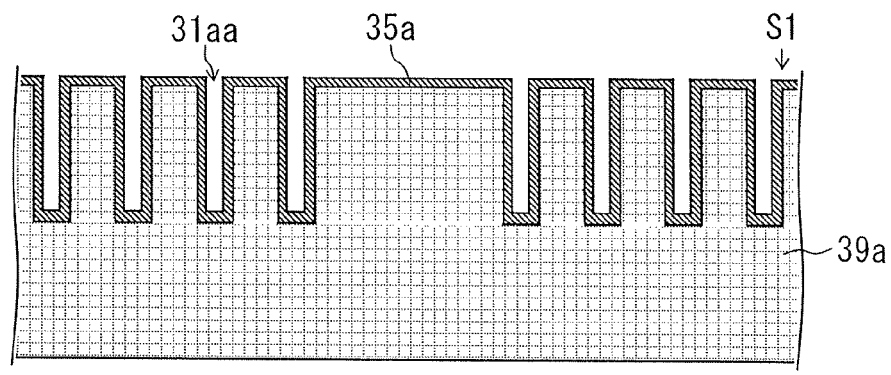
FIG. 25A to FIG. 25C are cross-sectional views showing processes in a manufacturing method of the cap substrate in the semiconductor device according to the seventh embodiment.

During a process shown in FIG. 25A, a primary substrate 39a made of insulating material such as glass is prepared. A mask having a predetermined pattern is formed on an upper surface of the primary substrate 39a, and a plurality of primary trenches 31aa is provided by photolithography and etching. The primary trenches 31aa have sidewalls substantially perpendicular to a first surface S1. The primary trenches 31aa do not penetrate the primary substrate 39a. Next, a primary conductive layer 35a is formed on the whole area of the first-surface side so as to cover the sidewalls of the primary trenches 31aa and the first surface S1 of the primary substrate 39a.

Figure 25B:
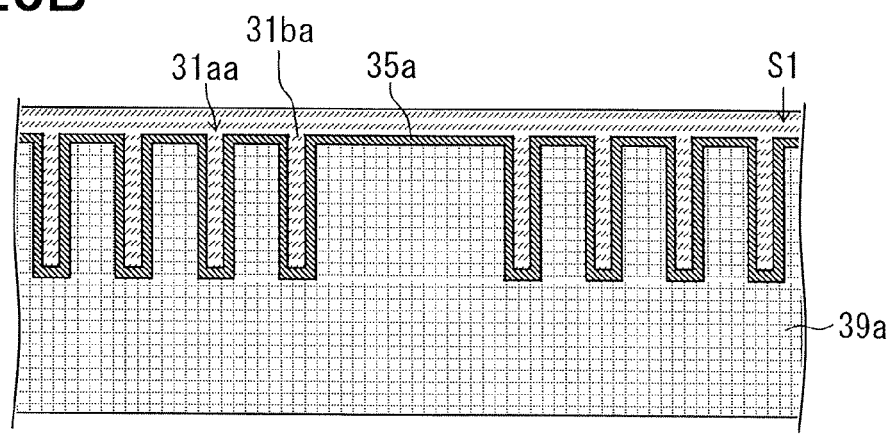

During a process shown in FIG. 25B, a primary insulating member 31ba that provides the insulating member 31b is deposited on the whole area of the first-surface side, and the primary trenches 31aa are filled with the primary insulating member 31ba through the primary conductive layer 35a.

Figure 25C:
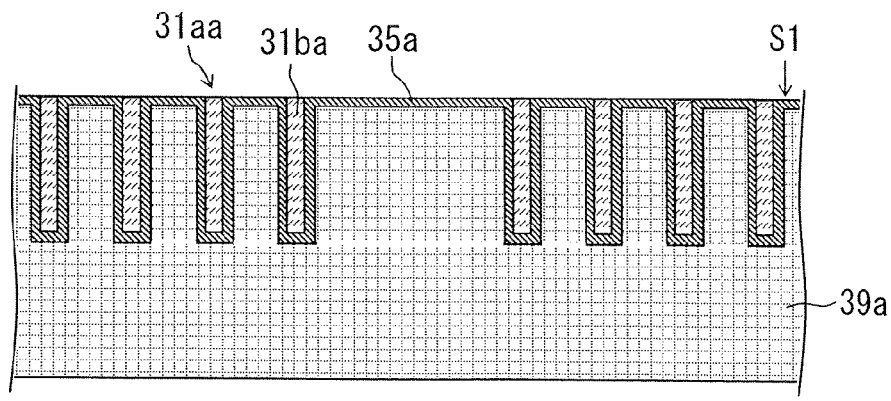

During a process shown in FIG. 25C, the primary insulating member 31ba is removed, for example, by CMP using the primary conductive layer 35a formed on the first surface S1 of the primary substrate 39a as a stopper. Accordingly, the primary insulating member 31ba remains only in the primary trenches 31aa.

Figure 26A:
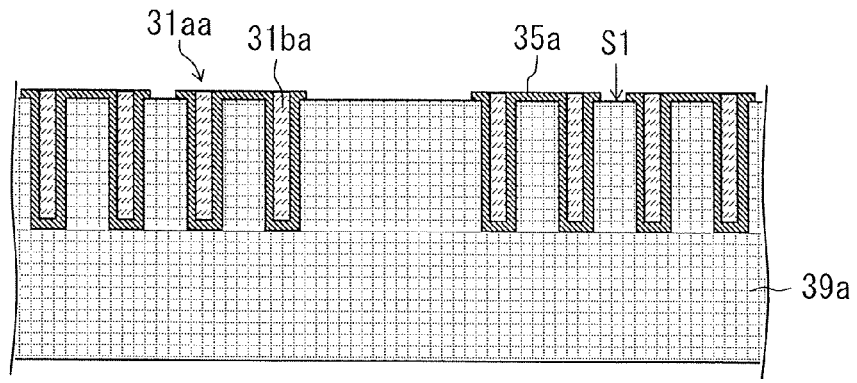
FIG. 26A to FIG. 26D are cross-sectional views showing other processes in the manufacturing method of the cap substrate in the semiconductor device according to the seventh embodiment.

During a process shown in FIG. 26A, the primary conductive layer 35 formed on the first surface S1 of the primary substrate 39a is treated with photolithography and etching so that the primary conductive layer 35a disposed at peripheries of the primary trenches 31aa remains.

Figure 26B:
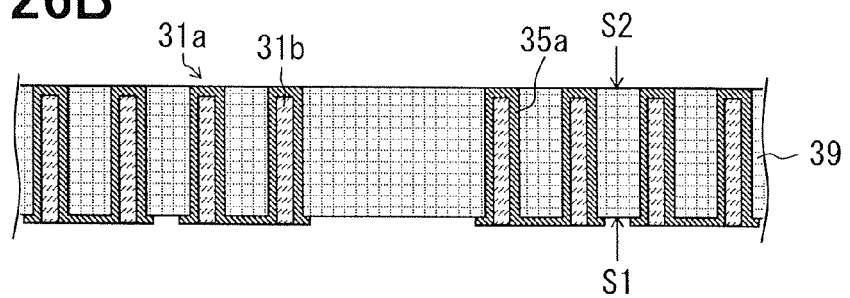

During a process shown in FIG. 26B, the primary substrate 39a is grinded, for example, by CMP from a second surface S2 until the primary conductive layer 35a at bottoms of the primary trenches 31aa is exposed. Accordingly, the insulating substrate 39 in the region divided substrate A16 is formed.

Figure 26C:
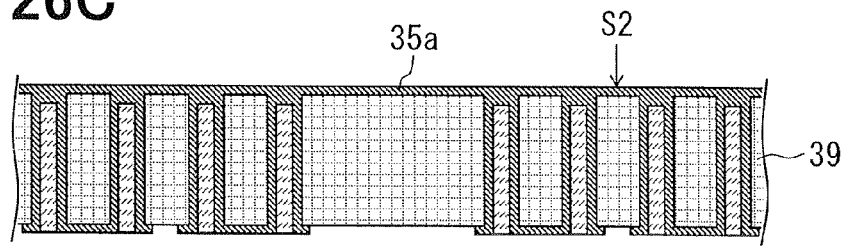

During a process shown in FIG. 26C, the primary conductive layer 35a is deposited on the whole area of a second surface S2 of the insulating substrate 39.

Figure 26D:
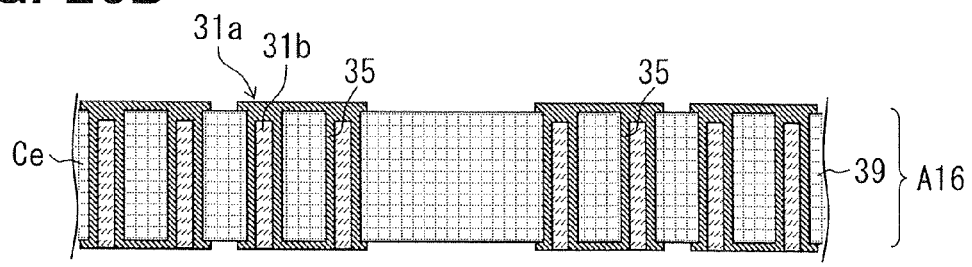

During a process shown in FIG. 26D, the primary conductive layer 35a formed on the second surface S2 is treated with photolithography and etching so as to be a predetermined pattern. Accordingly, the conductive layer 35 in the region divided substrate A16 is formed.

Through the above-described processes shown in FIG. 25A to FIG. 26D, the region divided substrate A16 in the semiconductor device 104 can be formed. The processes shown in FIG. 25A to FIG. 26D are similar to the processes described with reference to FIG. 16A to FIG. 17D although the materials of the primary substrates are different.

Eighth Embodiment

Figure 27:
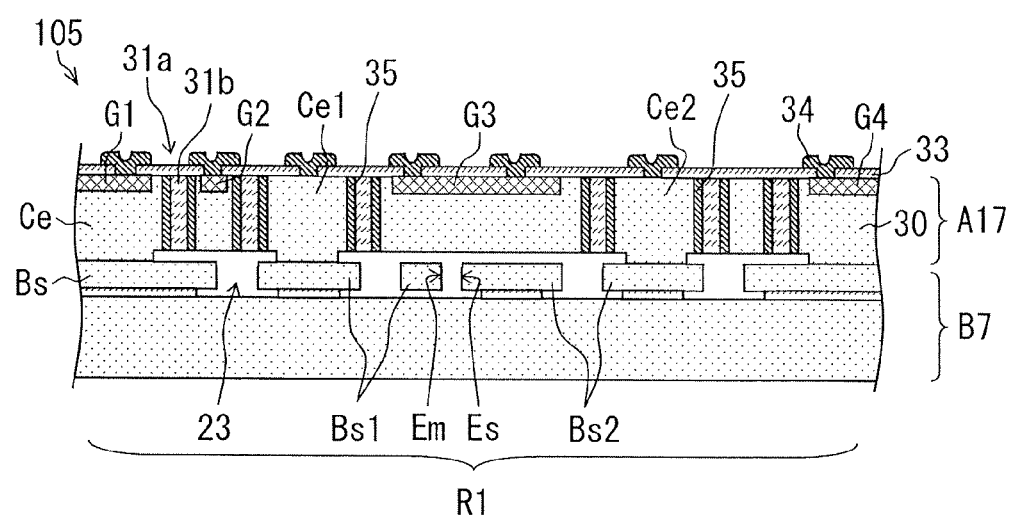
FIG. 27 is a cross-sectional view of a semiconductor device according to an eighth embodiment of the present invention.

A semiconductor device 105 according to an eighth embodiment of the present invention will be described with reference to FIG. 27. The semiconductor device 105 includes the base substrate B7 and a cap substrate including a region divided substrate A17.

The region divided substrate A17 includes a substrate 30 made of single crystal silicon. At some of partial regions Ce, various elements such as IC circuits G1 to G4, a power device, and a sensor are formed. The IC circuits G1 to G4 are insulated from each other by insulating body. Each of the IC circuits G1 to G4 may be a bipolar circuit or a complementary metal-oxide semiconductor (CMOS) circuit. In a case where various elements such as IC circuits, power devices and sensors are integrally formed in a cap substrate, electrical influence by others can be restricted and a properties can be stabilized by insulating the elements from each other. In this way, in a case where a semiconductor single crystal silicon substrate, and an SOI substrate, or a compound semiconductor substrate is used as a body of a region divided substrate, various semiconductor elements and IC circuits can be formed not only in a base region but also at predetermined partial regions in the region divided substrate that is used as a cap substrate.

As described above, in a region divided substrate including a conductive layer 35 on sidewalls of partial regions Ce, the conductive layer 35 can function as a main current channel. Thus, even when the substrate 30 is made of single crystal silicon having a low impurity concentration and a high specific resistance is used, the partial regions Ce on which the conductive layer 35 is formed can function as the extraction conductive regions Ce1 and Ce2 having a low resistance. Thus, in the extraction conductive regions Ce1 and Ce2 on which the conductive layer 35 is formed, it is not required to form the extraction conductive regions Ce1 and Ce2 to have a high concentration N conductivity type (n+) by implanting ions such as phosphorus (P) and arsenic (As).

In the above-described region divided substrates A10 to A15 in which the IC circuits G1 to G4 are not formed, the substrate 30 made of silicon substrate and having a specific resistance (impurity concentration) of from $0.001$ $\Omega$cm to $100$ $\Omega$cm can be used, for example. In a case where the IC circuits G1 to G4 are formed at predetermined partial regions Ce in the region divided substrate A17 as shown in FIG. 27, the substrate 30 has an impurity concentration appropriate for forming the IC circuits G1 to G4. For example, the substrate 30 in which the IC circuits G1 to G4 are formed may have a specific resistance of from $0.1$ $\Omega$cm to $20$ $\Omega$cm. A conductivity type of the substrate 30 may be either an N conductivity type or a P conductivity type.

When a substantive part of a dynamic quantity sensor element is formed on the base substrate B7, the IC circuits G1 to G4 formed in the region divided substrate A17 can be used as a peripheral circuit for processing signals from the dynamic quantity sensor element. By disposing the IC circuits G1 to G4 above the substantive part of the dynamic quantity sensor element requiring a large area, the region divided substrate A17 included in the cap substrate can be used efficiently, and a dimension of the semiconductor device 105 can be reduced. The IC circuits G1 to G4 may be formed before or after bonding the base substrate B7 and the region divided substrate A17. In the region divided substrate A17, the conductive layer 35 is disposed on sidewalls of the partial regions Ce in which the IC circuits G1 to G4 are formed as well as on sidewalls of the partial regions Ce used as the extraction conductive regions Ce1 and Ce2. When the conductive layer 35 is formed only on the sidewalls of the partial regions Ce, the IC circuits G1 to G4 are free of adverse influence of the conductive layer 35. On the contrary, effects of the IC circuits G1 to G4 as shield layers can be improved, resistances in a lower direction can be reduced, and properties of the IC circuits G1 to G4 can be stabilized.

Ninth Embodiment

Figure 28:
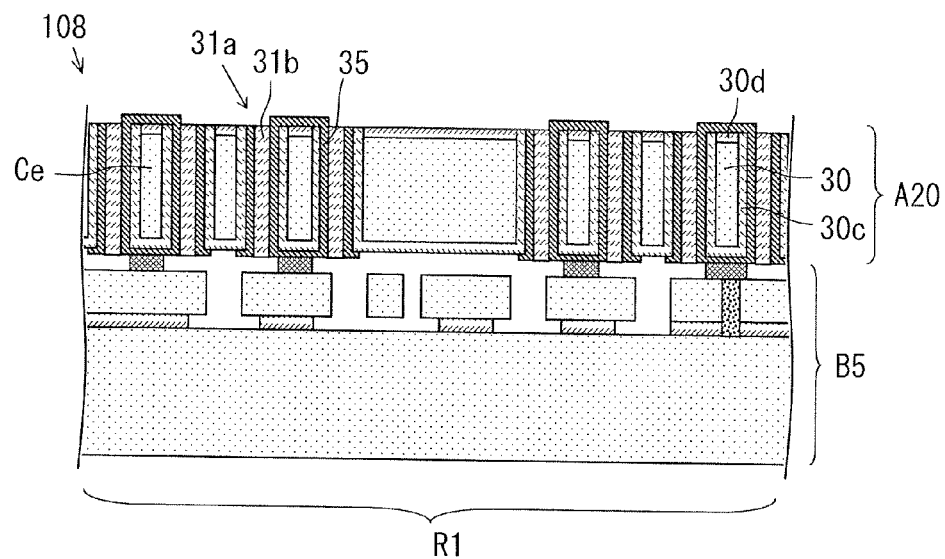
FIG. 28 is a cross-sectional view of a semiconductor device according to a ninth embodiment of the present invention.
Figure 29:
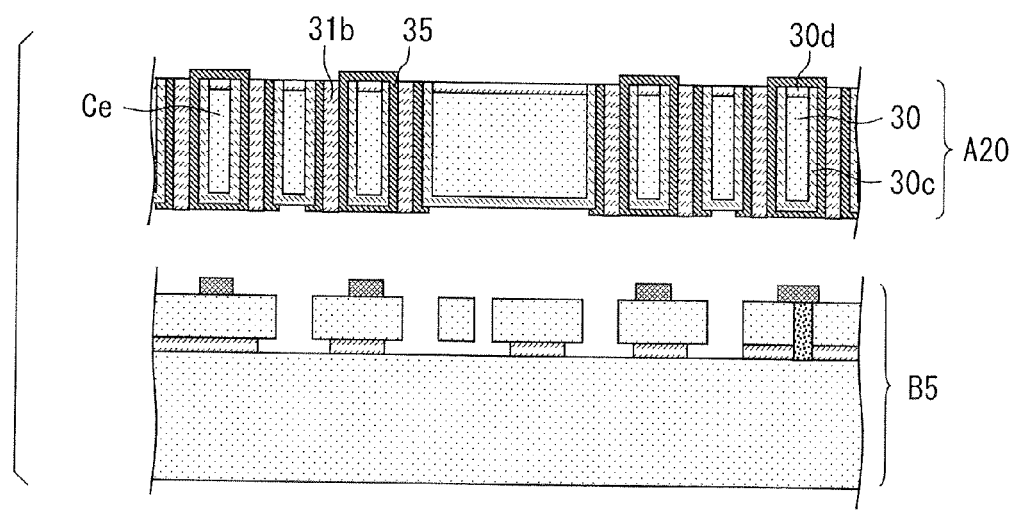
FIG. 29 is an exploded view of a cap substrate and a base substrate in the semiconductor device according to the ninth embodiment.

A semiconductor device 108 according to a ninth embodiment of the present invention will be described with reference to FIG. 28 and FIG. 29. The semiconductor device 108 includes a base substrate B5 and a cap substrate including a region divided substrate A20. When the region divided substrate A20 is bonded to the base substrate B5, the region divided substrate A20 is positioned with respect to the base substrate B5 as shown in FIG. 29.

The base substrate B5 in the semiconductor device 108 is same as the base substrate B5 in the semiconductor device 102. The region divided substrate A20 includes a substrate 30 made of single crystal silicon. The substrate 30 is divided by a plurality of trenches 31a into a plurality of partial regions Ce. On sidewalls of each of the partial regions Ce, a conductive layer 35 is disposed through an insulating layer 30c. In addition, on an upper surface of each of the partial regions Ce, an insulating layer 30d is disposed. Thus, each of the partial regions Ce is covered with the insulating layer 30c and the insulating layer 30d.

The region divided substrate A20 in the semiconductor device 108 is effective especially when an IC circuit is formed in the partial regions Ce. The insulating layer 30c can be used as an interlayer insulating layer or a protective layer. The insulating layer 30c may be made of any insulating material. For example, the insulating layer 30c may be a silicon oxide layer that can be easily formed.

An exemplary method of manufacturing the region divided substrate A20 used as the cap substrate in the semiconductor device 108 will be described with reference to FIG. 30A to FIG. 32E.

Figure 30A:
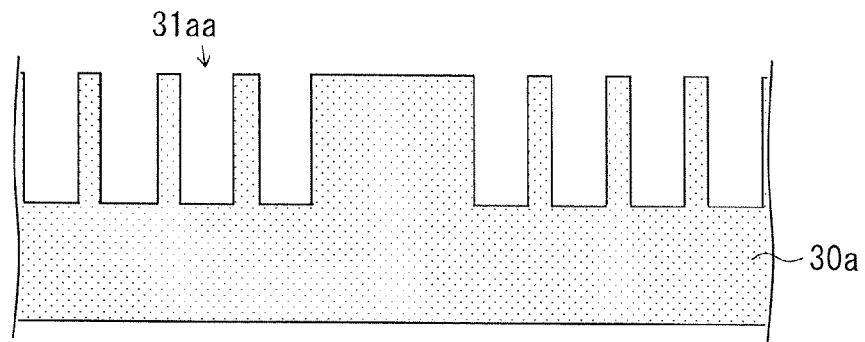
FIG. 30A to FIG. 30C are cross-sectional views showing processes in a manufacturing method of the cap substrate in the semiconductor device according to the ninth embodiment.

During a process shown in FIG. 30A, a primary substrate 30a made of single crystal silicon is prepared. A mask having a predetermined pattern is formed on an upper surface of the primary substrate 30a, and a plurality of primary trenches 31aa is provided by photolithography and etching. The primary trenches 31aa do not penetrate the primary substrate 30a. The primary trenches 31aa have sidewalls substantially perpendicular to the upper surface. The primary trenches 31aa are perpendicular or have forward taper shapes of 0 to 5 degrees.

Figure 30B:
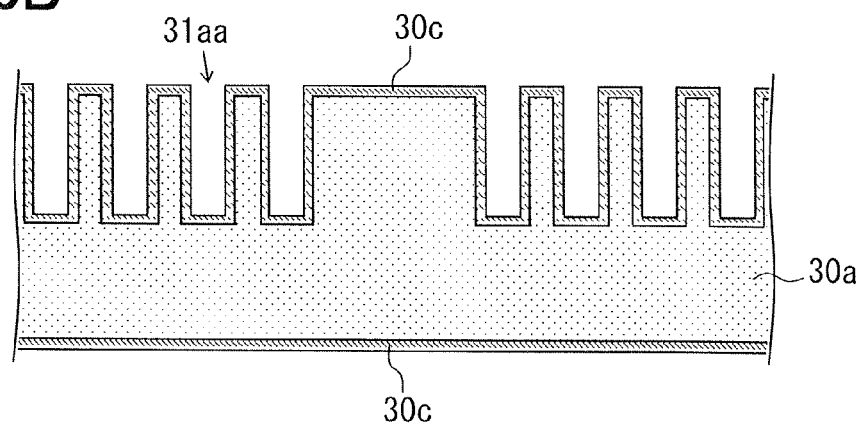

During a process shown in FIG. 30B, the insulating layer 30c is formed so as to cover the sidewalls of the primary trenches 31aa and an upper surface of the primary substrate 30a. As the insulating layer 30c, a silicon oxide layer having a thickness of 0.1 µm to 2 µm may be formed by thermal oxidation on the upper surface and the lower surface of the primary substrate 30a. Alternatively, a silicon oxide layer, a silicon nitride layer or a compound layer of silicon oxide and silicon nitride having a thickness of 0.1 µm to 3 µm may also be formed on the upper surface of the primary substrate 30a in a state where a thermal stress is reduced to zero, for example, by plasma CVD.

Figure 30C:
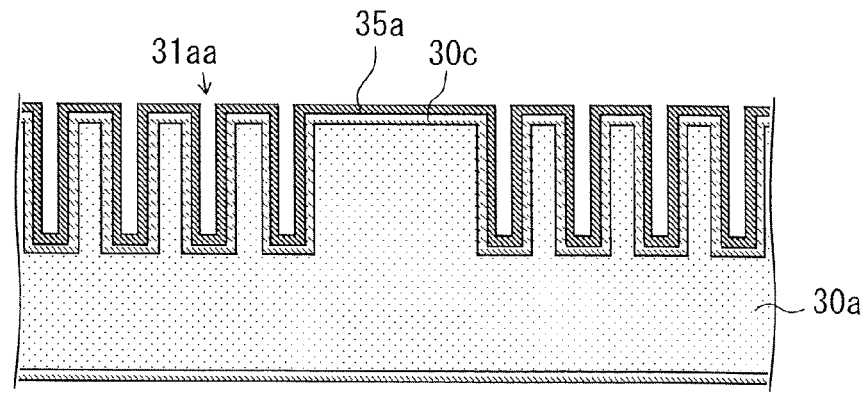

During a process shown in FIG. 30C, a primary conductive layer made of aluminum (Al) is formed on the insulating layer 30c so as to cover the sidewalls of the primary trenches 31aa and the upper surface of the primary substrate 30a. By forming the primary trenches 31aa to have the forward taper shapes during the process shown in FIG. 30A, the insulating layer 30c in FIG. 30B and the primary conductive layer 35a in FIG. 30C can be stably formed.

Figure 31A:
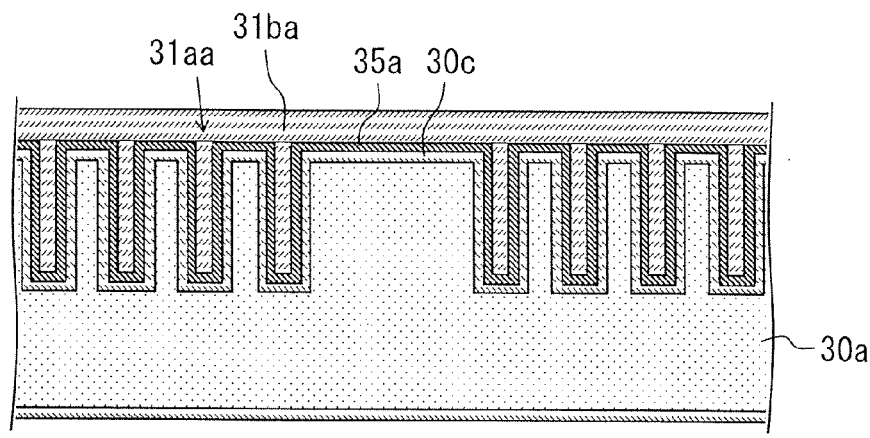
FIG. 31A to FIG. 31C are cross-sectional views showing other processes in the manufacturing method of the cap substrate in the semiconductor device according to the ninth embodiment.

During a process shown in FIG. 31A, a primary insulating member 31ba that provides the insulating member 31b is deposited on the whole area of the upper surface side of the primary substrate 30a, and the primary trenches 31aa are filled with the primary insulating member 31ba through the primary conductive layer 35a and the insulating layer 30c.

Figure 31B:
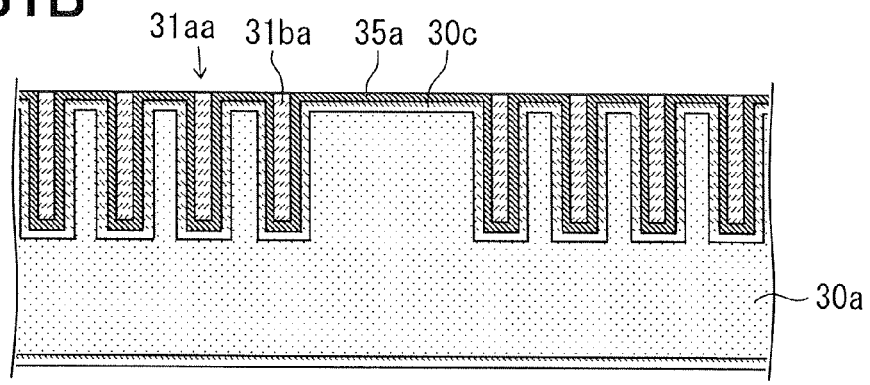

During a process shown in FIG. 31B, the insulating member 31ba is removed by CMP or dry etching until the upper surface of the primary conductive layer 35a is exposed.

Figure 31C:
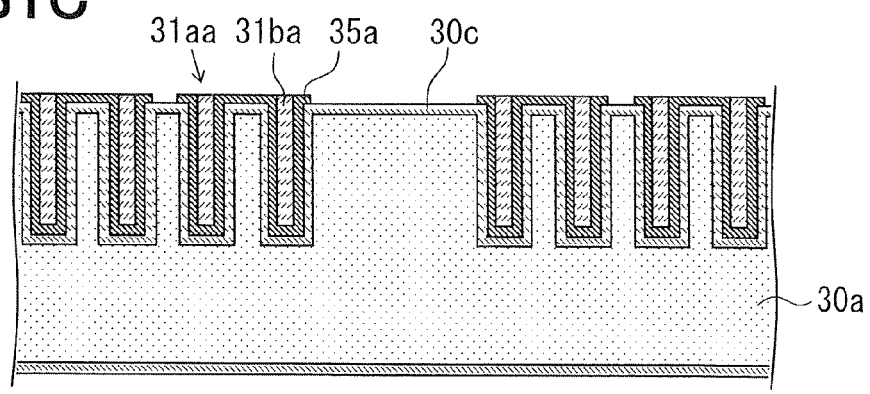

During a process shown in FIG. 31C, the primary conductive layer 35a is treated with photolithography and etching so that the primary conductive layer 35a has a predetermined pattern.

Figure 32A:
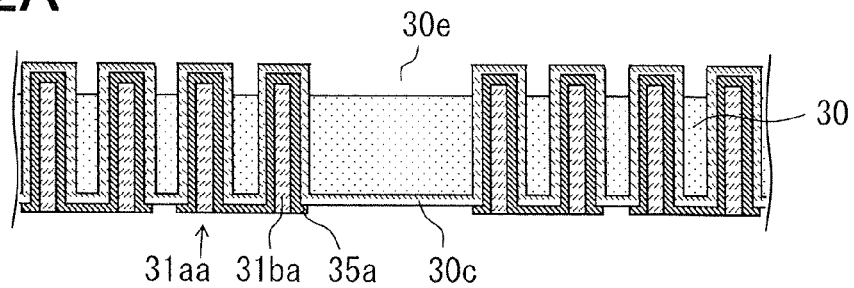
FIG. 32A to FIG. 32E are cross-sectional views showing other processes in the manufacturing method of the cap substrate in the semiconductor device according to the ninth embodiment.

During a process shown in FIG. 32A, the primary substrate 30a is reversed, and a rear surface side of the primary substrate 30a is removed, for example, by grinding, polishing, etching, or CMP so as to provide the substrate 30 having recess portions 30e.

Figure 32B:
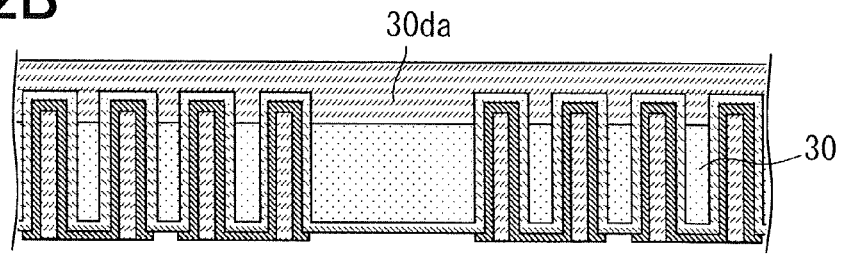

During a process shown in FIG. 32B, a primary insulating layer 30da is formed so as to fill the recess portions 30e.

Figure 32C:
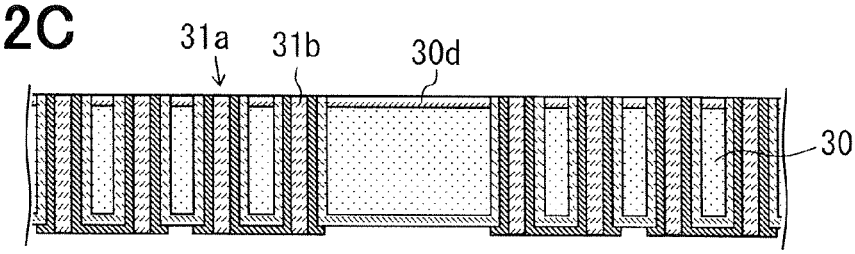

During a process shown in FIG. 32C, the primary insulating layer 30da is removed, for example, by CMP until the primary insulating member 31ba buried in the primary trenches 31aa is exposed. Accordingly, the trenches 31a, the insulating member 31b, and the insulating layer 30d are formed.

Figure 32D:
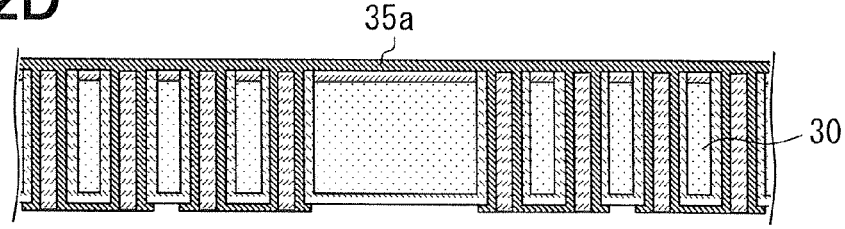

During a process shown in FIG. 32D, the primary conductive layer 35a is deposited again.

Figure 32E:
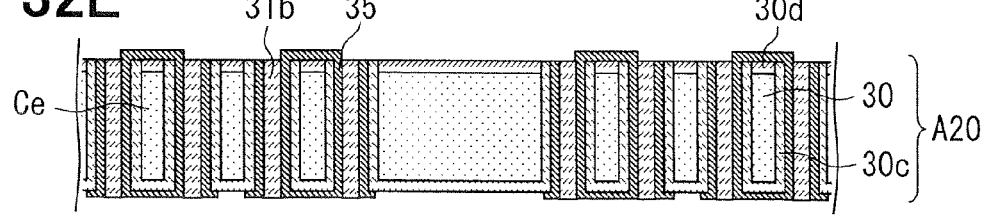

During a process shown in FIG. 32E, the primary conductive layer 35a is treated with photolithography and etching so that the primary conductive layer 35a has a predetermined pattern to form penetrating electrodes. Accordingly, the conductive layer 35 in the region divided substrate A20 is formed.

Through the above-described processes shown in FIG. 30A to FIG. 32E, the region divided substrate A20 is formed. By stacking the region divided substrate A20 on the base substrate B5 as shown in FIG. 29 and bonding the region divided substrate A20 with the base substrate B5, the semiconductor device 108 in FIG. 28 is formed.

Tenth Embodiment

Figure 33:
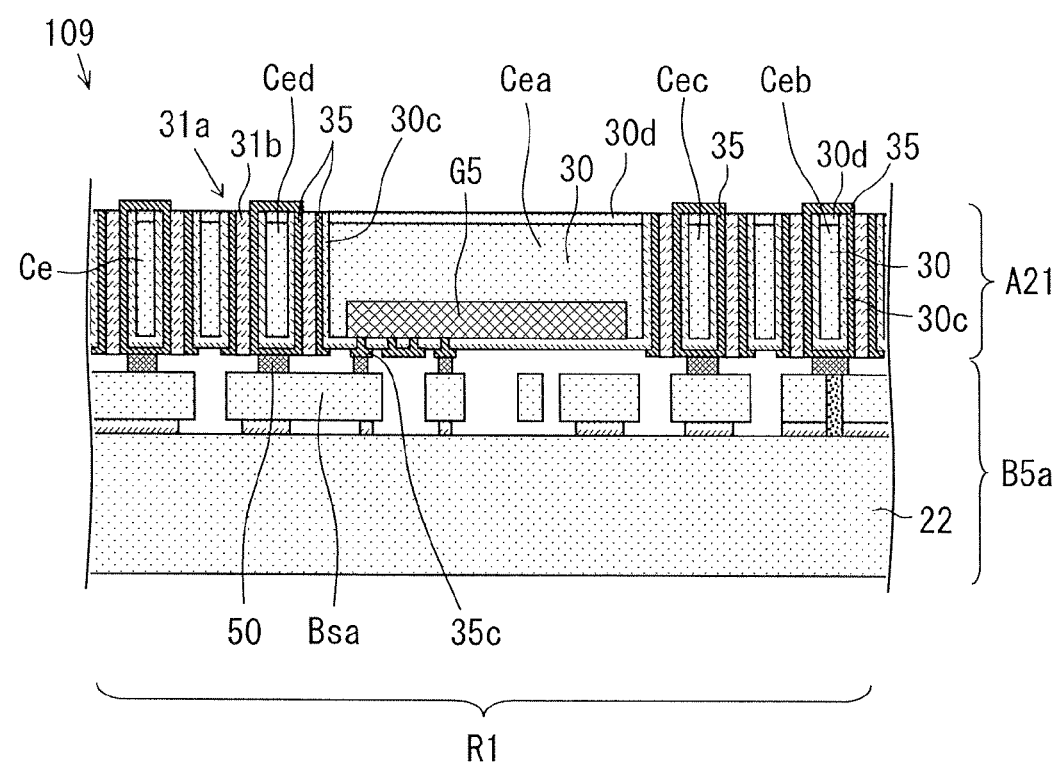
FIG. 33 is a cross-sectional view of a semiconductor device according to a tenth embodiment of the present invention.

A semiconductor device 109 according to a tenth embodiment of the present invention will be described with reference to FIG. 33. The semiconductor device 109 includes a base substrate B5a and a cap substrate including a region divided substrate A21.

The base substrate B5a in the semiconductor device 109 is similar to the base substrate B5 in the semiconductor device 108. The region divided substrate A21 includes an insulating layer 30c that is disposed between a substrate 30 made of single crystal silicon and a conductive layer 35 and an insulating layer 30d that is disposed on upper surfaces of partial regions Ce in a manner similar to the region divided substrate A20. Thus, each of the partial regions Ce in the region divided substrate A21 is covered with the insulating layer 30c and the insulating layer 30d.

The partial regions Ce include a partial region Cea. In the partial region Cea, an IC circuit G5 is formed. The IC circuit G5 is formed at a lower side of the region divided substrate A21 opposed to a predetermined region R1 in the base substrate B5a. The IC circuit G5 is disposed in a space that is sealed by bonding the base substrate B5a and the region divided substrate A21. The IC circuit G5 in the semiconductor device 109 is difficult to be corroded or deteriorated compared with the IC circuits G1 to G4 in the semiconductor device 105 in FIG. 27.

The partial regions Ce further include extraction conductive regions Ceb, Cec, and Ced. Each of the extraction conductive regions Ceb, Cec, and Ced is enclosed by the insulating layers 30c and 30d and the conductive layer 35. The extraction conductive region Ceb is electrically coupled with the support substrate 22 in the base substrate B5a. The extraction conductive region Cec is electrically coupled with the fixed electrode and the movable electrode of the base substrate Ba in which a dynamic quantity sensor. The extraction conductive region Ced is electrically coupled with the IC circuit G5 through an electrode 35c coupled with the IC circuit 5, the conductive layer 50, and a base semiconductor region Bsa.

An exemplary method of manufacturing the region divided substrate A21 used as the cap substrate in the semiconductor device 109 will be described with reference to FIG. 34A to FIG. 34C.

The region divided substrate A21 can be formed through processes basically similar to the processes shown in FIG. 30A to FIG. 32E.

Figure 34A:
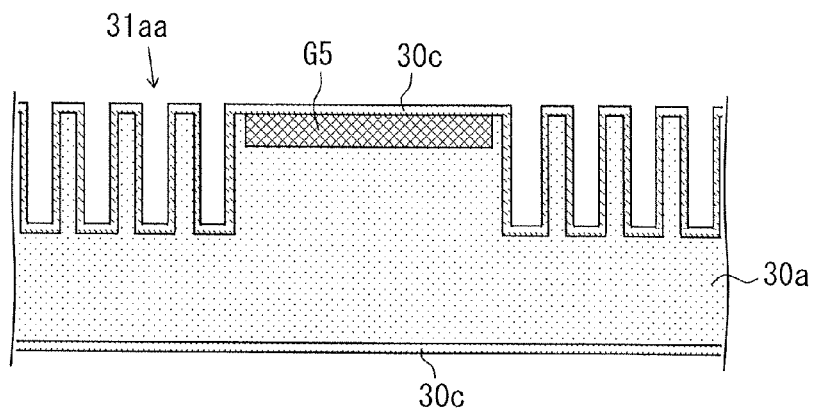
FIG. 34A to FIG. 34C are cross-sectional views showing processes in a manufacturing method of a cap substrate in the semiconductor device according to the tenth embodiment.

FIG. 34A is a diagram corresponding to FIG. 30B. The IC circuit 5 is preliminary formed at a predetermined position of a surface portion of a primary substrate 30a made of single crystal silicon. Then, the primary trenches 31aa and the insulating layer 30c are formed.

Figure 34B:
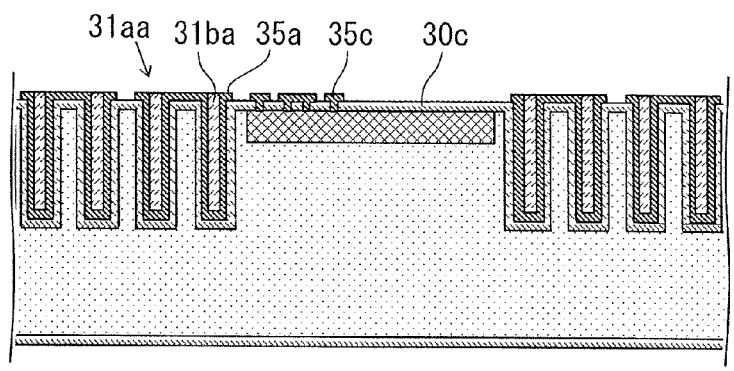
Figure 34C:
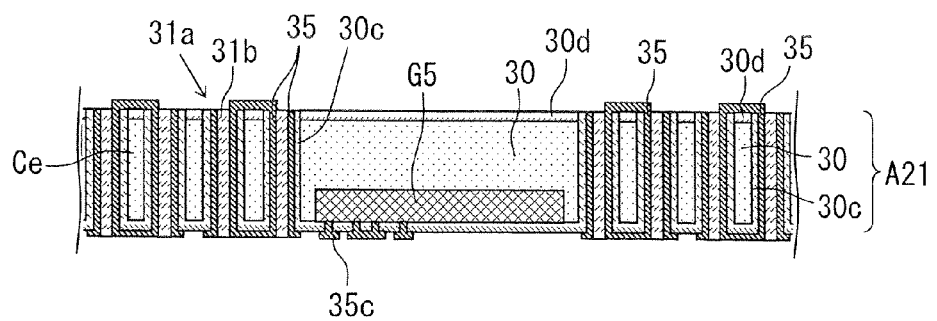

FIG. 34B is a diagram corresponding to FIG. 31C. From a state shown in FIG. 34A to a state shown in FIG. 34B, the region divided substrate A21 is treated with the processes shown from FIG. 30C to FIG. 31B. The electrode 35c coupled with the IC circuit G5 is formed at the same time when the primary conductive layer 35a is processed to have a predetermined pattern.

From a state shown in FIG. 34B, the region divided substrate A21 is treated with the processes shown from FIG. 32A to FIG. 32E. Accordingly, the region divided substrate A21 becomes a state shown in FIG. 34C. The region divided substrate A21 is bonded with the base substrate B5a, and thereby the semiconductor device 109 in FIG. 33 is formed.

Eleventh Embodiment

Figure 35:
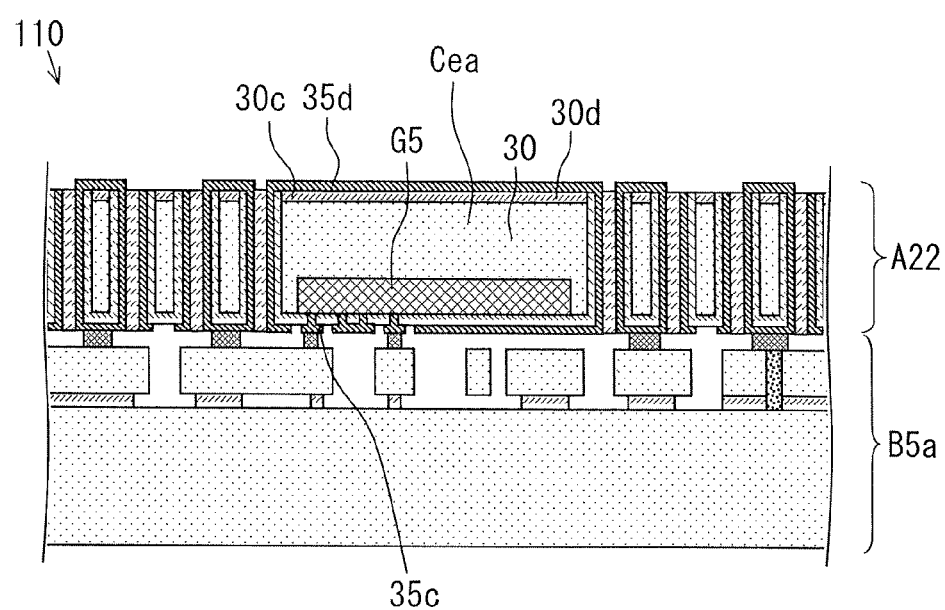
FIG. 35 is a cross-sectional view of a semiconductor device according to an eleventh embodiment of the present invention.

A semiconductor device 110 according to an eleventh embodiment of the present invention will be described with reference to FIG. 35. The semiconductor device 110 includes the base substrate B5a and a cap substrate including a region divided substrate A22.

In the region divided substrate A22, the IC circuit G5 is formed in the partial region Cea, and the partial region Cea is enclosed by a conductive layer 35d. The other parts of the region divided substrate A22 are similar to those of the region divided substrate A21. The conductive layer 35 enclosing the partial region Cea can function as an electric shield for noise signals from an outside of the semiconductor device 100 and the IC circuit 5.

The conductive layer 35d can be formed by remaining the primary conductive layer 35a around the partial region Cea during the processes shown in FIG. 31C and FIG. 32E.

Figure 36A:
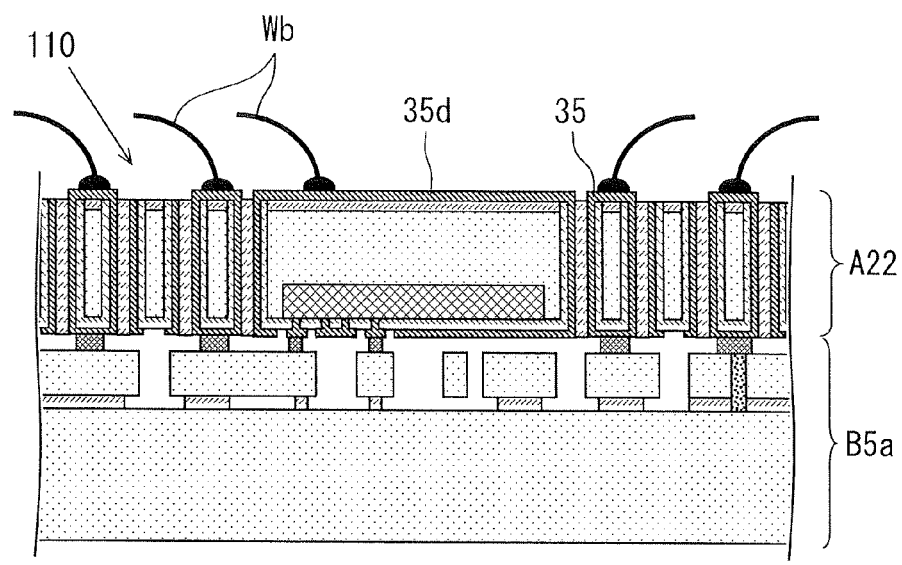
FIG. 36A is a cross-sectional view showing the semiconductor device according to the eleventh embodiment in a case where a cap substrate is electrically coupled with an external device by wire bonding.

The region divided substrate A22 in the semiconductor device 110 may be electrically coupled with an external device, for example, by wire bonding using bonding wires Wb as shown in FIG. 36A. The region divided substrate A22 may also be electrically coupled with an external device by ball bonding using solder balls Sb as shown in FIG. 36B.

Figure 36B:
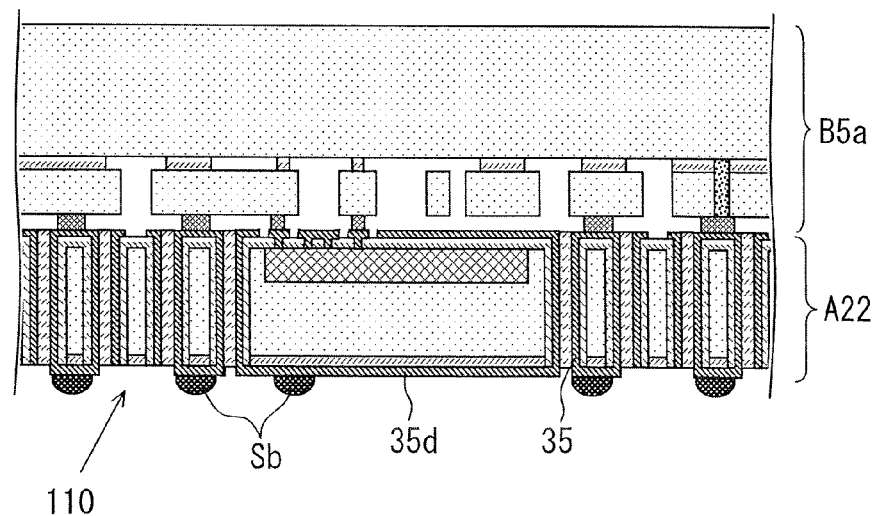
FIG. 36B is a cross-sectional view showing the semiconductor device according to the eleventh embodiment in a case where the cap substrate is electrically coupled with an external device by ball bonding.

As shown in FIG. 36A and FIG. 36B, connections of the conductive layers 35 and 35d with an external device may be either a wire bonding or a ball bonding (flip chip mounting).

Twelfth Embodiment

A semiconductor device 106 according to a twelfth embodiment of the present invention will be described with reference to FIG. 37 and FIG. 38. The semiconductor device 106 includes a first base substrate B8, a region divided substrate A18, and a second substrate B9. In the first base substrate B8, angular velocity sensor element (gyro sensor element) is formed. In the second base substrate B9, an acceleration sensor is formed. The first base substrate B8, the region divided substrate A18, and the base substrate B9 are positioned with respect to each other as shown in FIG. 38.

An exemplary method of manufacturing the first base substrate B8 will be described with reference to FIG. 39A to FIG. 40B.

Figure 39A:
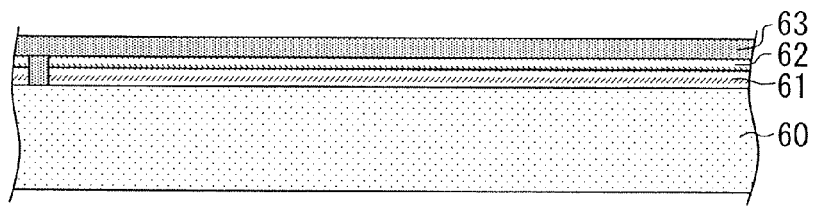
FIG. 39A to FIG. 39D are cross-sectional views showing processes in a manufacturing method of the first base substrate in the semiconductor device according to the twelfth embodiment.

During a process shown in FIG. 39A, a substrate 60 made of single crystal silicon is prepared. On the substrate 60, a first silicon oxide ($SiO_2$) layer 61, and a silicon nitride ($Si_3N_4$) layer 62 are stacked. Next, a contact hole penetrating the $Si_3N_4$ layer 62 and the first $SiO_2$ layer 61 to the substrate 60 is provided. A first N+ polycrystalline silicon layer 63 is formed on the whole surface by CVD so as to fill the contact hole.

Figure 39B:
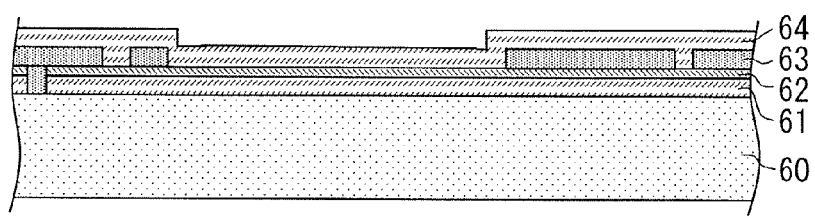

During a process shown in FIG. 39B, the first N+ polycrystalline silicon layer 63 is treated with patterning, and a second silicon oxide ($SiO_2$) layer 64 is stacked.

Figure 39C:
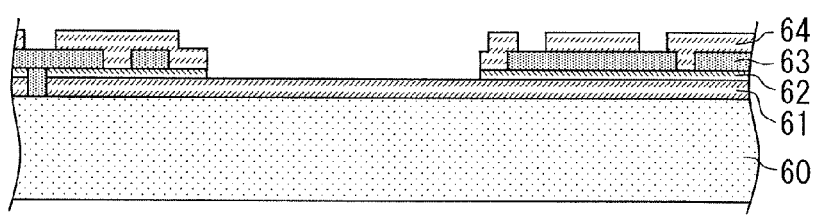

During a process shown in FIG. 39C, the second $SiO_2$ layer 64 and the $Si_3N_4$ layer 62 under the second $SiO_2$ layer 64 are treated with patterning. Accordingly, contact holes that reach the first N+ polycrystalline silicon layer 63 are provided.

Figure 39D:
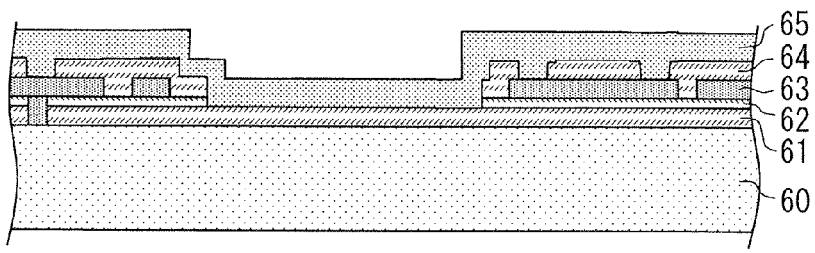

During a process shown in FIG. 39D, a second N+ polycrystalline silicon layer 65 is formed on the whole surface by CVD so as to fill the contact holes that reach the first N+ polycrystalline silicon layer 63.

Figure 40A:
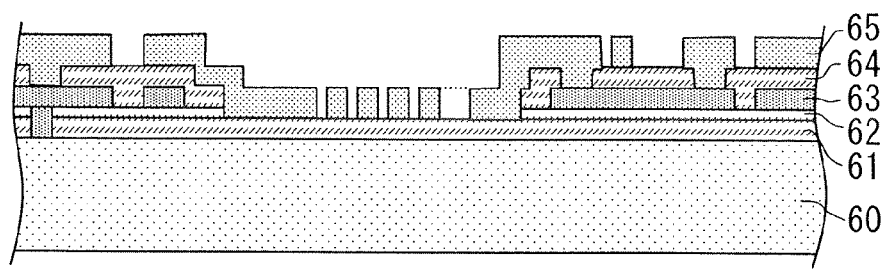
FIG. 40A and FIG. 40B are cross-sectional views showing other processes in the manufacturing method of the first base substrate in the semiconductor device according to the twelfth embodiment.

During a process shown in FIG. 40A, the second N+ polycrystalline silicon layer 65 is treated with patterning.

Figure 40B:
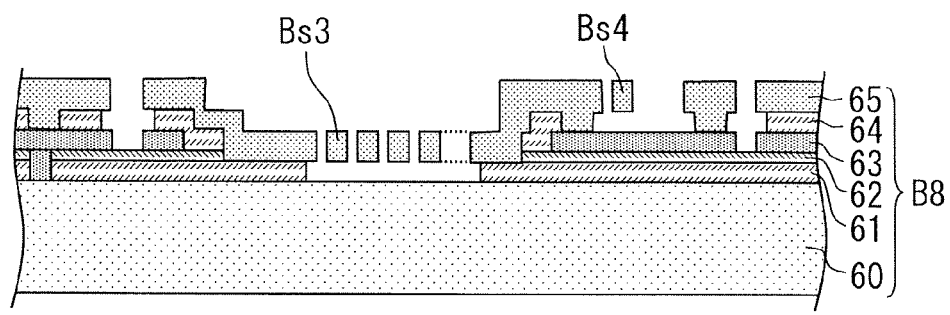

During a process shown in FIG. 40B, a part of the first $SiO_2$ layer 61 is removed by etching through opening portions of the second N+ polycrystalline silicon layer 65 provided by the patterning. Accordingly, a movable semiconductor region Bs3 and a cross wiring region Bs4 in the angular velocity sensor element in the first base substrate B8 are formed.

Through the above-described processes shown in FIG. 39A to FIG. 40B, the first base substrate B8 in the semiconductor device 106 can be formed.

The second base substrate B9 includes the acceleration sensor element. The acceleration sensor element includes a movable semiconductor region Bs1 and a fixed semiconductor region Bs2 in a manner similar to the acceleration sensor in the base substrate B3 shown in FIG. 6B. The movable semiconductor region Bs1 includes a movable electrode Em. The fixed semiconductor region Bs2 includes a fixed electrode Es opposed to the movable electrode Em. The acceleration sensor detects a change in capacitance due to a change in a distance between the movable electrode Em and the fixed electrode Es so as to detect an angular velocity. In the first base substrate B8, a movable semiconductor region and a fixed semiconductor region in the angular velocity sensor element are formed from the second N+ polycrystalline silicon layer 65.

An exemplary method of manufacturing the region divided substrate A18 in the semiconductor device 106 will be described with reference to FIG. 41A to FIG. 41D.

Figure 41A:
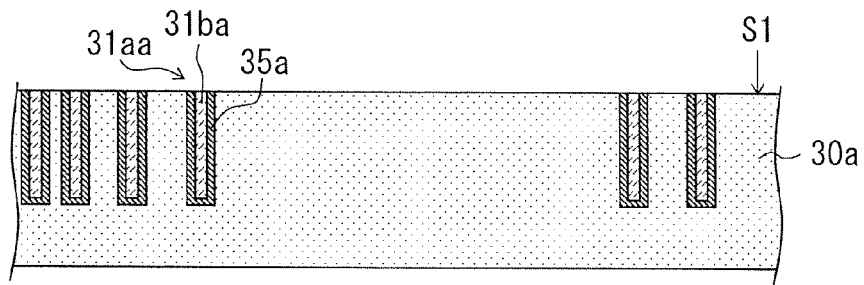
FIG. 41A to FIG. 41D are cross-sectional views showing processes in a manufacturing method of the cap substrate in the semiconductor device according to the twelfth embodiment.

During a process shown in FIG. 41A, the processes described with reference to FIG. 2A to FIG. 2C and FIG. 3A are performed. In a primary substrate 30a, a plurality of primary trenches 31aa is provided, and the primary trenches 31aa are filled with an insulating member 31ba through a primary conductive layer 35a.

Figure 41B:
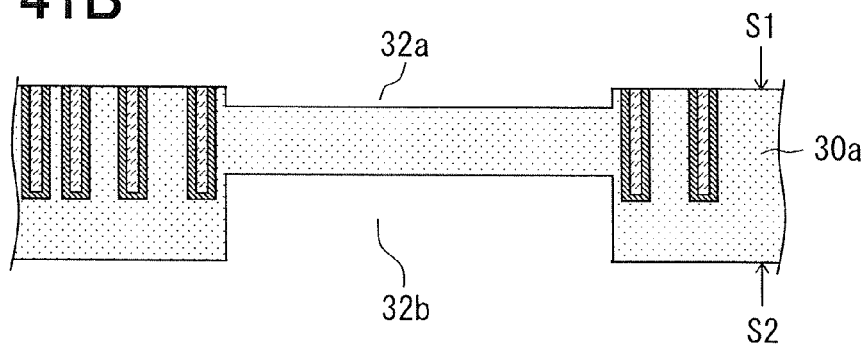

During a process shown in FIG. 41B, recess portions 32a and 32b are respectively formed on a first surface S1 and a second surface S2 of the primary substrate 30a.

Figure 41C:
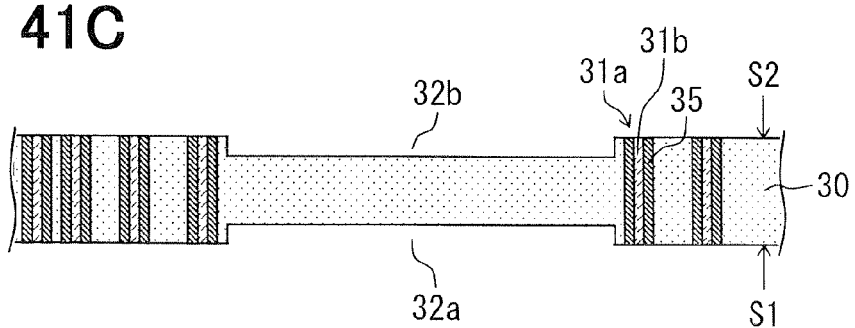

During a process shown in FIG. 41C, the primary substrate 30a is grinded from the second surface S2 until the primary insulating member 31ba is exposed. Accordingly, the trenches 31a, the conductive layer 35, and the insulating member 31b in the region divided substrate A18 are formed.

Figure 41D:
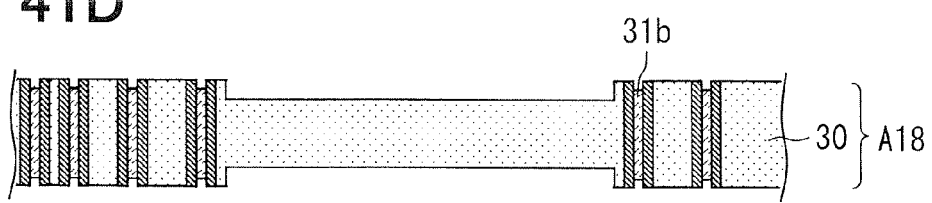

During a process shown in FIG. 41D, a part of the insulating member 31b is etched so that the region divided substrate A18 is easily bonded with the first base substrate B8 and the second base substrate B9. When the etched part of the insulating member 31b is large, a parasitic capacitance of a dielectric layer provided by the insulating member 31b can be reduced. The conductive layer 35 may also be partially etched at the same time with the insulating member 31b.

Through the above-described processes shown in FIG. 41A to FIG. 41D, the region divided substrate A18 in the semiconductor device 106 can be manufactured.

The second base substrate B9 in which the acceleration sensor element is formed can be manufactured through processes similar to the processes described with reference to FIG. 7A to FIG. 7C.

An exemplary method of manufacturing the semiconductor device 106 from the first base substrate B8, the region divided substrate A18, and the base substrate B9 that are preliminary prepared will be described with reference to FIG. 42A to FIG. 43.

Figure 42A:
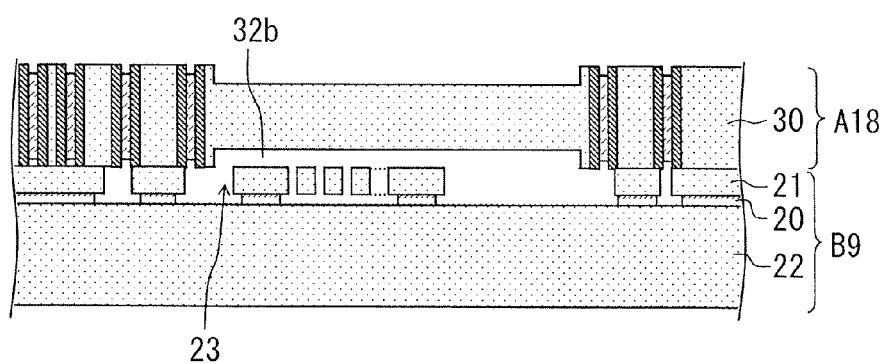
FIG. 42A and FIG. 42B are cross-sectional views showing processes in a manufacturing method of the semiconductor device according to the twelfth embodiment.

During a process shown in FIG. 42A, the second base substrate B9 and the region divided substrate A18 are bonded to each other, for example, by Si direct bonding at a lower temperature in nitrogen atmosphere at 1 atm. By bonding the second base substrate B9 and the region divided substrate A18, a space including the trenches 23 and the recess portion 32b becomes an airtight space at 1 atm.

Figure 42B:
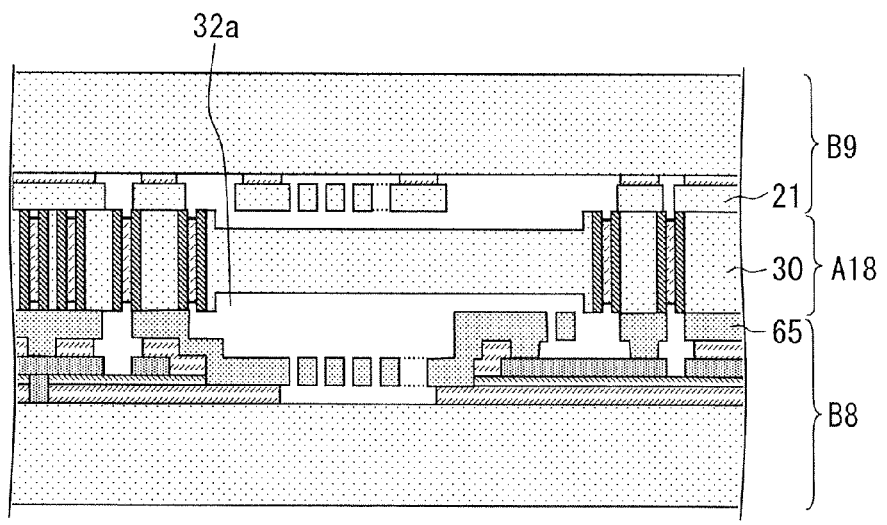

During a process shown in FIG. 42B, a joint body of the second base substrate B9 and the divided substrate A18 shown in FIG. 42A is reversed, and the joint body is bonded with the first base substrate B8, for example, by Si direct bonding at a lower temperature in vacuum. By bonding the joint body and the first base substrate B8, a space including the recess portion 32a becomes a vacuum state.

Figure 43:
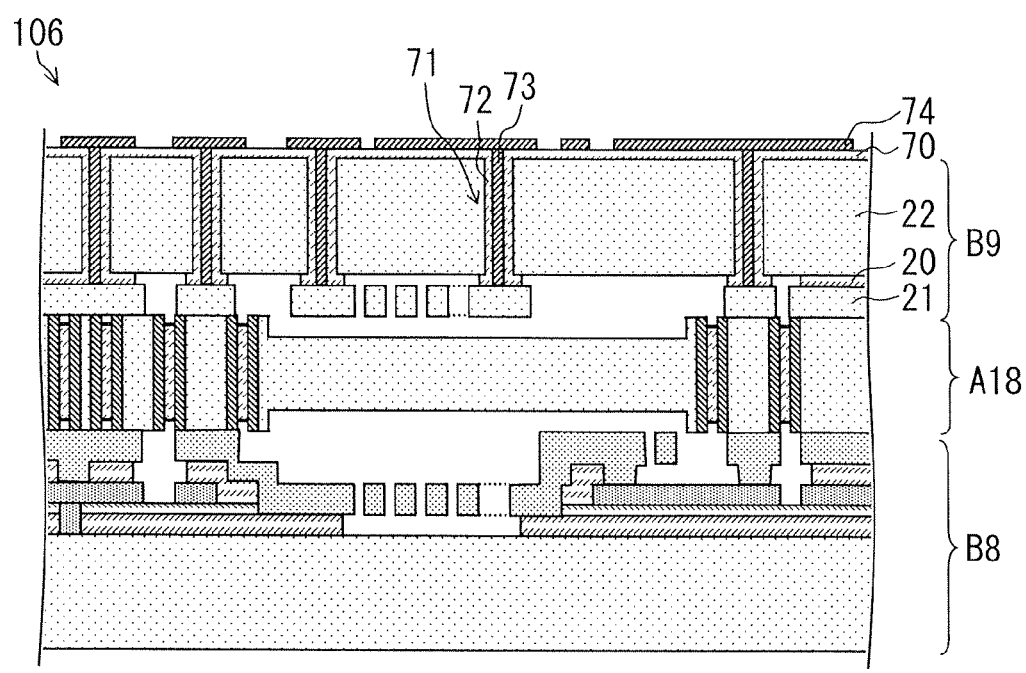
FIG. 43 is a cross-sectional view showing other process in the manufacturing method of the semiconductor device according to the twelfth embodiment.

During a process shown in FIG. 43, an insulating layer 70 is formed on a rear surface of the second base substrate B9 in which the acceleration sensor element is formed. A plurality of trenches 71 penetrating the insulating layer 70, the support substrate 22, and the buried oxide layer 20 is provided. On sidewall of each of the plurality of trenches 71, an oxide layer 72 is formed, and each of the plurality of trenches 71 is filled with a conductive member 73 through the oxide layer 72. Then, a layer made of aluminum (Al) is formed on the whole area and is treated with photolithography and etching so as to form wires and electrode parts 74.

Figure 37:
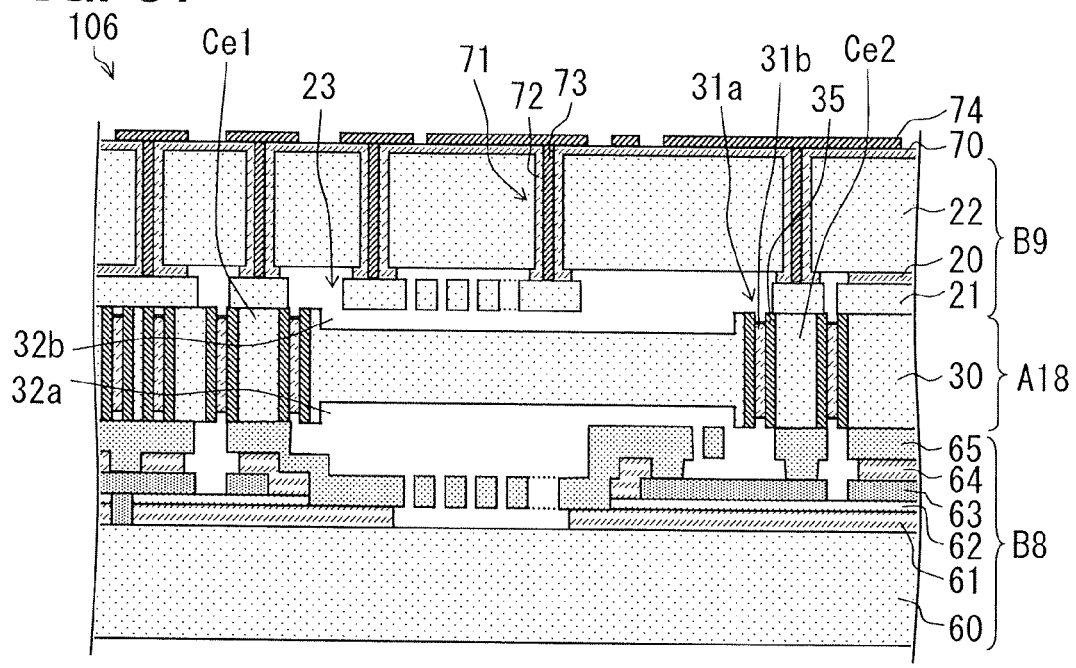
FIG. 37 is a cross-sectional view of a semiconductor device according to a twelfth embodiment of the present invention.
Figure 38:
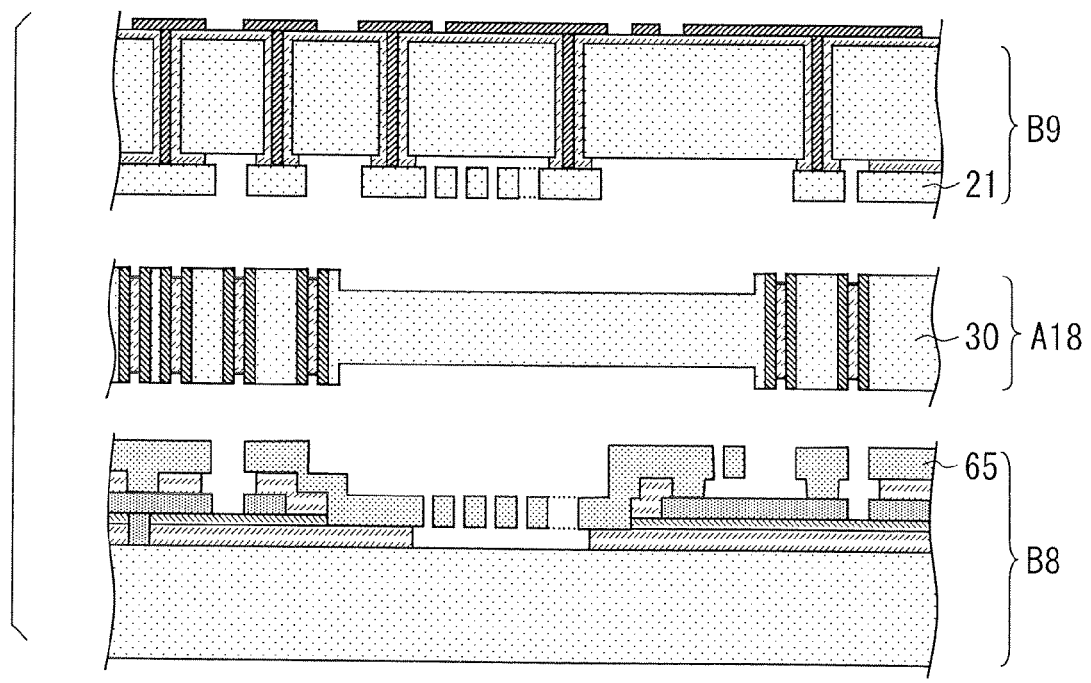
FIG. 38 is an exploded view of a cap substrate and a first base substrate, and a second base substrate in the semiconductor device according to the twelfth embodiment.

Through the above-described processes shown in FIG. 42A to FIG. 43, the semiconductor device 106 shown in FIG. 37 can be formed.

In the semiconductor device 106 shown in FIG. 37, the first base substrate B8 in which the angular velocity sensor element is formed and the second base substrate B9 in which the acceleration sensor element is formed are electrically coupled with each other through the region divided substrate A18. Thus, the semiconductor device 106 can be a semiconductor device including the angular velocity sensor element and the acceleration sensor element and having a small size and a low wiring resistance.

Thirteenth Embodiment

A semiconductor device 107 according to a thirteenth embodiment of the present invention will be described with reference to FIG. 44 and FIG. 45. The semiconductor device 107 includes a base substrate B10 and a region divided substrate A19. In the base substrate B10, an angular velocity sensor element (gyro sensor element) is formed. In the region divided substrate A19, an acceleration sensor element is formed. When the region divided substrate A19 is bonded to the base substrate B10, the region divided substrate A19 as a cap substrate is positioned with respect to the base substrate B10 as shown in FIG. 45.

An exemplary method of manufacturing the base substrate B10 in the semiconductor device 107 will be described with reference to FIG. 46A to FIG. 46D.

Figure 46A:
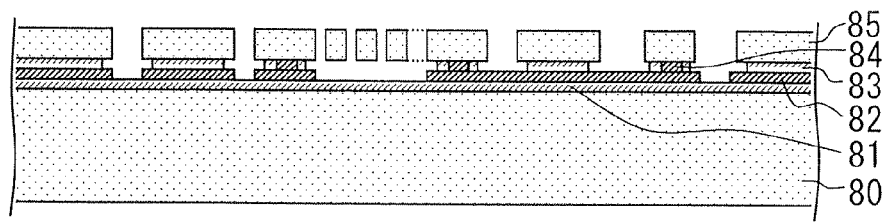
FIG. 46A to FIG. 46D are cross-sectional views showing processes in a manufacturing method of the base substrate in the semiconductor device according to the thirteenth embodiment.

During a process shown in FIG. 46A, a substrate 80 made of single crystal silicon is prepared. On the substrate 80, an insulating layer 81, a conductive layer 82, an insulating layer 83, a conductive layer 84, and a SOI layer 85 are stacked. The insulating layer 81 and the insulting layer 83 are made of, for example, silicon oxide ($SiO_2$). The conductive layer 82 and the conductive layer 84 are made of, for example, aluminum (Al). The SOI layer 85 is made of single crystal silicon or polycrystalline silicon. Then, a structure of the angular velocity sensor element is formed. In a case where the SOI layer 85 is made of polycrystalline silicon, the structure shown in FIG. 46A can be formed through processes similar to the processes described with reference to FIG. 39A to FIG. 40B. In a case where the SOI layer 85 is made of single crystal silicon, for example, a substrate bonding technique can be used.

Figure 46B:
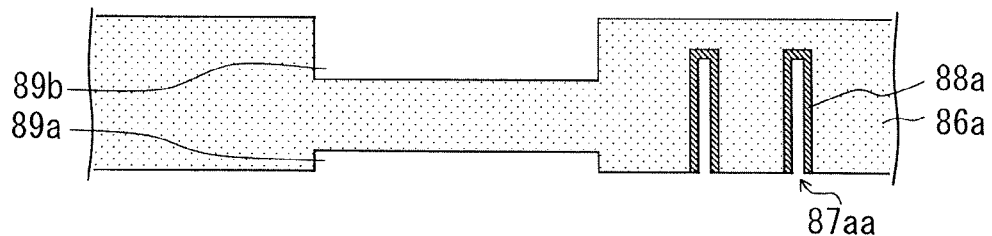

During a process shown in FIG. 46B, a primary substrate 86a made of single crystal silicon is prepared. A plurality of primary trenches 87aa is provided in the primary substrate 86, and a primary conductive layer 88a is formed on a sidewall of each of the primary trenches 87aa. In addition, recess portions 89a and 89b are respectively provided on an upper surface and a lower surface of the primary substrate 86a. The structure shown in FIG. 46B is similar to the structure shown in FIG. 41B except that the primary insulating member 31ba is not provided. Thus, the structure shown in FIG. 46B can be formed in a manner similar to the structure shown in FIG. 41B except for forming the insulating member 31ba.

Figure 46C:
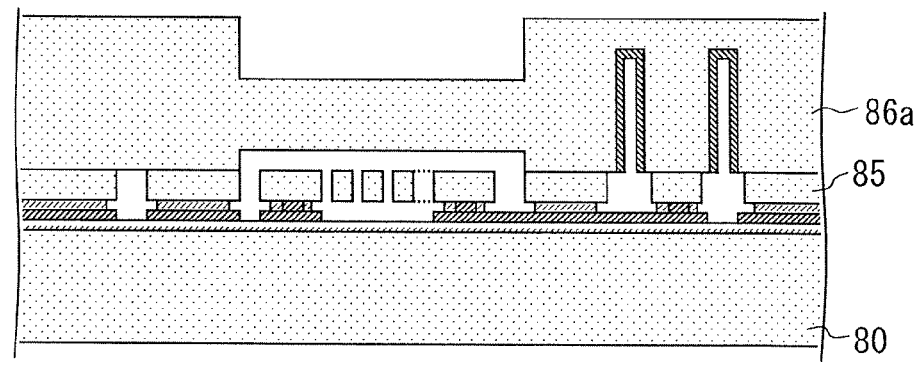

During a process shown in FIG. 46C, the primary substrate 86a is bonded to the SOI layer 85 above the substrate 80, for example, by Si direct bonding at a low temperature in vacuum.

Figure 46D:
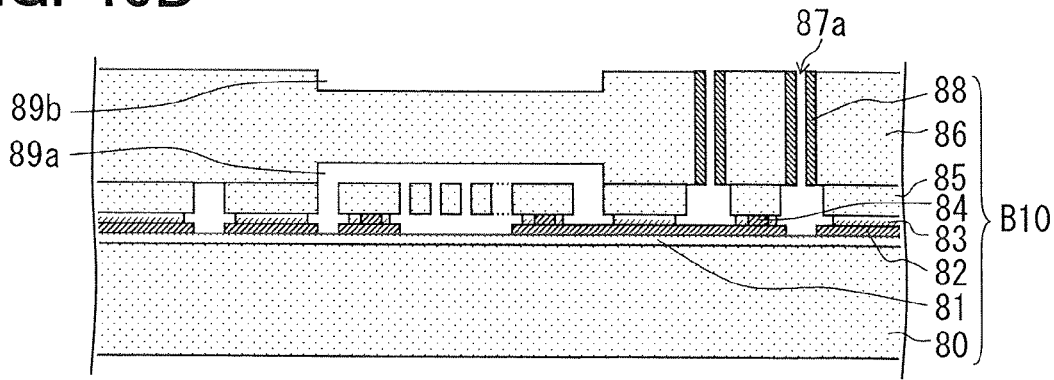

During a process shown in FIG. 46D, the upper surface of the primary substrate 86a is grinded until the primary trenches 87aa penetrates the primary substrate 86a. Accordingly, the substrate 86, the trenches 87a, and the conductive layer 88 in the base substrate B10 can be formed.

Figure 44:
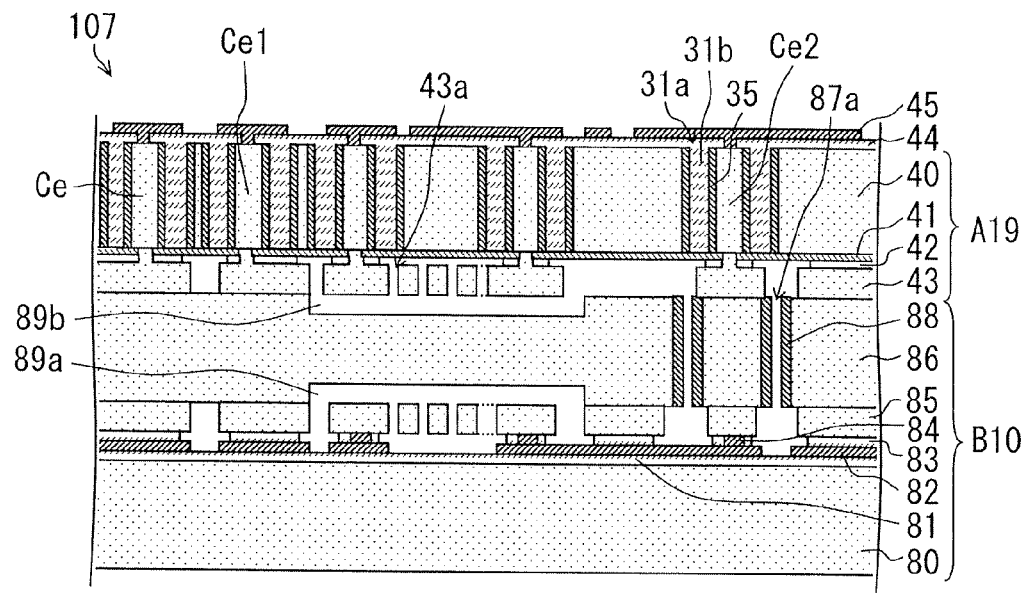
FIG. 44 is a cross-sectional view of a semiconductor device according to a thirteenth embodiment of the present invention.
Figure 45:
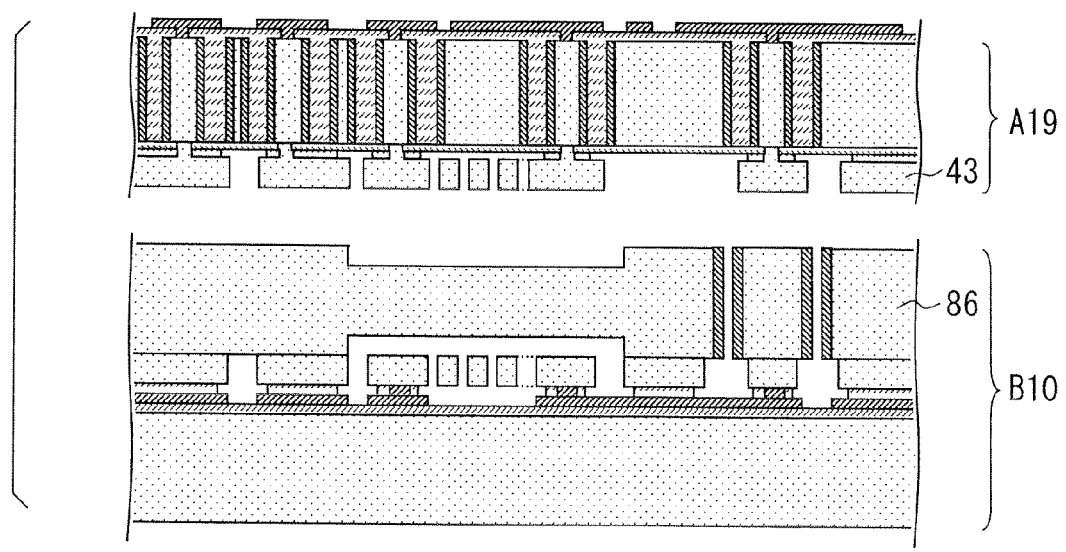
FIG. 45 is an exploded view of a cap substrate and a base substrate in the semiconductor device according to the thirteenth embodiment.

Through the above-described processes shown in FIG. 46A to FIG. 46D, the base substrate B10 in the semiconductor device 107 in FIG. 44 can be formed.

An exemplary method of manufacturing the region divided substrate A19 in the semiconductor device 107 will be described with reference to FIG. 47A to FIG. 47E.

Figure 47A:
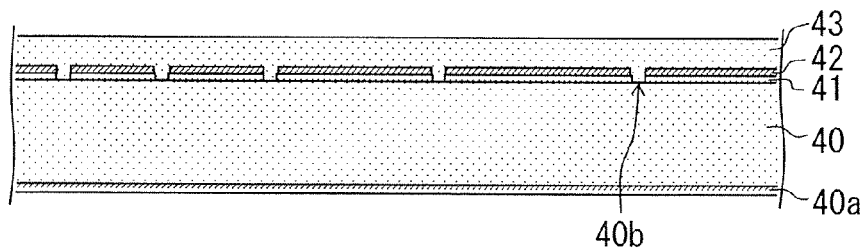
FIG. 47A to FIG. 47E are cross-sectional views showing processes in a manufacturing method of the cap substrate in the semiconductor device according to the thirteenth embodiment.

During a process shown in FIG. 47A, a substrate 40 made of high-concentration single crystal silicon is prepared. On a lower surface of the substrate 40, a protective layer 40a is formed. On an upper surface of the substrate 40, an insulating layer 41 made of silicon nitride ($Si_3N_4$) and an insulating layer 42 made of silicon oxide ($SiO_2$) are stacked. A plurality of contact holes 40b penetrating the insulating layer 42 and the insulating layer 41 to the substrate 40 is provided, and an SOI layer 43 made of high-concentration polycrystalline silicon is formed so as to fill the contact holes 40b. The SOI layer 43 has a thickness of from 5 μm to 100 μm.

Figure 47B:
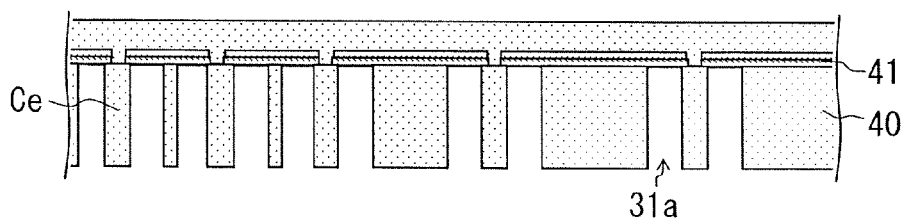
Figure 47C:
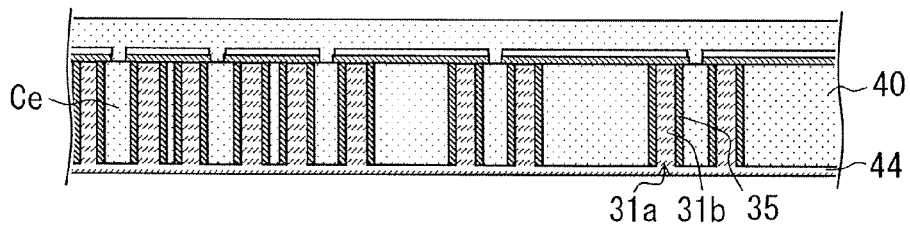

During a process shown in FIG. 47B, the protective layer 40a is removed, and a plurality of trenches 31a that reach the insulating layer 41 is provided in the substrate 40. Accordingly, the substrate 40 is divided into a plurality of partial regions Ce.

During a process shown in FIG. 47O, a conductive layer 35 is formed on a sidewall of each of trenches 31a. Then, the trenches 31a is filled with an insulating member 31b made of silicon oxide ($SiO_2$), and furthermore a silicon oxide ($SiO_2$) layer is formed on the substrate 40. The $SiO_2$ layer is planarized so as to form an insulating layer 44 made of silicon oxide ($SiO_2$).

Figure 47D:
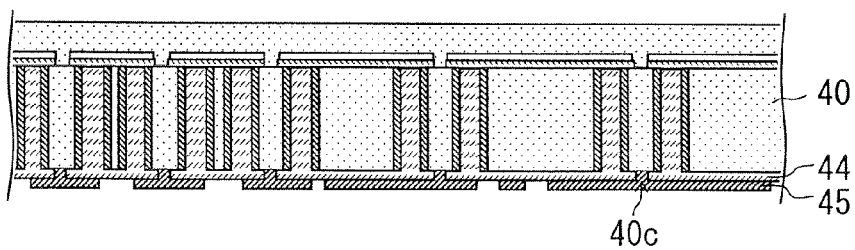
Figure 47E:
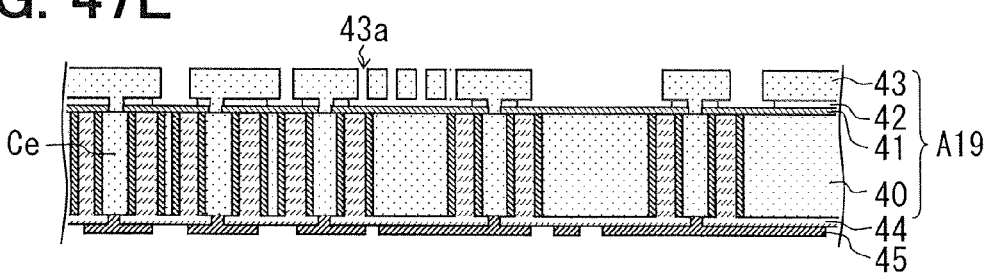

During a process shown in FIG. 47D, a plurality of contact holes 40c that reach the substrate 40 is provided in the insulating layer 44. Then, a conductive layer 45 is formed on the insulating layer 44 so as to fill the contact holes 40c. The conductive layer 45 is treated with patterning so as to form wires and electrode pads.

During a process shown in FIG. 47A, a plurality of trenches 43a penetrating the SOI layer 43 is provided. A part of the insulting layer 42 is removed by etching through the trenches 43a. Accordingly, a structure of the acceleration sensor element is formed in the SOI layer 43.

Through the above-described processes shown in FIG. 47A to FIG. 47E, the region divided substrate A19 in the semiconductor device 107 in FIG. 44 can be formed.

Next, an exemplary method of manufacturing the semiconductor device 107 using the base substrate 10 and the region divided substrate A19 that are preliminary prepared will be described.

As shown in FIG. 45, the region divided substrate A19 prepared through the processes shown in FIG. 47A to FIG. 47E is reversed and is stacked on the base substrate B10 prepared through the processes shown in FIG. 46A to FIG. 46D. The silicon substrate 86 in the base substrate B10 is bonded with the SOI layer 43 in the region divided substrate, for example, by Si direct bonding at a low temperature in vacuum. Accordingly, a space including the recess portions 89a, 89b, and trenches 87a and 43a becomes a vacuum state and the semiconductor device 107 shown in FIG. 44 can be formed.

In the semiconductor device 107 shown in FIG. 44, the region divided substrate A19 in which the acceleration sensor element is formed and the base substrate B10 in which the angular velocity sensor element is formed are electrically coupled with each other. Thus, the semiconductor device 107 can be a semiconductor device including the angular velocity sensor element and the acceleration sensor element and having a small size and a low wiring resistance. In addition, in the semiconductor device 107 shown in FIG. 44, the trenches 87 are not filled with an insulating member. Thus, a parasitic capacitance can be reduced compared with the semiconductor device 106 in FIG. 37.

In the region divided substrate A10 to A22, the semiconductor devices 100 to 110, and the manufacturing methods of the region divided substrate A10 to A22 and the semiconductor devices 100 to 110, the substrates 30, 39, and 40 are divided into the partial regions Ce by the trenches 31a penetrating the substrates 30, 39 and 40. The conductive layer 35 is formed on the sidewall of each of the trenches 31a, and a part of the partial regions Ce can be used as the extraction conductive regions Ce1 and Ce2. The resistances of the extraction conductive regions Ce1 and Ce2 having the conductive layer 35 on the sidewalls thereof can be reduced compared with a conventional region divided substrate without a conductive layer 35. Furthermore, as a material of the substrates 30, 39, 40, any substrate material selected from conductive material, semiconductor material, and an insulating material can be used.

The semiconductor devices 100 to 110 using the region divided substrate A11 to A22 according to the above-described embodiments include the dynamic quantity sensor elements for detecting acceleration or angular velocity. A semiconductor device using the region divided substrates according to the above-described embodiments may also be a semiconductor device including a micro electro mechanical system (MEMS) resonator or a semiconductor sensor element including an infrared sensor element.

What is claimed is:

1. A region divided substrate comprising:
   a substrate having a first surface and a second surface opposed to each other;
   a plurality of trenches penetrating the substrate from the first surface to the second surface and dividing the substrate into a plurality of partial regions;
   a conductive layer disposed on a sidewall of each of the plurality of trenches from a portion adjacent to the first surface to a portion adjacent to the second surface, the conductive layer having an electric conductivity higher than an electric conductivity of the substrate; and
   an insulating member filling each of the plurality of trenches through the conductive layer.

2. The region divided substrate according to claim 1, wherein
   the substrate is made of single crystal silicon.

3. The region divided substrate according to claim 2, further comprising
   an insulating layer disposed between the substrate and the conductive layer.

4. The region divided substrate according to claim 3, wherein
   the insulating layer is made of silicon oxide.

5. The region divided substrate according to claim 1, wherein
   the conductive layer includes at least one of a metal layer, a silicon layer having a high impurity concentration, and a metal silicide layer.

6. The region divided substrate according to claim 1, wherein
   the conductive layer covers at least one of the first surface and the second surface at a periphery of each of the plurality of trenches.

7. The region divided substrate according to claim 1, wherein
   the insulating member is made of silicon oxide.

8. The region divided substrate according to claim 1, wherein
   the insulating member fills each of the plurality of trenches from a portion adjacent to the first surface to a portion adjacent to the second surface.

9. A semiconductor device comprising
   a cap substrate including the region divided substrate according to claim 1, and a base substrate made of semiconductor and having a plurality of base semiconductor regions, the base semiconductor regions insulated from each other and disposed in a surface portion of the base substrate, wherein:

the cap substrate is bonded with the base substrate in a state where the cap substrate is opposed to a predetermined region of the surface portion of the base substrate;

the cap substrate and the predetermined region have a sealed space therebetween; and one of the plurality of partial regions provides an extraction conductive region electrically coupled with one of the plurality of base semiconductor regions.

10. The semiconductor device according to claim 9, wherein the cap substrate has a recess portion opposed to the predetermined region, and the cap substrate is bonded with the base substrate at a periphery of the recess portion.

11. The semiconductor device according to claim 9, wherein the base substrate has a protruding portion on one of the plurality of base semiconductor regions in the predetermined region, and the cap substrate and the base substrate is bonded to each other at the protruding portion.

12. The semiconductor device according to claim 11, wherein the protruding portion is made of one of single crystal silicon, polycrystalline silicon, and metal.

13. The semiconductor device according to claim 9, wherein:

the base substrate includes an SOI substrate;

the SOI substrate includes a support substrate, a buried oxide layer, and a SOI layer stacked in order;

the plurality of base semiconductor regions is disposed in the SOI layer; and the base semiconductor regions are insulated from each other with a separation trench that penetrates the SOI layer and reaches the buried oxide layer.

14. The semiconductor device according to claim 13, further comprising a dynamic quantity sensor element having a movable electrode and a fixed electrode for detecting a dynamic quantity applied to the dynamic quantity sensor, the movable electrode having an opposed surface that is opposed to the fixed electrode, wherein:

one of the plurality of base semiconductor regions provides a movable semiconductor region, and another one of the plurality of base semiconductor regions provides a fixed semiconductor region;

the movable semiconductor region has the movable electrode;

the buried oxide layer under the movable electrode is removed by sacrifice etching so that the movable electrode is displaceable;

the fixed semiconductor region has the fixed electrode;

the movable electrode and the fixed electrode provide a capacitance therebetween in such a manner that a space between the movable electrode and the fixed electrode provides an dielectric layer;

the plurality of partial regions includes a first extraction conductive region and a second extraction conductive region;

the first extraction conductive region is coupled with the movable semiconductor region, and the second extraction conductive region is coupled with the fixed semiconductor region;

the movable electrode is displaceable in accordance with the applied dynamic quantity in a direction perpendicular to the opposed surface; and the dynamic quantity sensor detects the dynamic quantity by detecting a change in the capacitance according to displacement of the movable electrode.

15. The semiconductor device according to claim 14, wherein the dynamic quantity is one of acceleration and angular velocity.

16. The semiconductor device according to claim 9, wherein the substrate in the cap substrate is made of single crystal silicon; and the cap substrate includes an IC circuit disposed in one of the plurality of partial regions.

17. The semiconductor device according to claim 16, wherein the region divided substrate further includes an insulating layer disposed between the substrate and the conductive layer.

18. The semiconductor device according to claim 17, wherein the insulating layer is made of silicon oxide.

19. The semiconductor device according to claim 17, wherein the IC circuit is disposed at a portion of the cap substrate opposed to the predetermined region of the base substrate, and the IC circuit is located in the sealed space.

20. The semiconductor device according to claim 17, wherein, the conductive layer encloses the one of the plurality of partial regions in which the IC circuit is disposed.

21. The semiconductor device according to claim 9, wherein the substrate in the cap substrate is made of silicon;

the base substrate is made of silicon; and the base substrate and the cap substrate are bonded to each other by silicon-to-silicon direct bonding.

22. The semiconductor device according to claim 9, wherein the substrate in the cap substrate is made of silicon;

the base substrate is made of silicon; and the base substrate and the cap substrate are bonded to each other by gold-to-silicon eutectic bonding.

23. The semiconductor device according to claim 9, further comprising a conductive adhesive, wherein the base substrate and the cap substrate are bonded to each other through the conductive adhesive.

24. A method of manufacturing the region divided substrate according to claim 1, comprising:

preparing a primary substrate that provides the substrate, the primary substrate having a first surface and a second surface opposed to each other;

providing a plurality of primary trenches that provides the plurality of trenches in the primary substrate from the first surface to a predetermined depth so that the plurality of primary trenches does not penetrate the primary substrate;

forming a primary conductive layer that provides the conductive layer on a sidewall of each of the plurality of primary trenches;

filling the plurality of primary trenches with a primary insulating member that provides the insulating member;

forming the first surface of the substrate by at least one of grinding, polishing, etching, and chemical mechanical polishing from a first-surface side and exposing the primary substrate; and forming the second surface of the substrate, the conductive layer, and the insulating member by at least one of grinding, polishing, etching, and chemical mechanical polishing from a second-surface side and exposing the primary insulating member.

25. The method according to claim 24, wherein
the filling the plurality of primary trenches with the primary insulating member is performed after the forming the primary conductive layer, and
the forming the first surface of the substrate is performed after the filling the plurality of primary trenches.

26. The method according to claim 25, wherein the forming the first surface of the substrate includes
exposing the primary conductive layer formed on the primary substrate by at least one of grinding, polishing, etching, and chemical mechanical polishing the primary insulating member from the first-surface side, and
patterning the primary conductive layer so that the primary substrate is exposed.

27. The method according to claim 25, wherein
the filling the plurality of primary trenches includes filling a second-surface side portion of each of the plurality of primary trenches with a sacrifice layer and filling a first-surface side portion of each of the plurality of primary trenches with the primary insulating layer, and
the forming the second surface of the substrate, the conductive layer, and the insulating member includes removing the sacrifice layer by etching from the second-surface side of the primary substrate.

28. The method according to claim 24, wherein
the forming the first surface of the substrate is performed after the forming the primary conductive layer, and
the filling the plurality of trenches is performed after the forming the first surface of the substrate.

29. A method of manufacturing the semiconductor device according to claim 9, comprising:
preparing the base substrate;
preparing the cap substrate including the region divided substrate; and
bonding the cap substrate to the base substrate so that the cap substrate is opposed to the predetermined region in the base substrate, the space between the cap substrate and the predetermined region is sealed, and the extraction conductive region is electrically coupled with the one of the plurality of base semiconductor regions.

* * * * *